(12) United States Patent
Hansen

(10) Patent No.: US 7,804,601 B2
(45) Date of Patent: *Sep. 28, 2010

(54) METHODS FOR MAKING HOLOGRAPHIC RETICLES FOR CHARACTERIZING OPTICAL SYSTEMS

(75) Inventor: Matthew E. Hansen, Milford, CT (US)

(73) Assignee: ASML Holding N.V., Veldhoven (NL)

( * ) Notice: Subject to any disclaimer, the term of this patent is extended or adjusted under 35 U.S.C. 154(b) by 331 days.

This patent is subject to a terminal disclaimer.

(21) Appl. No.: 10/972,170

(22) Filed: Oct. 25, 2004

(65) Prior Publication Data

US 2005/0083532 A1 Apr. 21, 2005

Related U.S. Application Data

(60) Division of application No. 09/907,902, filed on Jul. 19, 2001, now Pat. No. 7,242,464, and a continuation-in-part of application No. 09/339,506, filed on Jun. 24, 1999, now Pat. No. 7,016,025.

(60) Provisional application No. 60/219,187, filed on Jul. 19, 2000.

(51) Int. Cl.
*G01B 9/02* (2006.01)
(52) U.S. Cl. .................................. 356/521; 356/515
(58) Field of Classification Search ............... 359/9–11, 359/15, 12, 16; 356/457–458, 515, 521
See application file for complete search history.

(56) References Cited

U.S. PATENT DOCUMENTS 3,427,629 A * 2/1969 Jacobs et al. .................. 369/97

(Continued)

FOREIGN PATENT DOCUMENTS

EP 0243520 B1 11/1991

(Continued)

OTHER PUBLICATIONS

Communication from European Patent Application No. 01957171.0, dated Apr. 16, 2003, 4 pages.

(Continued)

*Primary Examiner*—Hwa S. A Lee
(74) *Attorney, Agent, or Firm*—Sterne, Kessler, Goldstein & Fox P.L.L.C

(57) ABSTRACT

Characterization of an optical system is quickly and easily obtained in a single acquisition step by obtaining image data within a volume of image space. A reticle and image plane are positioned obliquely with respect to each other such that a reticle having a plurality of feature sets thereon, including periodic patterns or gratings, is imaged in a volume of space, including the depth of focus. Metrology tools are used to analyze the detected or recorded image in the volume of space through the depth of focus in a single step or exposure to determine the imaging characteristics of an optical system. Focus, field curvature, astigmatism, spherical, coma, and/or focal plane deviations can be determined. The present invention is particularly applicable to semiconductor manufacturing and photolithographic techniques used therein, and is able to quickly characterize an optical system in a single exposure with dramatically increased data quality and continuous coverage of the full parameter space. In embodiments, the test reticle is holographically generated by interfering two or more beams of optical radiation. The resulting interference pattern is recorded on a reticle and used for testing the optical system. The geometry of the holographic interference pattern is tightly controlled by the properties of the interfering beams and is therefore more accurate than conventional reticle writing techniques.

29 Claims, 39 Drawing Sheets

U.S. PATENT DOCUMENTS

| | | | |
|---|---|---|---|
| 3,578,845 A * | 5/1971 | Brooks et al. | 359/15 |
| 3,674,332 A * | 7/1972 | Kogelnik | 359/3 |
| 3,829,219 A | 8/1974 | Wyant | 356/489 |
| 4,094,575 A * | 6/1978 | Kellie | 359/10 |
| 4,289,959 A | 9/1981 | Takayama et al. | 250/201.2 |
| 4,560,249 A | 12/1985 | Nishiwaki et al. | |
| 4,596,467 A | 6/1986 | Bartelt | |
| 4,732,483 A | 3/1988 | Biegen | 356/351 |
| 4,792,197 A | 12/1988 | Inoue et al. | |
| 4,806,454 A | 2/1989 | Yoshida et al. | |
| 5,128,530 A | 7/1992 | Ellerbroek et al. | 250/201.9 |
| 5,142,385 A | 8/1992 | Anderson et al. | |
| 5,182,455 A | 1/1993 | Muraki | 250/548 |
| 5,270,842 A * | 12/1993 | Clay et al. | 359/12 |
| 5,315,349 A | 5/1994 | Kamon | |
| 5,414,835 A | 5/1995 | Iijima | |
| 5,640,239 A | 6/1997 | Takamiya et al. | |
| 5,705,321 A | 1/1998 | Brueck et al. | |
| 5,718,738 A * | 2/1998 | Kohnke et al. | 65/31 |
| 5,759,744 A | 6/1998 | Brueck et al. | |
| 5,771,098 A | 6/1998 | Ghosh et al. | |
| 5,814,425 A | 9/1998 | Kataoka et al. | 430/30 |
| 5,825,476 A | 10/1998 | Abitol et al. | 356/124 |
| RE36,113 E | 2/1999 | Brueck et al. | |
| 5,898,479 A | 4/1999 | Hubbard et al. | 355/61 |
| 5,923,423 A | 7/1999 | Sawatari et al. | 356/349 |
| 6,013,396 A | 1/2000 | Capodieci | |
| 6,087,655 A * | 7/2000 | Kobrin | 250/237 G |
| 6,178,000 B1 | 1/2001 | Hoffnagle | |
| 6,185,019 B1 | 2/2001 | Hobbs et al. | |
| 6,233,044 B1 | 5/2001 | Brueck et al. | |
| 6,304,318 B1 | 10/2001 | Matsumoto | |
| 6,360,012 B1 | 3/2002 | Kreuzer | 382/211 |
| 6,368,763 B2 | 4/2002 | Dirksen et al. | 430/30 |
| 6,379,868 B1 | 4/2002 | White | |
| 6,469,793 B1 * | 10/2002 | Stanton | 356/521 |
| 6,556,280 B1 | 4/2003 | Kelsey et al. | |
| 6,830,850 B1 | 12/2004 | Krivokapic et al. | |
| 6,882,477 B1 | 4/2005 | Schattenburg et al. | |
| 7,016,025 B1 * | 3/2006 | Hansen | 356/124 |
| 7,081,961 B2 * | 7/2006 | Hansen | 356/515 |
| 7,242,464 B2 * | 7/2007 | Hansen | 356/124 |
| 7,312,021 B2 * | 12/2007 | Chang et al. | 430/394 |
| 2001/0021487 A1 | 9/2001 | Williams et al. | |
| 2001/0035991 A1 | 11/2001 | Hobbs et al. | |
| 2002/0021460 A1 | 2/2002 | Hansen | |
| 2002/0030802 A1 | 3/2002 | Sugita et al. | |
| 2002/0031725 A1 | 3/2002 | Sugita et al. | |
| 2002/0134985 A1 | 9/2002 | Chen et al. | |
| 2002/0149751 A1 | 10/2002 | Bloomstein et al. | |
| 2002/0149757 A1 | 10/2002 | Kelsey et al. | |
| 2002/0149849 A1 | 10/2002 | Kelsey et al. | |
| 2003/0098979 A1 | 5/2003 | Dress et al. | |
| 2003/0147082 A1 | 8/2003 | Goldstein | |
| 2004/0001192 A1 | 1/2004 | Lyons et al. | |
| 2004/0042724 A1 | 3/2004 | Gombert et al. | |
| 2004/0110092 A1 | 6/2004 | Lin | |
| 2004/0165194 A1 | 8/2004 | Hansen | |
| 2005/0012933 A1 | 1/2005 | Matthews | |
| 2005/0057735 A1 | 3/2005 | Smith | |
| 2005/0064297 A1 | 3/2005 | Wago | |
| 2005/0073671 A1 | 4/2005 | Borodovsky | |
| 2005/0074698 A1 | 4/2005 | Borodovsky | |
| 2005/0088633 A1 | 4/2005 | Borodovsky | |
| 2005/0094152 A1 | 5/2005 | Allen | |
| 2005/0105100 A1 | 5/2005 | Swindal | |
| 2005/0168717 A1 | 8/2005 | Hinsberg, III et al. | |

FOREIGN PATENT DOCUMENTS

| | | |
|---|---|---|
| EP | 0 628 806 A2 | 4/1994 |
| JP | 55-97220 A | 7/1980 |
| JP | 61-190368 A | 8/1986 |
| JP | 3-155112 A | 7/1991 |
| JP | 3-235319 | 10/1991 |
| JP | 3-263313 A | 11/1991 |
| JP | 4-078126 A | 3/1992 |
| JP | 4-163461 A | 6/1992 |
| JP | 5-072408 A | 3/1993 |
| JP | 5-198475 A | 8/1993 |
| JP | 5-217856 A | 8/1993 |
| JP | 6-053122 A | 2/1994 |
| JP | 6-053122 U | 7/1994 |
| JP | 8-286009 A | 11/1996 |
| JP | 10-254123 A | 9/1998 |
| JP | 10-270330 A | 10/1998 |
| JP | 11-304653 A | 11/1999 |
| JP | 11-354014 A | 12/1999 |
| JP | 2000-021716 A | 1/2000 |
| JP | 2000-021720 A | 1/2000 |
| JP | 2000-150347 A | 5/2000 |
| JP | 2000-223400 A | 8/2000 |
| JP | 2000-299283 A | 10/2000 |
| JP | 2001-007020 A | 1/2001 |
| JP | 2001-223149 A | 8/2001 |
| JP | 2002-162750 A | 6/2002 |
| JP | 2004-014866 A | 1/2004 |
| JP | 2004-014867 A | 1/2004 |
| JP | 2004-317922 A | 11/2004 |
| JP | 2005-099537 A | 4/2005 |
| JP | 2005-134873 A | 5/2005 |
| KR | 9401227 B1 | 2/1994 |
| WO | WO 98/18049 A1 | 4/1998 |
| WO | WO 98/21629 A2 | 5/1998 |
| WO | WO 98/21629 A3 | 5/1998 |
| WO | WO 2004/003611 A1 | 1/2004 |
| WO | WO 2004/088363 A1 | 10/2004 |

OTHER PUBLICATIONS

International Search Report from PCT Appl. No. PCT/US01/22518, dated Jan. 11, 2002, 4 pages.

Communication from European Patent Application No. 00112970.9, dated Nov. 3, 2004, 5 pages.

English Abstract for Japanese Patent Publication No. JP 3235319, 1 page, data supplied from the esp@cenet database.

European Search Report for European Appln. 00112970.9 mailed Apr. 14, 2004.

Ross, I.N. et al., "High-resolution holographic image projection at visible and ultraviolet wavelengths," *Applied Optics*, vol. 27, No. 5, Mar. 1, 1988, pp. 967-972.

J.P. Kirk and C.J. Progler, "Application of Blazed Gratings for Determination of Equivalent Primary Azimuthal Aberrations", Mar. 1999, Optical Microlithography XII, vol. 3679, pp. 70-76.

U.S. Appl. No. 09/339,506, filed Jun. 1999, Hansen.

Notice of Reasons for Rejection for Japanese Patent Application No. 2002-512746 mailed Jul. 17, 2009, 4 pgs.

Translation of Office Action and Office Action for Japanese Patent Application No. 2000-191508 mailed Feb. 28, 2008, 6 pgs.

* cited by examiner

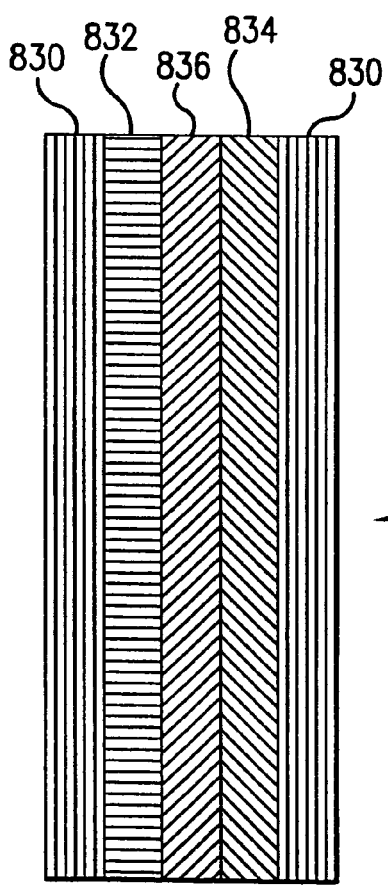
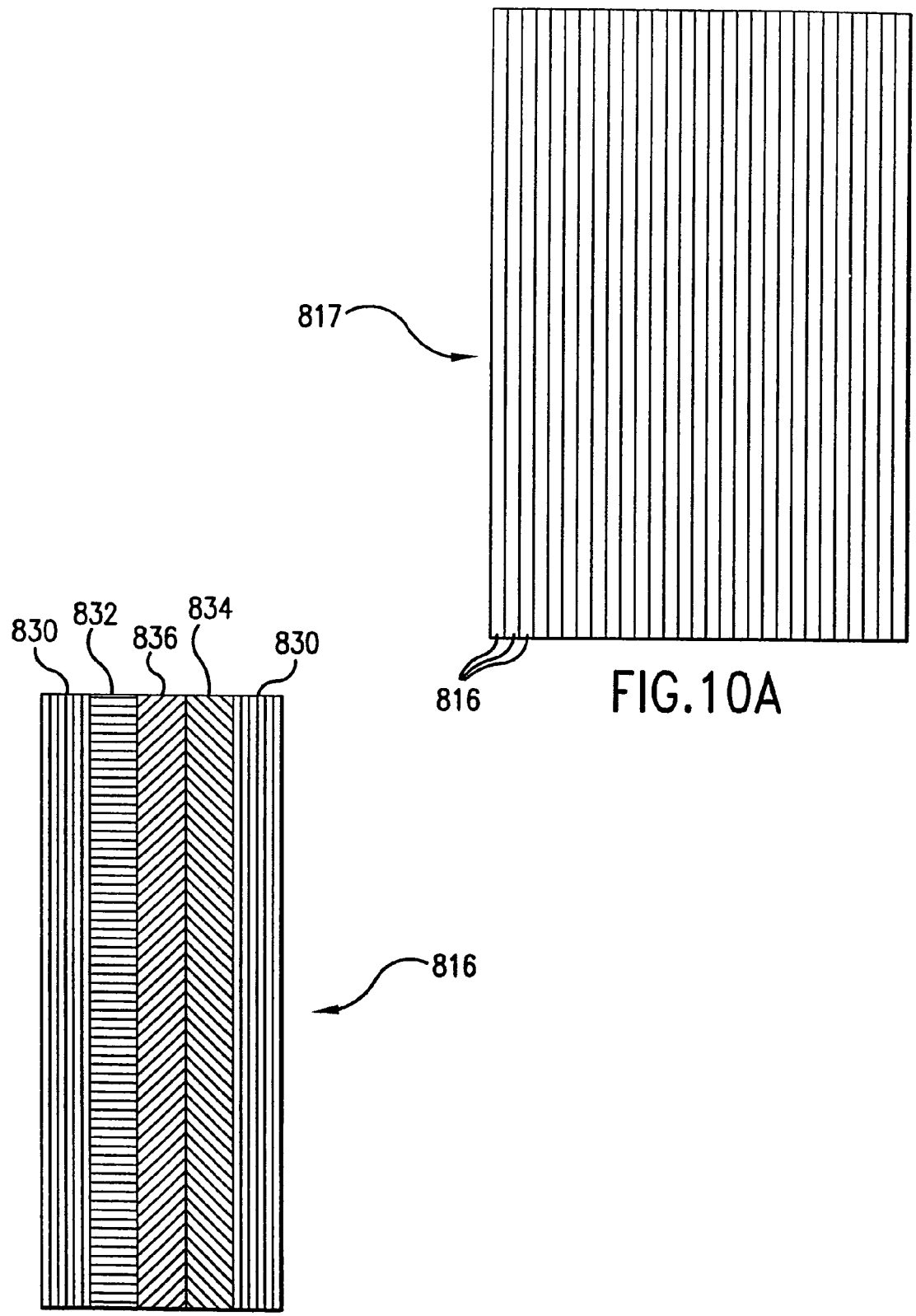
FIG.10A
FIG.10B

MAGNIFICATION

COMA

TELECENTRICITY

Y-DISTORTION SIGNATURE

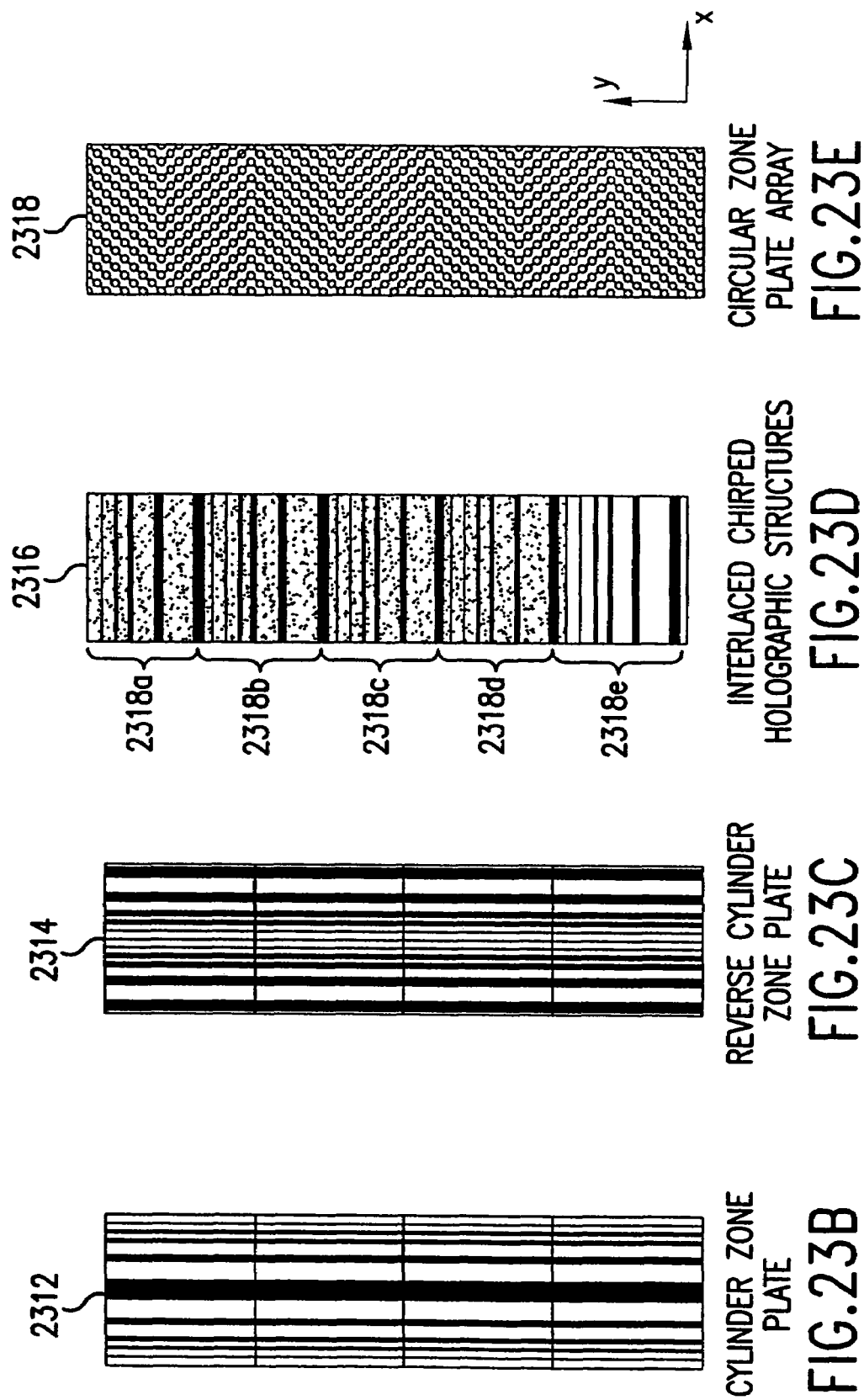

3600

| LINEWIDTH | DIFFRACTION ORDER | | | |
|---|---|---|---|---|
| | 1ST | 2ND | 3RD | 4TH |
| 100 nm | a | | | |
| 200 nm | b | a | | |
| 300 nm | c | | a | |
| 400 nm | d | b | | a |
| 600 nm | e | c | | |
| 800 nm | | d | b | |
| 900 nm | | | c | |
| 1000 nm | | | | b |
| 1200 nm | | e | d | c |

FIG.36

METHODS FOR MAKING HOLOGRAPHIC RETICLES FOR CHARACTERIZING OPTICAL SYSTEMS

CROSS-REFERENCE TO RELATED APPLICATIONS

This application is a division of U.S. patent application Ser. No. 09/907,902, filed Jul. 19, 2001, which is a continuation-in-part of U.S. application Ser. No. 09/339,506, filed Jun. 24, 1999, each of which is incorporated herein in its entirety by reference. This application also claims the benefit of U.S. Provisional Application No. 60/219,187, filed Jul. 19, 2000, which is also incorporated herein in its entirety by reference.

BACKGROUND OF THE INVENTION

1. Field of the Invention

The present invention relates to characterizing an optical system, and particularly to the rapid and precise characterization of an optical system including focus, field curvature, astigmatism, spherical, coma, and/or focal plane deviation using holographically produced reticles.

2. Background Art

Photolithography is often used in the manufacture of semiconductor devices and other electronic equipment. In photolithography, projection optics of high quality are often used to image features on a reticle onto a photosensitive substrate, such as a resist covered wafer. As the feature sizes desirable to be reproduced become ever smaller, the optical system or projection optics must be continually maintained and checked for image quality.

Often, the performance of an optical system or projection optics is difficult to obtain without time consuming techniques. Generally, multiple exposures are required of a photosensitive substrate at different locations in the image field and at different focus depths to characterize the optical system. The optical system is then characterized by compiling information obtained from examining the multiple processed images. Each of the many exposures and the corresponding processed images are acquired serially. Consequently, focus errors, scan errors and temporal variations to the optical system parameters during the measurement are compounded.

In the case of scan and focus errors, noise is introduced into the data. In the case of temporal variations, valid data are unrecoverable. Additionally, the data are discretely sampled rather than continuous across the parameter range. Consequently, quantization errors result from estimation of data values that lie between adjacent samples.

With demand for increasing production throughput and increasing performance requirements of the projection optics capable of imaging reduced feature size, there is a need for improving the apparatus and methods used to characterize an optical system. There is also a need to develop an apparatus and method that will quickly and easily provide high-precision data or information that can be used to characterize the performance of an optical system quickly and easily and with data obtained simultaneously and processed simultaneously without the need to perform multiple exposures and processing of multiple images.

BRIEF SUMMARY OF THE INVENTION

The present invention comprises a method and apparatus for obtaining optical system characterization information simultaneously by utilizing a volume of space during a relatively short time or in a single exposure. A test reticle having a plurality of features with different orientations, sizes, and line types is imaged with the optical system being characterized. Either the object plane in which the reticle is positioned or the image plane in which the characterization data is obtained is tilted or angled within the corresponding three-dimensional volume of space. The reticle, having a plurality of features, is imaged with the optical system being characterized. In a volume of space, through a depth of focus, an envelope of feature quality through focus is thereby obtained. This envelope of feature quality is simultaneously obtained by acquiring image data of the reticle in a plane that is oblique to the reticle plane. The resulting image of the reticle and corresponding features are analyzed with metrology techniques, which can include an interferometric tool thereby obtaining optical system characteristics. The optical system characteristics that can be obtained include focus, field curvature, astigmatism, coma, distortion, telecentricity and/or focal plane deviation, as well as information on spherical aberrations and variation of coherence.

In embodiments, the test reticle described above is produced holographically. More specifically, a holographic reticle is generated by interfering two or more beams of optical radiation to generate an interference volume having periodic interference pattern(s). The interference patterns are recorded on a reticle blank using any of the various recording techniques, such as photographic films, photo-resist, etc. The geometry of the periodic interference patterns is tightly controlled by the properties of the interfering optical beams. More specifically, the geometry is controlled by the wavelength of light, the wavefront variation, and the geometry of the exposure configuration (i.e., the relative beam angle of the optical radiation before and after interference). All of these factors can be controlled much more precisely than serially written e-beam or laser writing tools. Additionally, much larger reticle areas can be written in a single pass using holographic patterning. As such, writing errors that result from stitching together e-beam sub-fields are avoided entirely.

Accordingly, it is an advantage of the present invention that an optical system is characterized quickly and in a single exposure or imaging operation.

It is an advantage of the present invention that it results in a rapid acquisition of data required for characterization of an optical system.

It is another advantage of the present invention that it results in rapid acquisition of data desensitized to the focus, scan, and temporal errors associated with prior techniques.

It is an advantage of the present invention that reticle writing errors are reduced or eliminated by holographically patterning the test reticle, as compared to e-beam or laser reticle writing tools.

It is an advantage of the present invention that holographically patterned reticles can print linewidths that are much smaller than current reticle writing tools.

It is an advantage of the present invention that pitch uniformity for periodic gratings can be tightly controlled by holographically patterning test reticles. For example, chirped or continuously variable pitch patterns can be produced with great accuracy. This affords the probing of optical system performance over a precisely-controlled continuum of linesizes, line orientations, and pattern pitches.

It is an advantage of the invention that phase shifts in periodic structures can be precisely controlled. Phase shift structures are valuable in the characterization of odd optical aberrations that produce feature shifts in the image plane.

It is a feature of the present invention that information or data is obtained throughout a volume of image space.

It is another feature of the present invention that the reticle is in a different plane than the plane from which data is acquired in image space.

It is yet another feature of the present invention that the perpendicular from the reticle and/or image plane interceptor be non-collinear with the axis of the optical system.

These and other objects, advantages, and features will be readily apparent in view of the following detailed description.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

FIG. 10A is a schematic plane view illustrating a reticle.

FIG. 10B is a schematic plane view illustration a portion of a reticle pattern.

FIGS. 23B-D illustrate various chirped gratings produced by holographic patterning according to an embodiment of the present invention.

FIG. 23E illustrates a circular zone plate array.

FIG. 36 illustrates how the measurement of the relative image shifts as a function of linewidth can be simplified by using a reticle with various linewidths such that each linewidth is an integral multiple of a fundamental linewidth size.

The preferred embodiments of the invention are described with reference to the figures where like reference numbers indicate identical or functionally similar elements.

DETAILED DESCRIPTION OF THE INVENTION

1. Characterizing Optical Systems

Figure 1A:
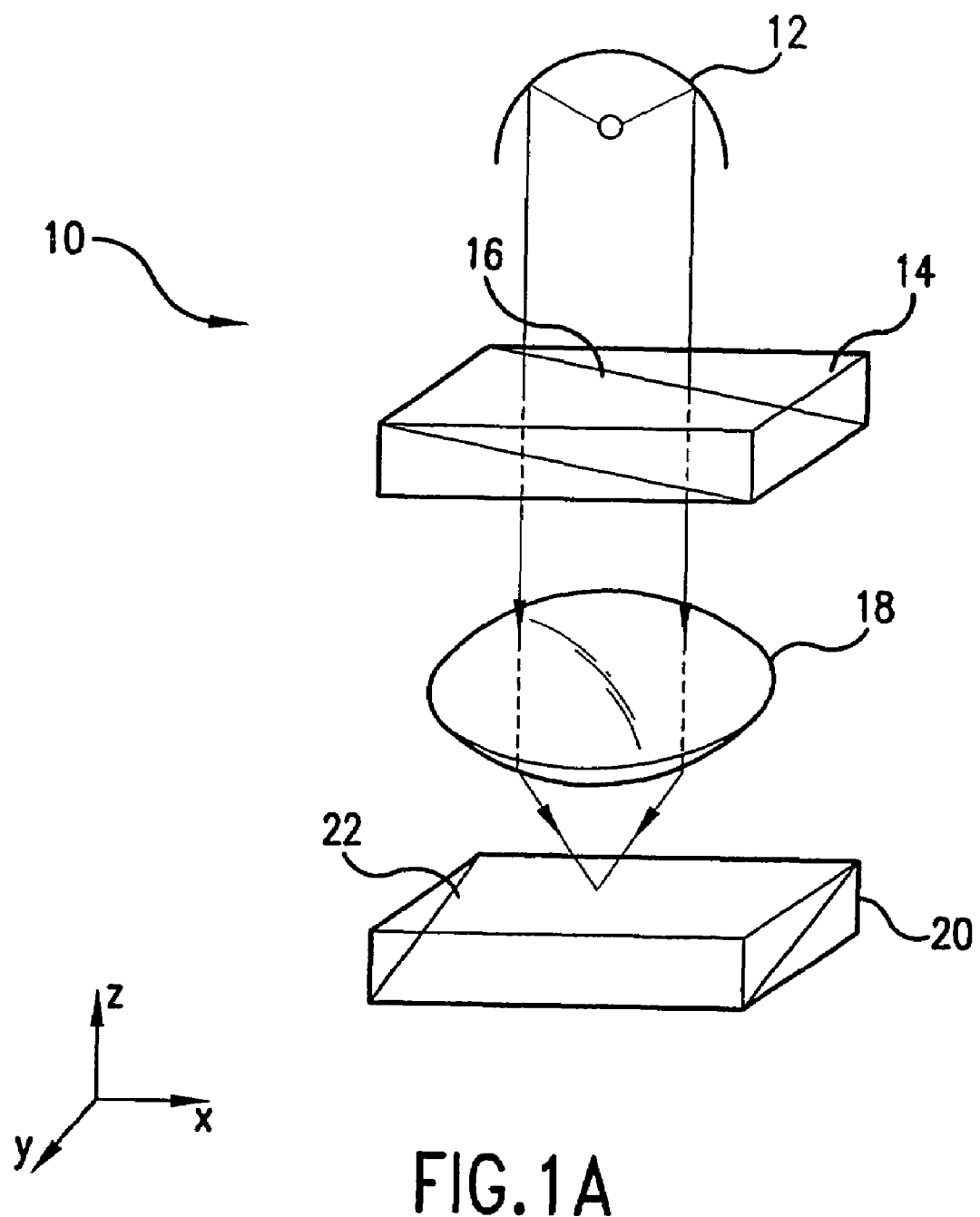
FIG. 1A is a schematic illustration of a photolithographic system.

FIG. 1A schematically illustrates the present invention. A photolithographic system 10 is generally illustrated. An illumination source 12 is used to project the image of a reticle 16 within a reticle or object space or volume 14 onto a photosensitive substrate 22 within a photosensitive substrate or image space 20 through optical system or projection optics 18. The reticle 16 is positioned within a plane that is oblique with respect to the photosensitive substrate 22. The reticle 16 and the photosensitive substrate 22 can be tilted in a variety of different ways. Preferably, the positioning of the reticle 16 or the wafer 22 is such that either the reticle 16 or wafer 22 extends through the object volume or depth of focus of the optical system or projection optics 18. The imaging data recorded by the photosensitive substrate 22 provides information permitting the characterization of the optical system or projection optics 18. Imaging characteristics such as focus, field curvature, astigmatism, coma, and/or focal plane deviation, as well as information for determining spherical aberration and variation of coherence can be obtained. The image quality of the entire image field through focus can be obtained in a single imaging or exposure operation in a relatively short time. The entire image of the reticle can be analyzed with metrology techniques for characterizing the optical system or projection optics 18. The optical system or projection optics 18 is thereby characterized in the x and y field direction as well as the depth of focus in the z direction. While a photosensitive substrate 22 has been indicated as a way to record the electromagnetic radiation passing through the reticle 16, any device for detecting electromagnetic radiation may be used, for example a photoreceptive sensor, such as a charge coupled device (CCD) array, position sensitive detector (PSD), or equivalent detector.

Alternatively, a demodulating device can be used to produce an interference pattern. FIG. 11B is a schematic illustration of a photolithographic system with a demodulating device 24. The demodulating device 24 could be a demodulating reticle, an electro-optic demodulating device, an acousto-optic demodulating device, or another demodulating device as would be known to one skilled in the art.

Advantageously, the interference pattern can be visually observed to detect optical aberrations and to support adjustments to the photolithographic system 10 in real time.

The interference pattern could include a Moire fringe pattern. The Moire pattern could represent a global magnification change and local distortion changes from a nominal pattern.

The demodulating device 24 could be followed by a photosensitive substrate 22, a CCD array, a PSD, or an equivalent detector as described above. Alternatively, the detector array could be patterned lithographically or holographically to generate an integrated detector module. The multiplexing of parameter space, as described below, can be used to detect focus, astigmatism, coma distortion, magnification, etc., without the need for expensive and time-consuming photographic recording systems.

Figure 2:
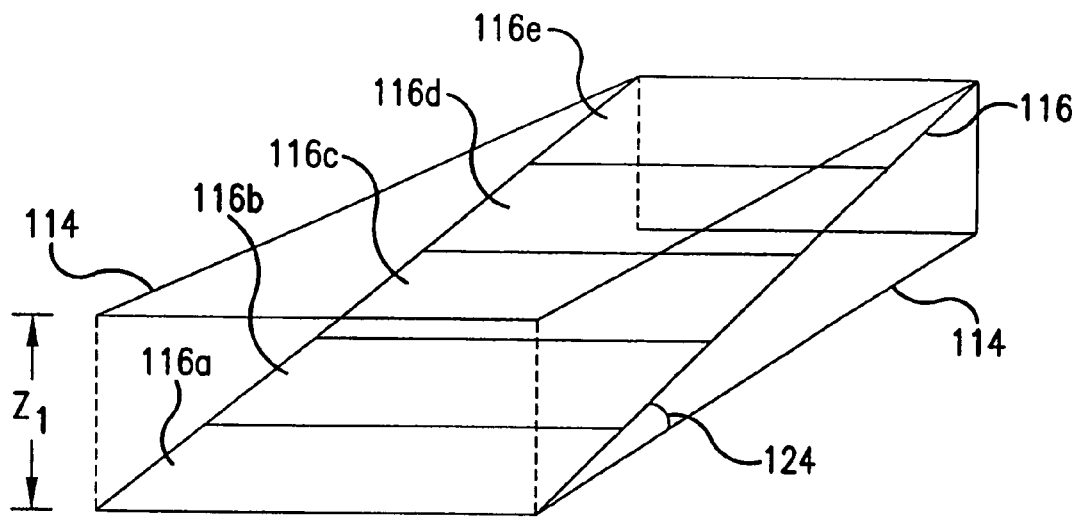
FIG. 2 is a perspective view of the reticle or object space.

FIG. 2 illustrates an object space or reticle space 114, which is an example of object 14 in FIG. 1A. Placed within the object or reticle space 114 is a reticle 116 comprised of a plurality of different periodic features 116a, 116b, 116c, 116d, and 116e. Each of the plurality of different periodic patterns or features 116a, 116b, 116c, 116d, or 116e can contain a grating pattern of varying line types, shapes, sizes, and orientations for obtaining different imaging information or data for characterizing the optical system. The periodic features or structures need only be periodic and need not be gratings. The reticle 116 can be tilted within the object or reticle space 114 by an angle 124. Accordingly, the reticle 116 is positioned within the reticle or object space 114 over a range of depth $z_1$.

Figure 3:
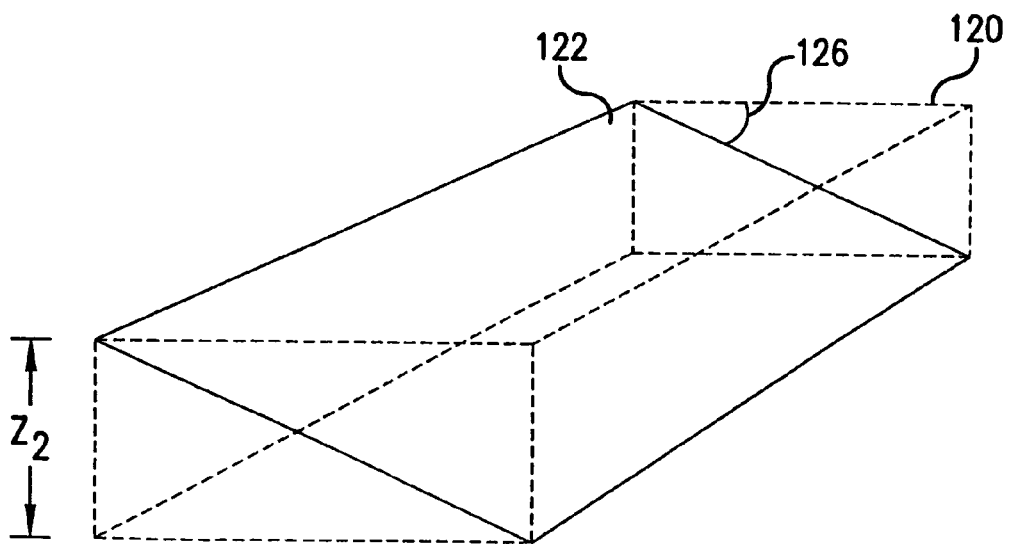
FIG. 3 is a perspective view of the photosensitive substrate or image space.

FIG. 3 is a perspective view illustrating a photosensitive substrate 122 angularly positioned in a data acquisition plane of the photosensitive substrate image or space 120. The photosensitive substrate 122 is positioned at an angle 126 within the photosensitive substrate or image space 120. The photosensitive substrate 122 extends through a range of depth $z_2$. This range of depth $z_2$ is within and beyond the depth of focus of the optical system or projection optics. The photosensitive substrate 122 is illustrated tilted at angle 126 that is compound to the angle of tilt 124 of the reticle 116, illustrated in FIG. 2. It should be appreciated that the reticle 116 and the photosensitive substrate 122 can be angled or tilted in different ways with respect to each other and the tilts illustrated in FIGS. 2 and 3 are only illustrative of the possible tilt or angle that can be utilized in the present invention. In obtaining useful characterization data for an optical system according to the teachings of the present invention, it may only be necessary to have one plane oblique with respect to the other plane, with the degree and nature of the oblique positioning of the two planes determined solely by the type and quantity of characterizing data desired. For example, the plane of the reticle need not be tilted, while the plane of the photosensitive substrate is tilted or made oblique to that of the plane of the reticle. Alternatively, one skilled in the art would recognize that the above description of the configuration relationship between the reticle and the photosensitive substrate could also apply to a similar configuration relationship between the reticle and the demodulating device 24 described above with the explanation of FIG. 11B.

Figure 4:
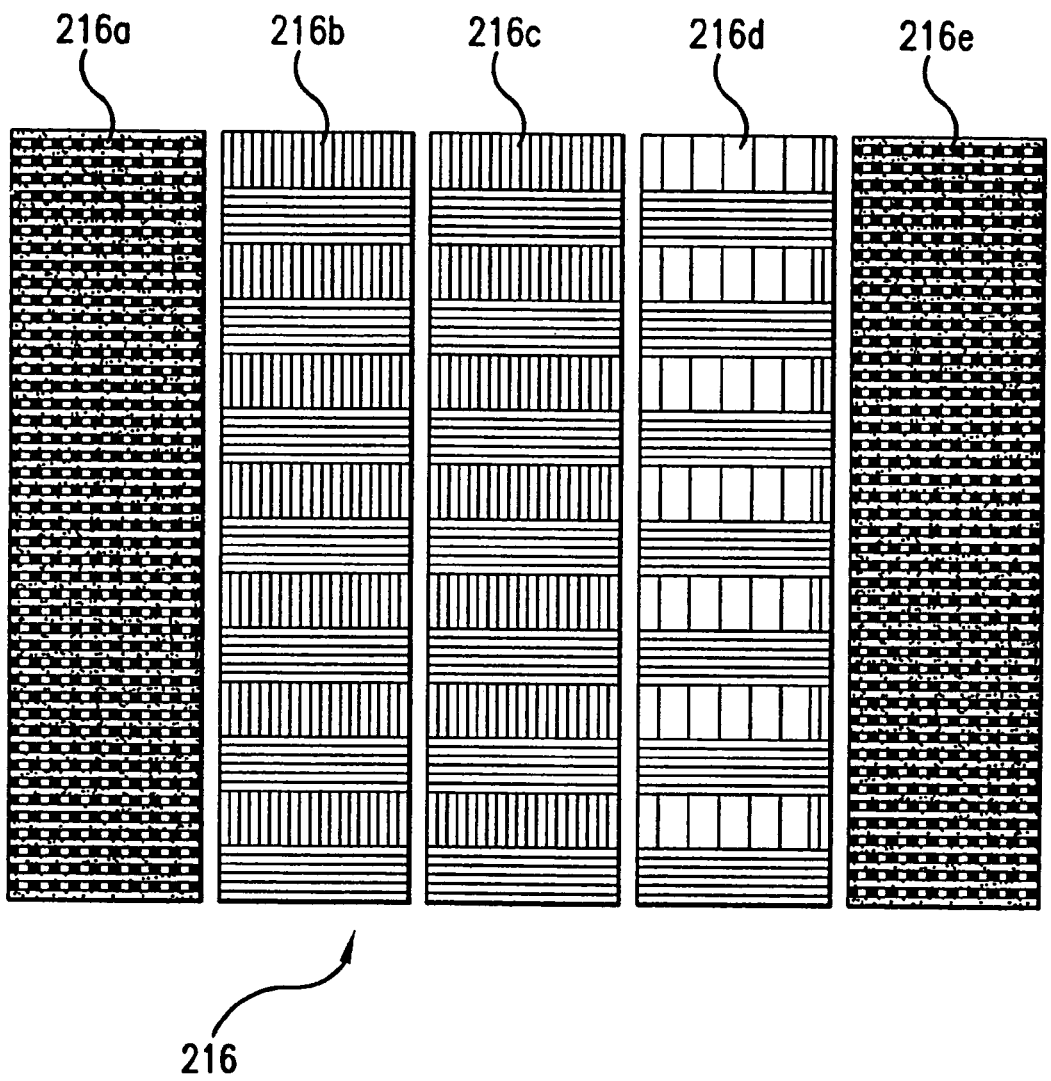
FIG. 4 is a plane view illustrating a test reticle having a plurality of periodic structures or patterns thereon.

FIG. 4 is a plane view illustrating a reticle 216 having a plurality of different periodic features, patterns, structures, or gratings thereon. Reticle 216 is an example of reticle 16 in FIG. 1A. The different periodic features can be grouped forming different feature sets, which can be used to obtain different imaging information for characterizing the optical system. For example, reticle 216 can be comprised of a plurality of different line types, shapes, sizes, and orientations that can make up the four feature sets. For example, a first feature set 216a comprising a basket weave, a second feature set 216b comprising a plurality of horizontal and vertical lines, a third feature set 216c comprising a plurality of horizontal and vertical lines having different spacing or sizing relative to the second feature set 216b, a fourth feature set 216d comprising a different set of horizontal and vertical lines, and a fifth feature set 216e comprising a basket weave, which can be the same or different than the first feature set 216a. The reticle 216 comprises a plurality of different feature sets, which can include different lines and spacing or gratings over the entire image field for imaging onto an oblique plane within the object space. The detection and analyzing of the image in a plane traversing the image space results in the acquisition of optical system characterization data, which can be utilized to determine the performance or imaging characterizations of the optical system.

Figures 5A, 5B:
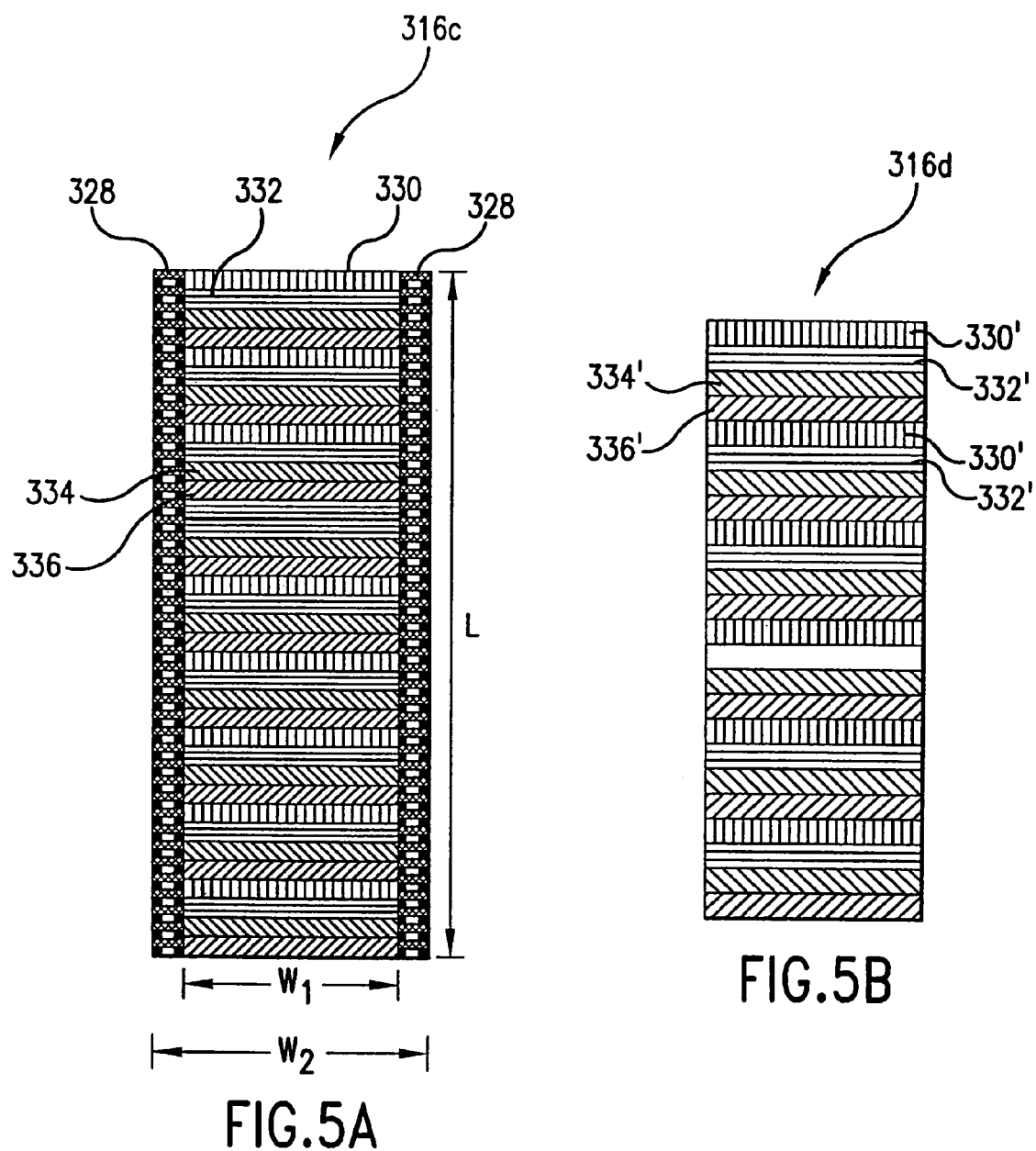
FIG. 5A is a plane view illustrating one type of grating or periodic pattern or structure.
FIG. 5B is a plane view illustrating another type of grating or periodic pattern or structure.

FIG. 5A is an example of another feature set 316c, which can be placed on a portion of a reticle and imaged onto a photosensitive substrate. The feature set 316c can be comprised of a central field having width $w_1$, that is comprised of multiplex or interlaced rows or stripes forming a pattern. For example, row 330 has spaced vertical lines thereon, row 332 has spaced horizontal lines thereon, row 334 has spaced negative 45 degrees tilted lines thereon, and row 336 has positive 45 degrees tilted lines thereon. The stripes or rows 330, 332, 334, and 336 can form a pattern extending along the length L of the feature set 316c formed on a portion of a reticle, as illustrated in FIG. 5A. The edges of the feature set 316c can be formed from a column or a vertical stripe 328. Formed within columns 328 is a basket weave pattern. The basket weave in columns 328 can be formed from partially transmissive sections or portions. The entire width of the feature set 316c is $w_2$. By way of example, the feature set 316c can have dimensions of approximately 27 mm in length L with the total width $w_2$ of approximately 5 mm and the center width $w_1$ being approximately 4.5 mm. Each row or stripe can be approximately 50 microns high or wide. Each linewidth within the row can be in the order of 200 nanometers. The feature set illustrated in 316c is given only by way of an example. Other feature sets can be utilized to determine the characteristics of an optical system, without departing from the spirit and scope of the present invention.

FIG. 5B illustrates another feature set 316d, which can be utilized on a portion of a reticle. Feature set 316d comprises a pattern of horizontal, vertical and angled lines. Stripe or row 330' has a vertical line pattern thereon. Row or stripe 332' has a plurality of horizontally spaced lines thereon. Row or stripe 334' has a plurality of lines tilted negative 45 degrees and row or stripe 336' has a plurality of lines tilted positive 45 degrees thereon. The plurality of rows or stripes are repeated in a horizontal, vertical, negative 45 degrees, positive 45 degrees pattern along the length of the feature set 316d. Other rows or patterns can be placed within a feature set depending upon the characteristic of the optical system desired to be detected or determined.

Figure 1B:
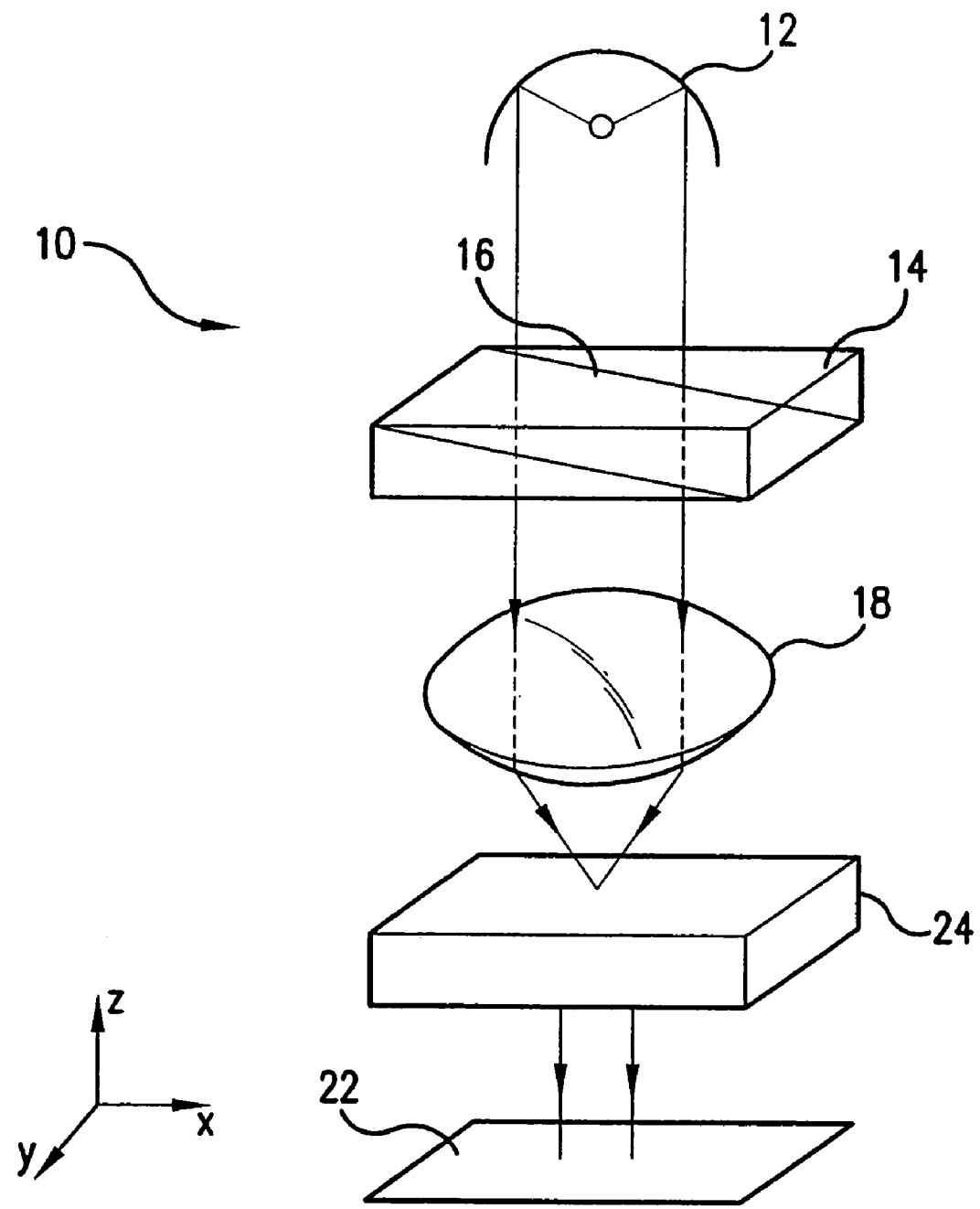
FIG. 1B is a schematic illustration of a photolithographic system with a demodulating device 24.
Figure 6:
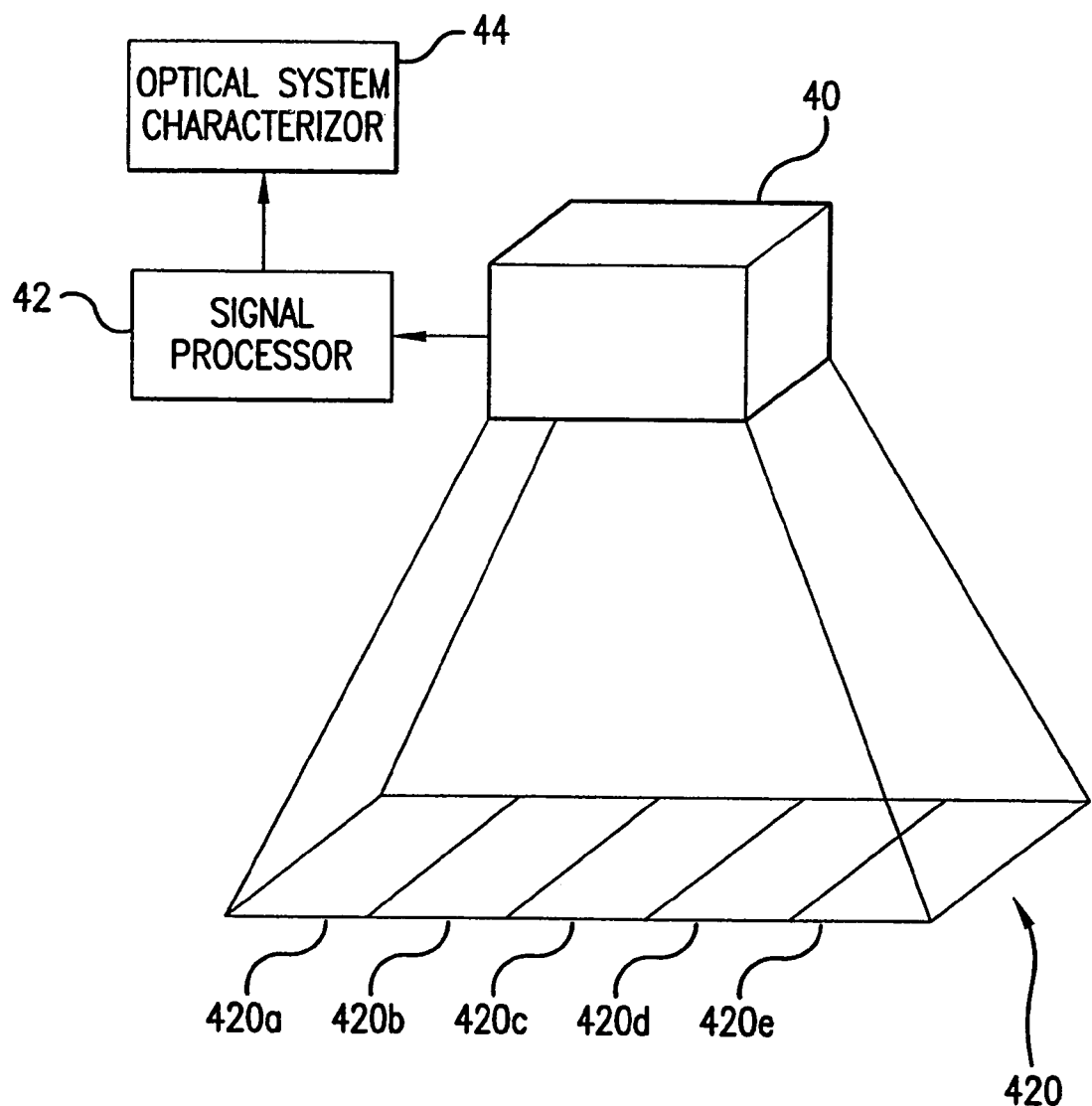
FIG. 6 schematically illustrates the acquisition of data used to characterize an optical system.

FIG. 6 illustrates the processing of information obtained from the imaging of the reticle with the optical system or projection optics to be characterized. An image plane 420 is detected or recorded onto a photosensitive substrate. The image plane has a plurality of images composed of the feature set images 420a, 420b, 420c, 420d, and 420e imaged by a reticle, such as that illustrated in FIG. 4. Data obtained from the image plane 420, which is positioned obliquely to the reticle plane, is extracted over the entire image field plane, which is preferably recorded onto a photosensitive substrate using a metrological tool 40, which is preferably an interferometer. The metrological tool 40 can detect or extract information, such as interference patterns, determined or detected from the image of the feature sets on the reticle. The images are formed on the image plane 420 and can be recorded on a photosensitive substrate. Alternatively, the images formed on the image plane 420 can be viewed in real time by using a demodulating device, such as demodulating device 24 as shown in FIG. 1B. Signal processor 42, coupled to the metrological tool 40, analyzes and processes the different images of the different feature sets 420a, 420b, 420c, 420d, and 420e. The processed signals from the signal processor 42 are provided to an optical system characterizor 44. Different aberrations of the optical system can therefore be determined. For example, astigmatism can be determined as a function of best focus difference of periodic pattern or grating orientation. Coma can be determined as a function of second order distortion signature versus focus. Spherical aberration can be determined as a function of best focus difference between line sizes versus field position. The recorded data can be analyzed by different metrology tools, such as white light, a dark field microscope, a large aperture interferometer, a laser microscope interferometer, or a interferometric microscope, for example.

Figure 7:
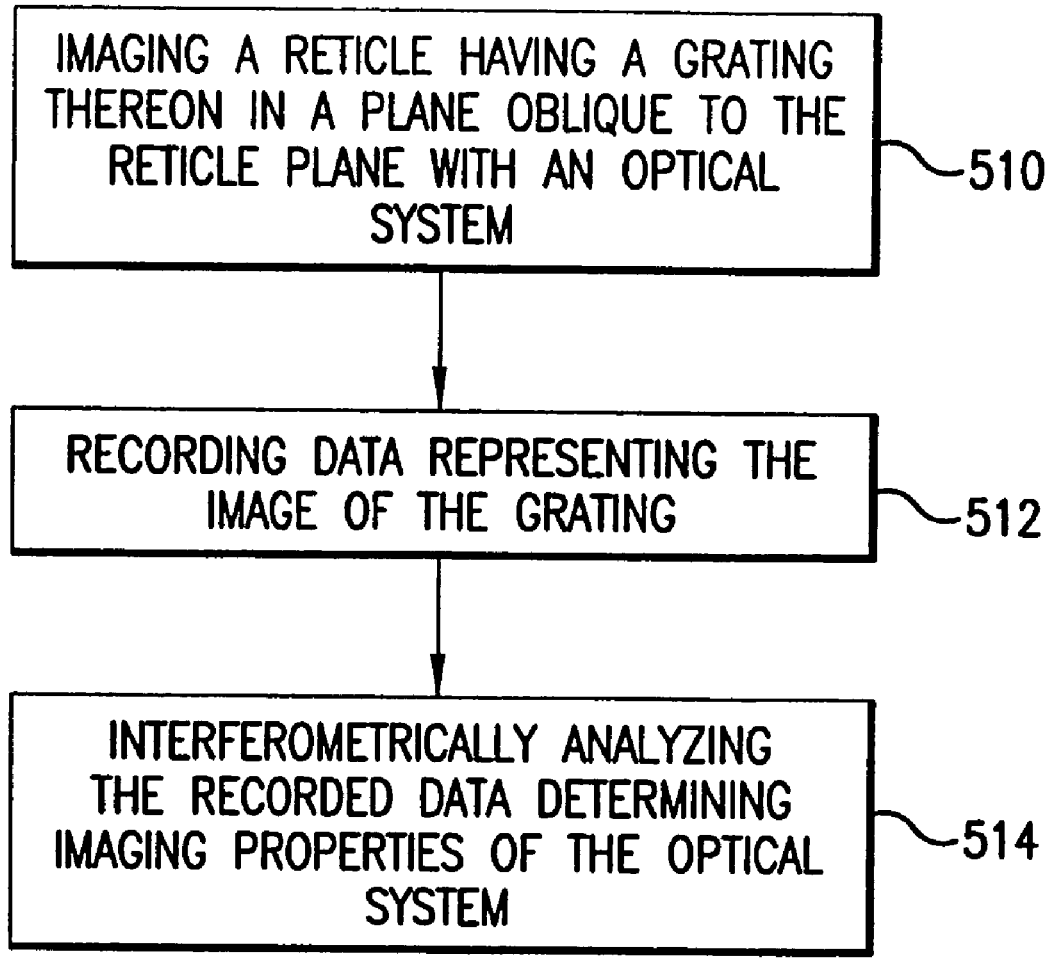
FIG. 7 is a block diagram illustrating high-level method steps of an embodiment of the present invention.

FIG. 7 is a block diagram illustrating high-level method steps of an embodiment of the present invention. A step 510 represents imaging a reticle having a periodic grating or pattern thereon in a plane oblique to the reticle plane with an optical system being characterized. The periodic pattern can be comprised of different grating patterns, with each different grating pattern designed to determine a predetermined characteristic or property of the of the optical system. A step 512 represents recording data representing the image of the periodic pattern or grating detected in the plane oblique to the reticle plane. The image of the periodic pattern or grating can be recorded with a photosensitive substrate or by electronic means, or presented for viewing in real time by using a demodulating device, as would be apparent to one skilled in the relevant art. A step 514 represents interferometrically analyzing the recorded data to determine the imaging properties of the optical system. The data representing the periodic pattern, grating or gratings is analyzed with interferometric techniques to obtain the properties of the optical system. The optical system can be characterized over the entire field and at different depths of focus in a single operation.

FIGS. 8-13 illustrate the application of the concepts of the present invention to different embodiments for characterizing an optical system by determining different optical properties, such as field curvature and different aberrations, including astigmatism and spherical aberrations.

Figure 8A:
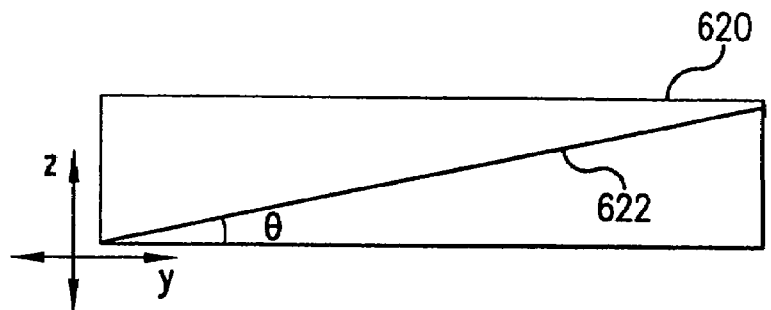
FIG. 8A schematically illustrates a volume of space.

FIG. 8A illustrates a volume of space 620, which is an example of volume of space 20 in FIG. 1A. Within the volume of space 620, electromagnetic radiation representing images can be detected. For example, generally a photosensitive substrate 622 or a demodulating device (such as demodulating device 24 as shown in FIG. 1B) is positioned within the volume of space 620 at an angle θ from the x-y plane. An image from an optical system (such as system 10 from FIG. 1A) is projected onto the photosensitive substrate 622. The image projected onto the photosensitive substrate 622 is that of a plurality of feature sets or spaced lines placed on a reticle, as illustrated in the prior figures. The use of a photosensitive substrate 622 is illustrative of the preferred embodiment; however, it should be appreciated that any photo receptor or demodulating device can be placed in the volume of space 620 to receive and detect the electromagnetic radiation representing an image of the reticle.

Figure 8B:
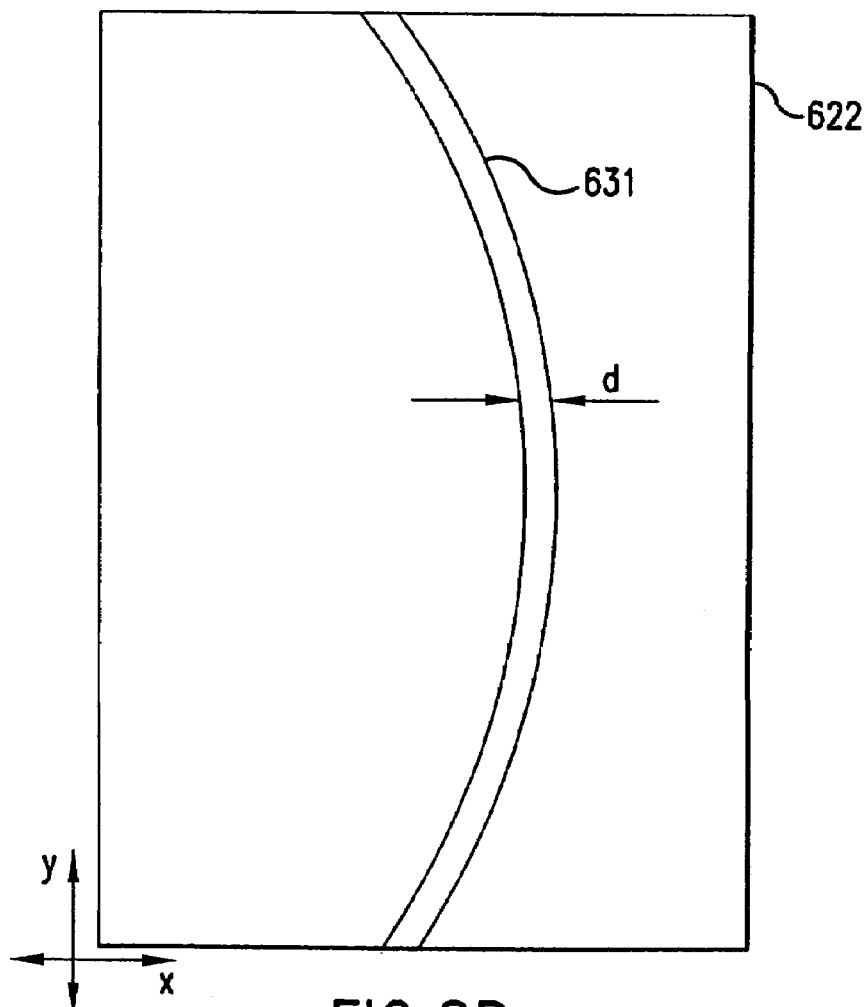
FIG. 8B is a schematic plane view of an image formed on a photosensitive substrate.

FIG. 8B illustrates the detection of field curvature utilizing a photosensitive substrate 622 or demodulating device (not shown) positioned as illustrated in FIG. 8A. Line 631 represents the field curvature for the optical system being characterized and the width d of line 631 represents the depth of focus of the optical system being characterized. Accordingly, by tilting a photosensitive substrate 622 within a volume of space 620 and using a reticle having a plurality of features that are imaged onto the photosensitive substrate, the field curvature and depth of field can quickly and easily be determined. By selecting the appropriate features and orientations on a reticle, additional information characterizing the optical system can be obtained in a single exposure of a photosensitive substrate or single data acquisition of the receipt of electromagnetic radiation within the volume of space.

The line 631 can be created with a periodic pattern or grating reticle imaged on a tilted photosensitive substrate 622. A periodic pattern or grating strip or line 631 will be produced down the center of the field. The line 631 should be calculated to be narrow enough to define the central strip of the field, but wide enough to include several resolvable points in the direction of the x axis. This is a function of the pixel density of the detector array, charge coupled device, or position sensitive detector used to view the strip or line 631. A phase-shifting interferometer can be used. Data can be obtained by positioning the photosensitive substrate 622 at the Littrow angle with respect to the phase-shifting interferometer. The Littrow angle is the angle at which electromagnetic radiation from the interferometer retro-diffracts to return to the interferometer. The peaks of an intensity map acquired by the phase-shifting interferometer are the points of best focus of the optical system being characterized. These peaks comprise a ridge in the direction of the y axis. The meandering of this ridge in the direction of the x axis as the field is traversed in the direction of the y axis represents the field curvature. The robustness of this procedure relies on its ability simultaneously to acquire intensity data at points throughout the volume of space 620. Calibration, scaling, and extraction of data are straightforward. This method uses the intensity of the retro-diffraction. Field curvature can also be detected using the phase of the retro-reflection. In this method, the photosensitive substrate is positioned perpendicular to the phase-shifting interferometer axis. The acquired phase map consists of the feature resist height at each point on the photosensitive substrate. In the direction of the x axis, the quality of feature is a function of focus curve. In the direction of the y axis, the shift of best focus for any feature size and orientation is a function of field position. The field curvature and astigmatism can be extracted from the comparison of curve shift as a function of orthogonal feature orientation, as would be apparent to one skilled in the relevant art.

Figure 9A:
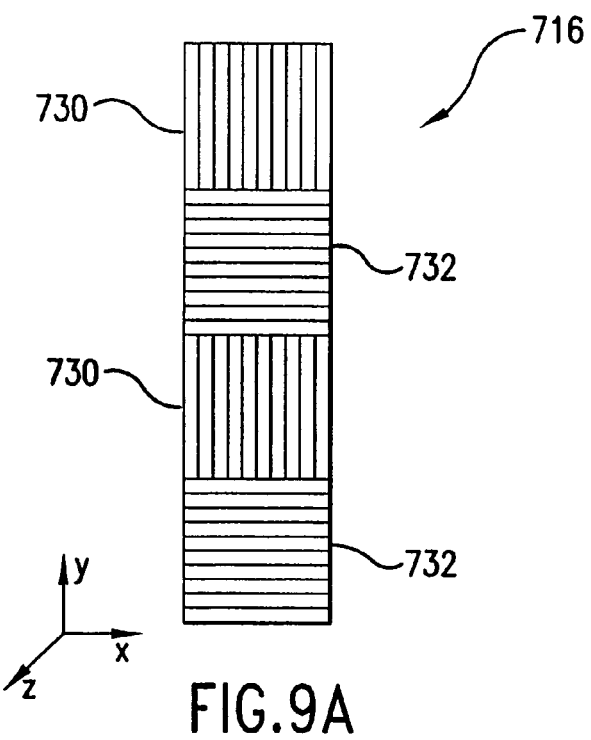
FIG. 9A is a schematic plane view of one embodiment of a portion of a pattern on a reticle.
Figure 9B:
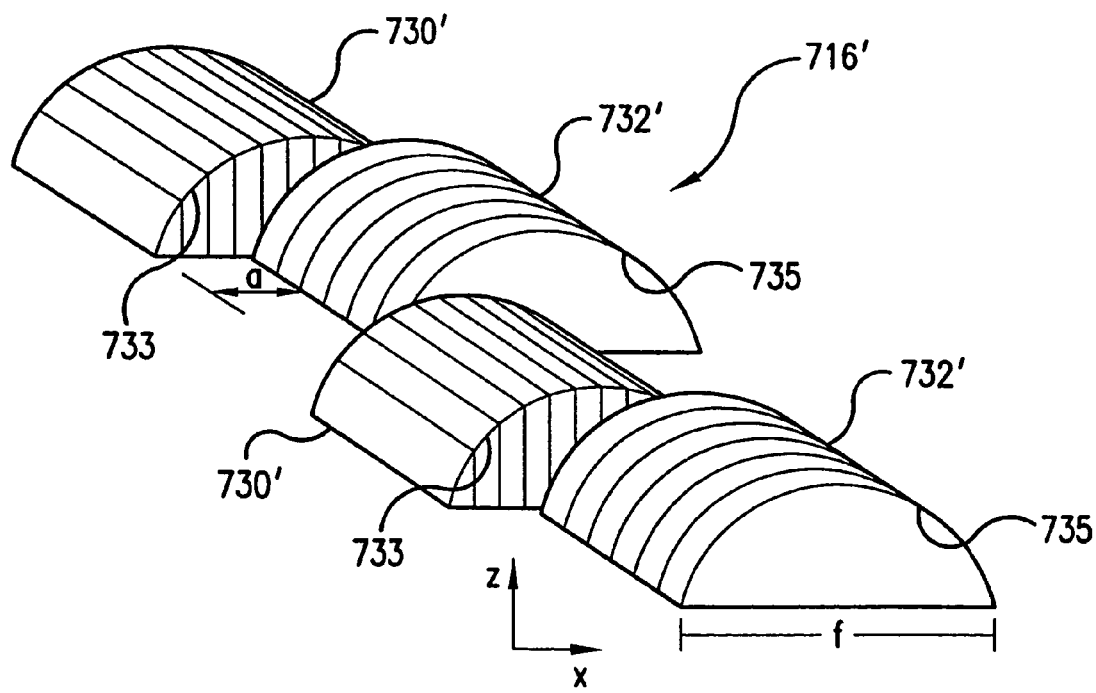
FIG. 9B is a schematic perspective view illustrating detection of astigmatism based upon the embodiment illustrated in FIG. 9A.

FIGS. 9A and 9B schematically represent detection of astigmatism according to the present invention. FIG. 9A schematically represents a pattern that can be repetitively reproduced on a reticle or a mask or presented for viewing by a demodulating device (such as demodulating device 24 as shown in FIG. 1B) for use in detecting astigmatism. Portion 716 contains orthogonal gratings or line patterns. Vertical lines 730 are interlaced or alternate between horizontal lines 732. The vertical lines 730 and the horizontal lines 732 are mutually perpendicular with respect to each other.

FIG. 9B represents the image formed on a photosensitive substrate or a correspondingly configured demodulating device (not shown) that has been tilted in the volume of space, such as that illustrated in FIG. 8A. The feature set or portion of the periodic patterns or gratings 716' imaged on the photosensitive substrate has a lateral dimension f representing the depth of field. Across the dimension f, representative of the depth of field, different image quality will be obtained with the best image quality being located at the highest point along dimension f. An envelope 735 is formed. The envelope 735 represents the image quality in a dimension f along the depth of focus of the recorded image 732' of the horizontal line 732 illustrated in FIG. 9A. Similarly, the vertical lines 730 illustrated in FIG. 9A are represented by recorded image 730'. An envelope 733 is formed representing the image quality of the depth of focus for the recorded image 730', of the vertical lines 730 on the portion 716 of a reticle, illustrated in FIG. 9A. The best image quality being graphically represented by the highest point along the envelopes 733 and 735. Any astigmatism in the optical system at the image location is represented by distance a, which represents the different imaging of the horizontal and vertical lines. The axial separation of the tangential and sagittal image planes can be detected by the different points of focus represented by the envelopes 733 and 735. The lateral shift of these different points of focus is represented by distance a.

Many different feature sets or periodic patterns or gratings can be utilized according to the present invention. FIGS. 10A and 10B illustrate another feature set, periodic pattern, or grating that can be utilized in determining astigmatism of an optical system. FIG. 10A is a plane view illustrating a reticle or mask 817 having a plurality of stripes 816, each stripe 816 containing a reticle pattern or feature set. FIG. 10B schematically illustrates one of the reticle periodic patterns or gratings 816 from which the reticle 817 illustrated in FIG. 10A is formed. The feature set, periodic pattern or grating 816 is formed from a plurality of columns of periodic patterns or gratings. Pairs of adjacent columns of periodic patterns or gratings are formed from pairs of orthogonal lines. For example, column 830 is formed from vertical lines and column 832 is formed from horizontal lines. The horizontal and vertical lines are orthogonal. Column 836 is formed from a +45 degrees tilted line and column 834 is formed from a −45 degrees tilted line. Therefore, the lines in columns 836 and 834 are orthogonal. The interlacing of columns having different line orientations, as is illustrated in FIG. 10B, provides information as to the aberrations in the optical system being characterized. The aberrations in a substantial portion of the field can be detected simultaneously in practicing the present invention.

Figure 11A:
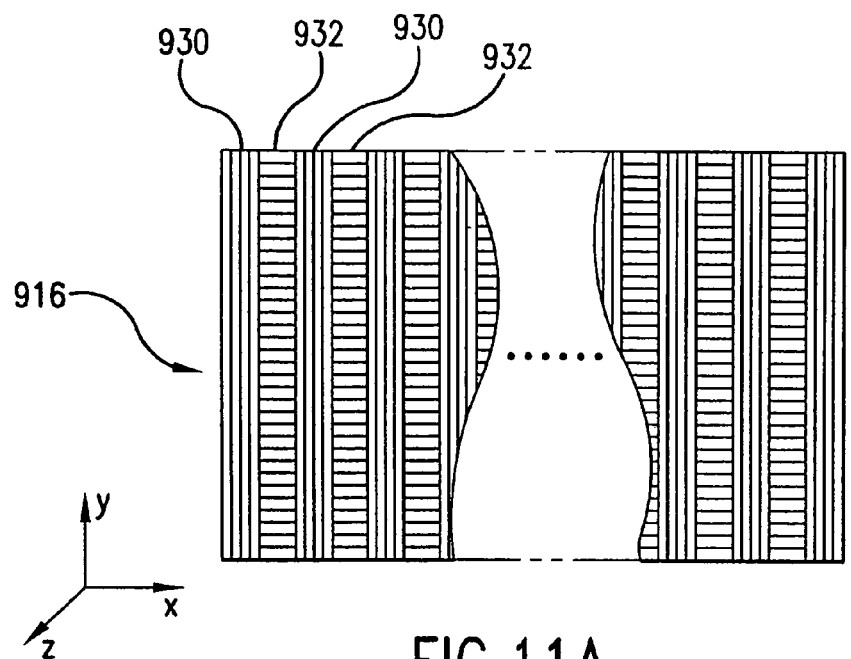
FIG. 11A is a schematic plane view of another embodiment of a portion of a pattern on a reticle.
Figure 11B:
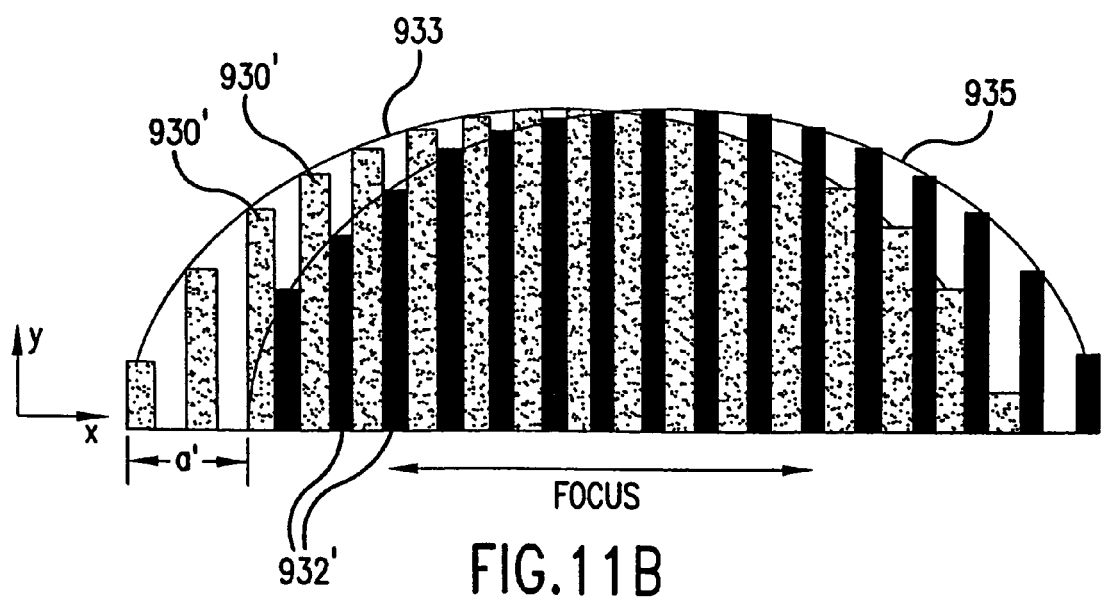
FIG. 11B is a schematic perspective view illustrating detection of astigmatism based upon the embodiment illustrated in FIG. 11A.

FIGS. 11A and 11B are simplified schematic representations illustrating the use of lines or feature sets to determine astigmatism according to the present invention. In this embodiment of the present invention, lines or feature sets are arranged in columns rather than rows. FIG. 11A illustrates a plane view of a portion of a reticle pattern 916. The reticle pattern is formed from a plurality of feature sets or lines, a portion of which is formed by columns of lines that alternate between horizontal and vertical orientations. Columns 930 are formed from a plurality of vertical lines and columns 932 are formed from a plurality of horizontal lines. The image formed from portion 916 of a reticle, when projected in image space, can be used to detect astigmatism. In this embodiment, a photosensitive substrate utilized to record the image of the reticle portion 916 is tilted with respect to the reticle portion 916 out of the x-y plane and rotated about the y axis. Alternatively, a demodulating device (such as demodulating device 24 as shown in FIG. 1B) can be correspondingly configured with respect to the reticle. FIG. 1B schematically represents the detection and analysis of the image in the image space to determine astigmatism at the field location. Because the photosensitive substrate on which the image is recorded is tilted out of the x-y plane and rotated about the y axis, the x direction represents the depth of focus, as illustrated in FIG. 11B. The height in the z direction, illustrated by FIG. 11B, represents the image quality at a different depth of focus. Bars 930', in FIG. 11B, represent the image quality of the alternating columns 930 of vertical lines illustrated in FIG. 11A. The image quality increases and decreases along the depth of focus with the optimum image quality being somewhat centrally located. Accordingly, an envelope 933 is formed representing the image quality of the columns 930 of vertical lines. Similarly illustrated in FIG. 11B, the image quality of columns 932 of horizontal lines is represented by bars 932', with the height of the bars 932' in the z direction representing image quality. The image quality increases and decreases along the depth of focus in the x direction. Accordingly, an envelope 935 of the bars 932', can be determined representing the image quality of the columns 932 of horizontal lines on the reticle portion 916, illustrated in FIG. 11A. The image of the columns 930 of vertical lines represented by bars 930' are interlaced between the image of the columns 932 of horizontal lines represented by bars 932'. If there is no astigmatism at the field location of the optical system being characterized, the envelopes 933 and 935 will coincide. However, any astigmatism can be detected by a relative shift between the envelopes 933 and 935, represented by distance a'.

FIGS. 9A and 9B and FIGS. 11A and 11B illustrate different techniques to obtain the same information using different embodiments of the present invention. The teachings of the present invention, in simultaneously imaging a plurality of different feature sets, periodic patterns, or gratings on a reticle and recording the resulting images in a volume of space, makes possible the detection and characterization of aberrations of the optical system in a single step or exposure. The teachings of the present invention can be utilized to determine different aberrations in the optical system depending upon the different feature sets, periodic patterns, or gratings utilized on portions of the reticle.

Figure 12:
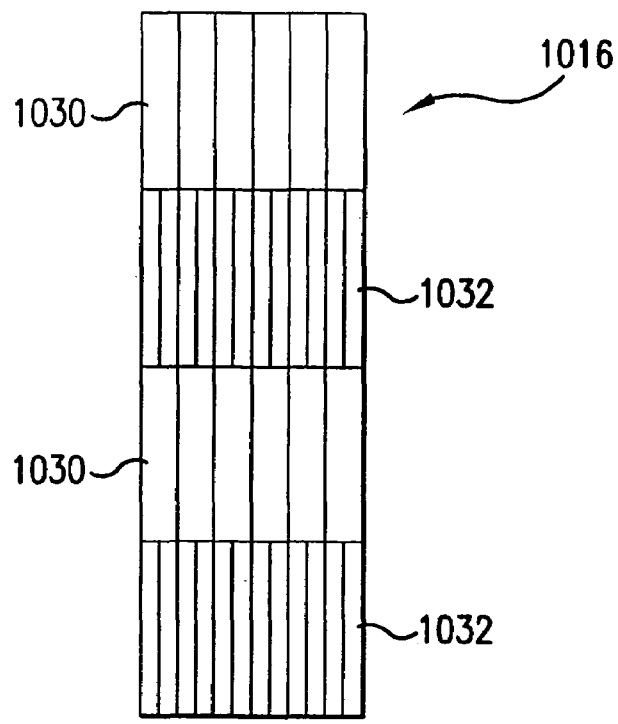
FIG. 12 is a schematic plane view illustrating a portion of a reticle pattern utilized in detecting spherical aberrations.

FIG. 12 illustrates a portion of a reticle 1016 having a feature set or line pattern that can be utilized to detect spherical aberrations. The reticle portion 1016 represents columns 1030 and 1032 of alternating lines with different line spacing or width. For example, the line spacing of column 1030 can be 300 nanometers and the line spacing of column 1032 can be 100 nanometers. The reticle pattern portion 1016 illustrated in FIG. 12 is analogous to the reticle pattern portion 716 illustrated in FIG. 9A. However, where the reticle pattern portion 716 utilizes line orientation to detect astigmatism, the reticle pattern portion 1016 utilizes linewidth or spacing to detect spherical aberrations. All detect the image of the respective reticle pattern portion in a volume of space at different depths of focus, such as when a photosensitive substrate is tilted in the image volume of space. Additionally, all can be read with an interferometer in a single step with the different imaged lines containing information representative of the aberrations of the optical system. For the reticle pattern portion 1016, the image quality will vary along the depth of focus for the different linewidths. Accordingly, an envelope representing the image quality as a function of the depth of focus for each different linewidth section will shift depending upon any spherical aberrations. It should be appreciated that different reticle portions can be utilized having different line patterns over portions of the reticle to detect a variety of different aberrations at different locations in the field. These different portions of reticle patterns can be incorporated in a single reticle to simultaneously detect and measure the field curvature and different aberrations.

Figure 13:
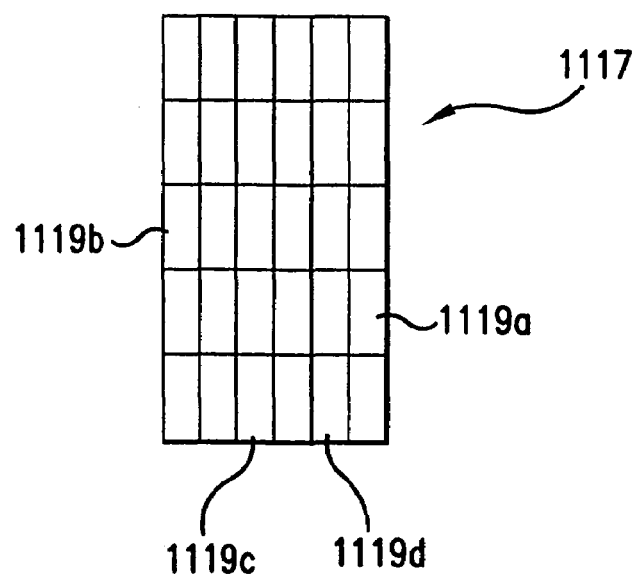
FIG. 13 is a schematic plane view illustrating a reticle divided into different feature sets or pattern portions for detecting different aberrations used in characterizing the optical system.

FIG. 13 represents a reticle 1117 that is divided into a plurality of different sections, having as an example thereof section 1119a, 1119b, 1119c, and 1119d among other sections that can have different reticle pattern portions configured to detect different aberrations simultaneously over a field to characterize the optical system. For example, magnification can be measured as the angle of retro-diffraction. Normal feature pitch and associated nominal diffraction beam angle can be measured differently from a calibrated nominal pitch substrate or calibrated prism or nominal angle between faces. Distortion, residual after magnification removal, can be measured as the scaled phase map residual. The scaling reflects the relationship between in-plane distortion, IPD, and the geometric constraints of the normal periodic pattern or grating pitch, the interferometer wavelength, and the local retro-diffraction beam angle. Coma can be measured by an induced image shift through focus seen as a second-order distortion across the field tilted through the depth of focus of the optical system.

Figure 14:
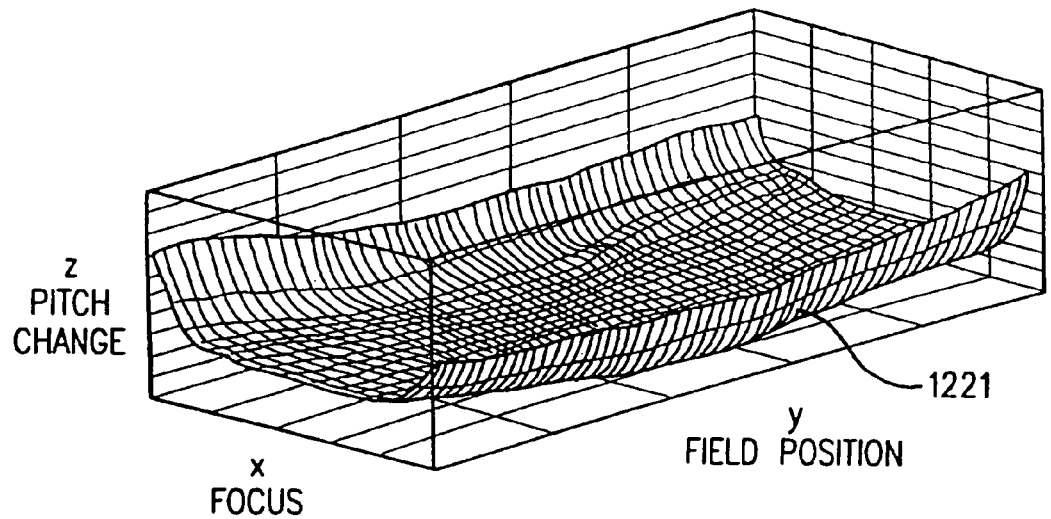
FIG. 14 is a perspective graphical view of an interferometer map illustrating detection of distortion or aberrations of an optical system in an embodiment of the present invention.

FIG. 14 is a perspective view of an interferometric analysis or map of a resist covered or photosensitive substrate exposed with the image of a basket weave or interlaced or cross periodic pattern or grating. Alternatively, such an analysis could be performed by viewing the pattern in real time by using a demodulating device (such as demodulating device 24 as shown in FIG. 1B). The basket weave or cross periodic pattern or grating is a reticle having orthogonal lines over the entire field. The entire field of the optical system can be characterized by exposing a reticle over the field onto a tilted photosensitive substrate. The photosensitive substrate should be tilted so that the entire field falls within the depth of focus of the optical system. Because of the tilt, the x axis in FIG. 14 represents focus and field position in the x direction. The y axis represents field position in the y direction. The z axis represents the change in pitch between the lines in the periodic pattern or grating as a result of aberrations or distortions of the optical system. The surface contour 1221 provides information of the imaging characteristics of the optical system. The optical system can be characterized globally by interpreting the entire field, or locally by interpreting a desired portion of the field.

Figure 15:
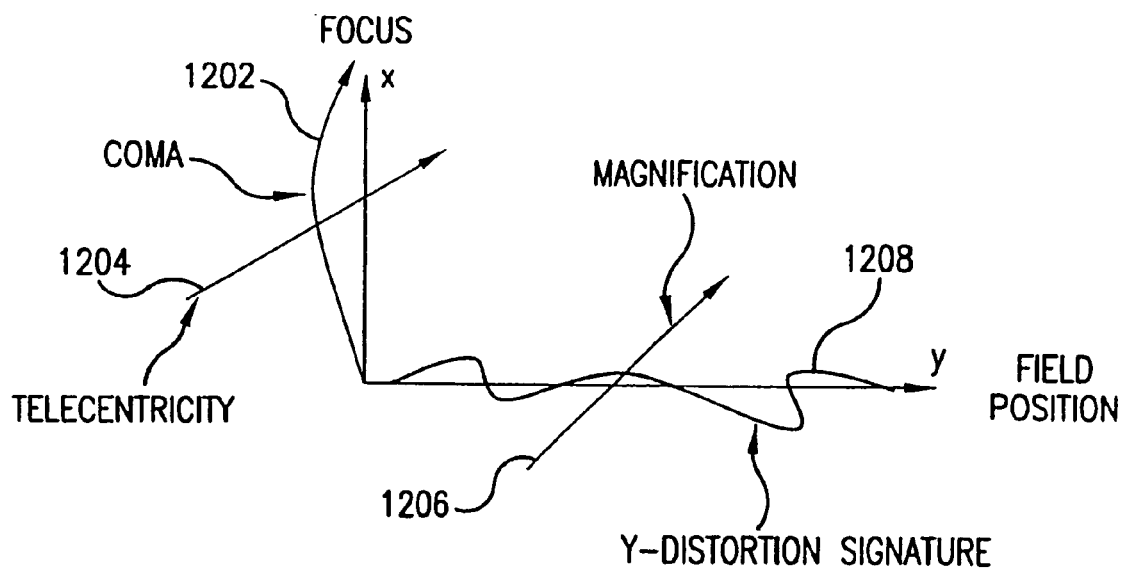
FIG. 15 is a graph illustrating the different distortions or aberrations that can be detected with an embodiment of the present invention.

FIG. 15 is a diagram graphically depicting different imaging characteristics and distortions or aberrations that can be obtained to characterize the optical system using this embodiment of the present invention. Arrow 1202 represents coma and is illustrated by the generally or overall curved surface contour 1221 shown in FIG. 14. Arrow 1204 represents telecentricity and is illustrated as a tilt in the x-y plane about the y axis of the surface contour 1221 shown in FIG. 14. Arrow 1206 represents overall or a mean magnification and is illustrated as a tilt in the x-y plane about the x axis of the surface contour 1221 shown in FIG. 14. Arrow 1208 represents y-distortion signature or a local change in magnification and is illustrated by the local changes in the surface contour 1221 shown in FIG. 14. If there where no aberrations or distortions over the entire field, the interferometric map would result in a flat un-tilted surface.

Figure 16A:
FIGS. 16A-D graphically illustrate, in perspective, the different distortions or aberrations illustrated in FIG. 15.
Figure 16B:
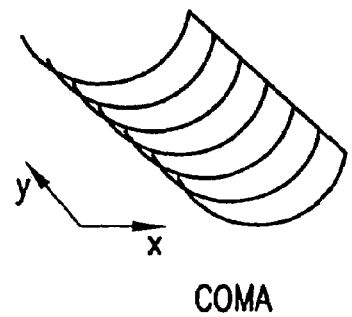
Figure 16C:
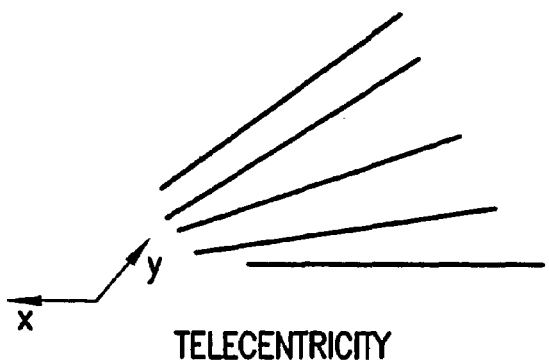
Figure 16D:
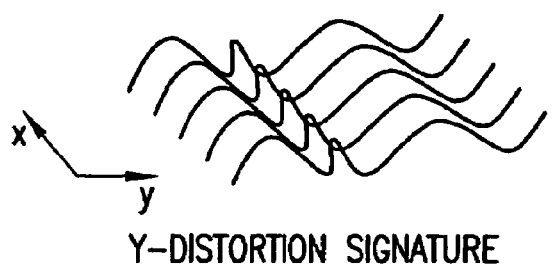

FIGS. 16A-16D schematically illustrate in perspective view the different distortions or aberrations of the optical system being characterized and illustrated graphically in FIG. 15. FIG. 16A represents lines having a tilt in the x-y plane about the x axis. This tilt represents global or overall magnification. Accordingly, if there is no global or overall magnification within the field, there is no tilt in the x-y plane about the x axis. FIG. 16B represents lines having a curve or second order bow through focus. This curve through focus or the x direction represents coma. FIG. 16C represents lines having a tilt in the x-y plane about the y axis. This tilt represents telecentricity. FIG. 16D represents lines having a local curve. This curve represents y distortion signature or local changes in magnification as a function of field position. All of these features or characteristics can be independently extracted from the interferometric map illustrated in FIG. 14. Accordingly, the entire field of the optical system can be characterized in a single step without the need for multiple exposures or separate analysis.

Figure 17:
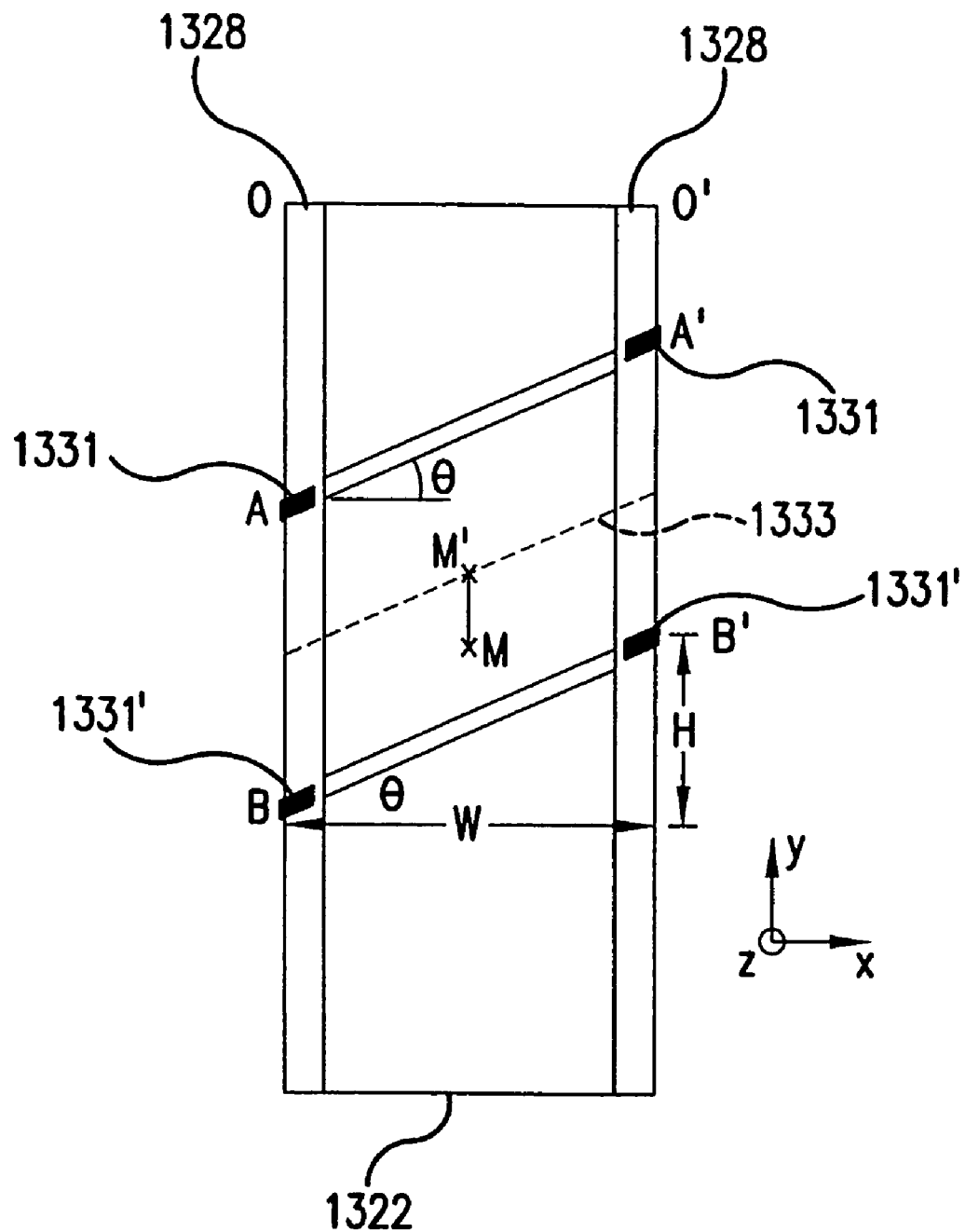
FIG. 17 is a plane view of a photosensitive substrate illustrating an embodiment of the present invention used to obtain best focus of an optical system.

FIG. 17 is a plane view of an exposed photosensitive substrate illustrating an embodiment of the present invention for determining best focus of an optical system. The image of a reticle is projected onto a photosensitive substrate 1322 over the field of an optical system. Alternatively, the image of the reticle could be presented for viewing in real time by using a demodulating device (such as demodulating device 24 as shown in FIG. 1B). The reticle projects the image of a basket weave periodic pattern or grating pattern along the two longitudinal edges 1328 of a rectangular field. The photosensitive substrate 1322 is tilted about the longitudinal axis, so that a relatively narrow first band 1331 is printed laterally across the photosensitive substrate within the two longitudinal edges 1328 during a first exposure. The photosensitive substrate 1322 is then shifted a known distance co-axial with the optical axis, in the z direction, which extends into the drawing sheet of FIG. 17, so that a relatively narrow second band 1331' is printed laterally across the photosensitive substrate within the two longitudinal edges 1328 during a second exposure. The position of best focus for the optical system can be determined by analyzing the positions of the first and second printed bands 1331 and 1331'. The analysis is performed using geometry that can be readily determined or derived based upon the known distance shifted. For example, the focus position for the center of the field at point M is obtained by measuring the distance OA and O'A'. These numbers yield the position of the exposed first printed bands 1331 relative to the known field center M. Interpolation of the focus values for the two exposures forming first and second bands 1331 and 1331 ÿ yields the focus value for the field center at M. This focus value is along the optical axis only. Tilt error about the lateral axis is calibrated by measuring the distance AB along the substrate. The tilt slope is expressed in nanometers of focus shift, as determined by the focus difference between the two exposures, per millimeter of substrate, as determined by the distance AB. Using this tilt slope value the bow or tilt about the longitudinal axis error is determined by measuring the angle θ of the line A-A' or B-B' via measurement of the distance difference between distance OA and O'A' or distance OB and O'B'. From the measurement of four of these distances, the substrate is aligned to best focus plane with redundancy for measurement error correction or averaging. Alternatively, the values can be extracted from the following formulas, where:

M' lies on the midpoint of a line 1333 midway between line A-A' and line B-B';

IFS is the induced focus shift or intentional shift along the z or optical axis between the two exposures;

IT is the induced tilt or intentional shift about the lateral axis.

Then,
the slope (S) is equal to H/W;
the focus error (FE) is equal to IFS/AB×MM';
the tilt error (TE) about the longitudinal axis is equal to (IFS/AB)−IT; and
the tilt or bow error (BE) about the lateral axis is equal to S×IFS/AB.

Figure 18:
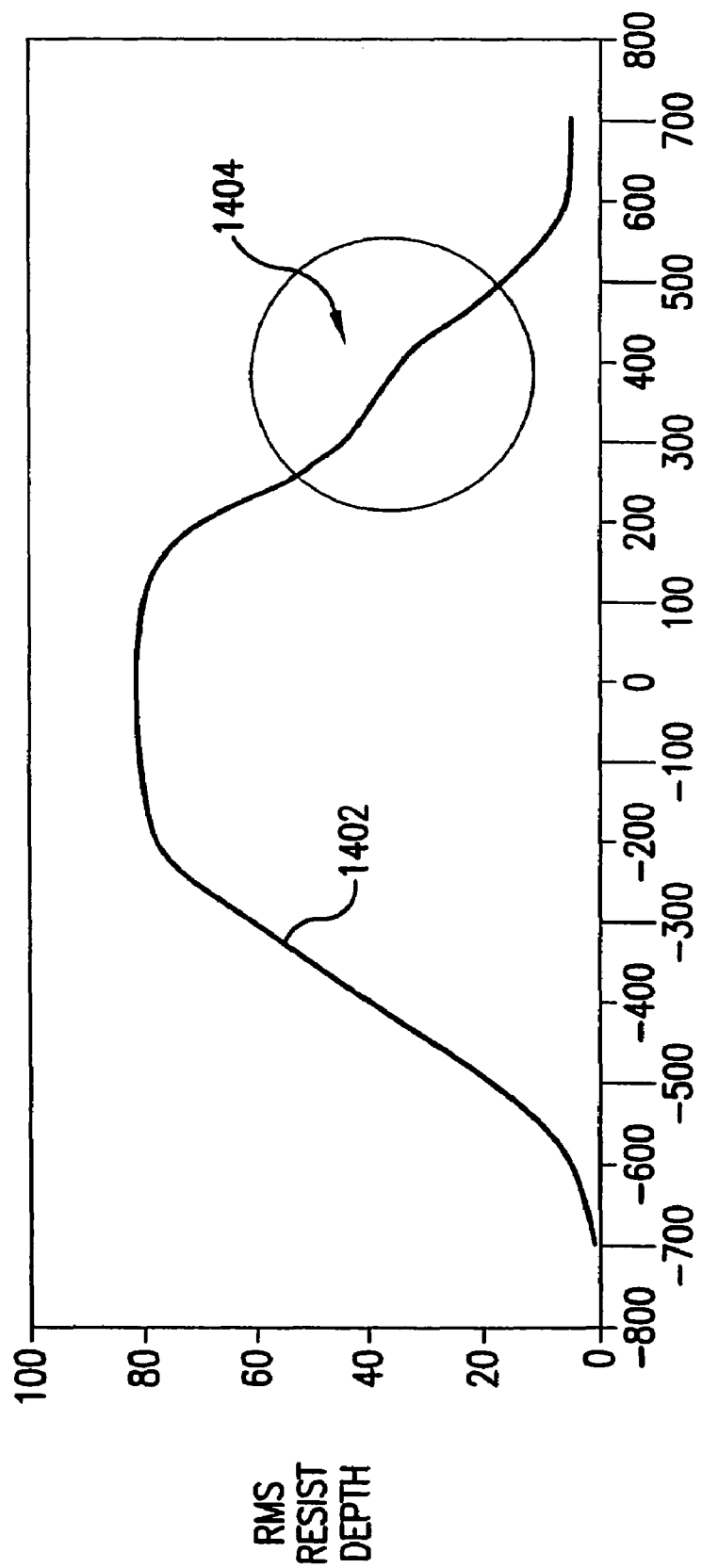
FIG. 18 is a graph illustrating detection of spherical aberrations in an embodiment of the present invention.

FIG. 18 illustrates the use of an embodiment of the present invention to detect spherical aberrations. Curve or line 1402 represents the resist depth as a function of focus. Due to a tilt through focus when exposing a photosensitive substrate, the periodic pattern or grating formed on the photosensitive substrate by the processed resist has a varying depth. The depth is greatest at best focus and becomes smaller as focus degrades. The asymmetry in curve or line 1402, identified at region 1404, is representative of spherical aberrations. Accordingly, the present invention can be applied to detect spherical aberrations in an optical system.

Figure 19A:
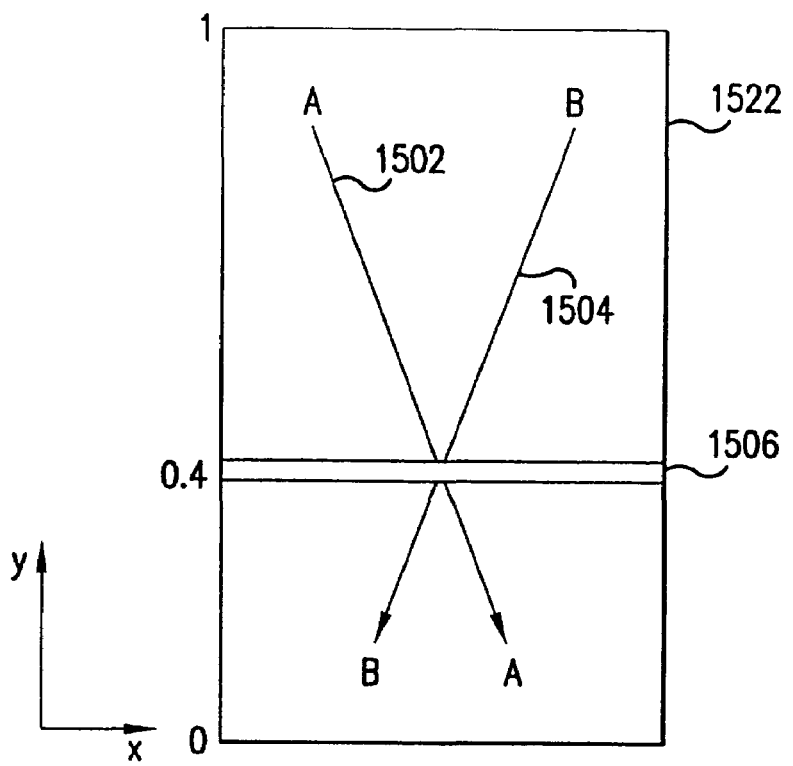
FIG. 19A is a schematic plane view illustrating an embodiment of the present invention for determining optimum placement of a reticle for enhanced imaging.
Figure 19B:
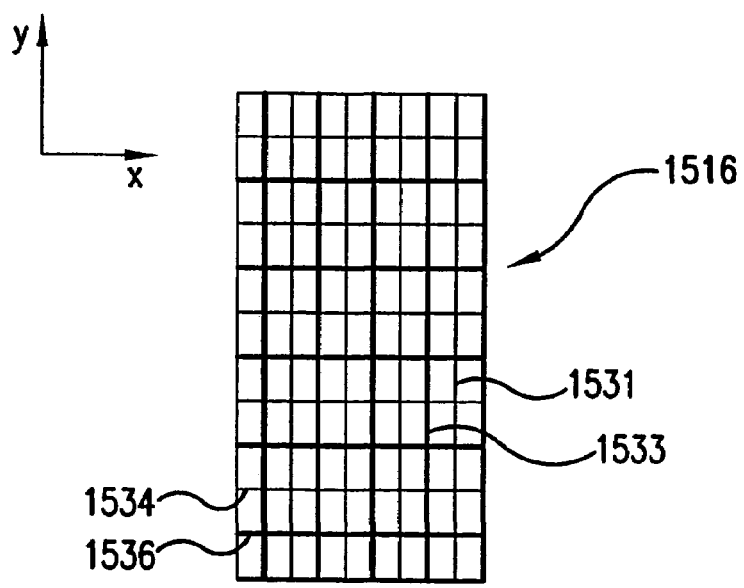
FIG. 19B is a schematic plane view of a reticle utilized in the embodiment of the present invention illustrated in FIG. 19A.

FIGS. 19A and 19B illustrate another embodiment of the present invention for determining initial placement of a reticle in the optical system for obtaining optimized imaging. Referring to FIGS. 19A and 19B, a photosensitive substrate 1522 is exposed by a reticle 1516. Alternatively, the image of the reticle is presented for viewing in real time by using a demodulating device (such as demodulating device 24 as shown in FIG. 1B). The reticle is tilted out of an x-y object plane about the x axis. The photosensitive substrate 1522 is preferably out of the x-y plane about the y axis. Accordingly, the reticle 1516 and the photosensitive substrate 1522 are tilted orthogonal with respect to each other, similar to the embodiment illustrate in FIG. 1. The reticle 1516 has a plurality of orthogonal interlaced lines with different linewidths. For example, line 1531 has a relatively narrow vertical linewidth and line 1533 has a relatively wide vertical linewidth. The vertical lines 1531 and 1533 are alternating or interlaced in the x direction. Relatively narrow horizontal line 1534 and relatively wide horizontal line 1536 are alternating or interlaced in the y direction. A grid pattern of alternating or interlaced horizontal and vertical lines of different widths is thereby formed. The grid pattern on the reticle 1516 is imaged through reticle position, due to the tilt in the reticle 1516, onto the photosensitive substrate 1522 through focus, due to the tilt in the photosensitive substrate 1522, during an exposure. The processed photosensitive substrate 1522 will have a locus of best focus position as a function of linewidth or feature size. This locus is determined by examining the image, including the resist depth. Generally, the maximum resist depth determines best focus. Alternatively, the locus of best focus position could be determined by analyzing the visible pattern produced by the demodulating device (such as demodulating device 24 as shown in FIG. 1B). That is at best focus, the resist is more fully exposed and therefore has greater depth. The position at which the locus of best focus position for each different linewidth cross represents the preferred position for the reticle to minimize aberrations, and in particular spherical aberrations. Referring to FIG. 19A, the intersection of lines 1502 and 1504 represents the optimum position for the reticle 1506 to minimize spherical aberrations. Line 1506 represents the location or plane of optimum position for the positioning of the reticle 1516 to obtain the best image or minimum spherical aberrations. For example, as illustrated along the left longitudinal edge of the photosensitive substrate in FIG. 19A, if the reticle 1516, in FIG. 19B, was tilted about the x axis one unit, the line 1506 indicates that the reticle should be positioned at 0.4 units to obtain the best or optimum imaging. The line 1506 is drawn parallel to the axis of tilt of the reticle, or x axis. While only two different alternating or interlaced linewidths have been illustrated, it should be appreciated that any number of different linewidths can be alternating or interlaced.

While the present invention has been illustrated and described with respect to different embodiments and different feature sets or line patterns, clearly other feature sets or line patterns can be utilized and arranged in different ways to characterize an optical system. However, all of the embodiments of the present invention simultaneously image a variety of different pattern portions in a volume of space at different depths of focus. The recorded images of the plurality of pattern portions at different depths can be interferometrically analyzed so as to characterize the optical systems. This interferometric analysis is preferably accomplished in a single step such that the data obtained from the interferometric analysis of the recorded image of the reticle provides nearly complete characterization of the optical system. The present invention therefore prevents the need to sequentially select and analyze different locations within the field of the optical system. As a result, the teachings of the present invention result in a very rapid and robust characterization of the optical systems.

Accordingly, it should be appreciated that the method and apparatus of the present invention makes possible the characterization of an optical system in a single exposure or imaging step or real time viewing to determine focus, field curvature, astigmatism, coma, and/or focal plane deviations of the optical system. The present invention is particularly applicable to the characterization of photolithographic lenses used in printing mask or reticle patterns onto a photosensitive substrate. The present invention determines the best focus by detecting the envelope of feature quality through focus, rather than through the evaluation of image quality or line quality in a three-dimensional array of individual sample points in x, y, and focus. The present invention yields a continuum of data through focus and reticle object position.

Therefore, the present invention has the advantage of being focus self-seeking; that is, it is highly insensitive to normal focal plane location errors in that it will always print the zone of best focus if the wafer or photosensitive substrate field being exposed intercepts the depth of focus. The present invention has the advantage of being highly sensitive and having low noise and a single exposure providing rapid acquisition of characterizing parameters. The present invention eliminates the need for focal plane slicing with its associated time consuming multiple exposures and focus slicing errors.

In testing, sensitivity and noise levels have been obtained routinely at less than the five nanometer level. These low levels cannot be obtained using prior techniques. Prior techniques generally degrade with decreasing linewidth. However, the present invention has the advantage that it becomes more robust as linewidth decreases. This occurs because the present invention relies on resolving the envelope of feature quality rather than linewidth image.

The present invention can also obtain full field data in seconds, a relatively short time. This is an important feature in lithographic tools using deep UV and beyond because of the small line sizes and thermally varying time constants. The ability of the present invention to utilize a full field exposure in a single shot eliminates alignment timing errors due to the scanning acquisition of data. The use of the plurality of different feature sets having multiplexed feature orientations, sizes, and line types allows for the determination of focus position, astigmatism, field curvature and depth of focus. Additionally, the present invention can yield information on coma, spherical, and variation of coherence.

The present invention, in consisting of multiplexed periodic features that are imaged by the imaging system to be tested and a lithographic recording process, including a metrology tool to analyze the printed images makes possible the rapid characterization of an optical system. The feature sets can be a group or isolated variant line types, shapes, sizes and orientations. The present invention images these feature sets through and beyond the depth of focus of the imaging system in a single exposure. The envelope or feature quality through focus is printed and analyzed. This analysis can consist of full depth of focus data evaluation, as in the case of auto-correlation and cross-correlation analysis. Alternatively, the analysis can identify envelope maxima or minima asymmetry or slope. This is contrary to the prior techniques that analyze individual features at pre-determined and consequently non-optimum discrete focal positions.

The quality of particular feature sets through focus can be used to determine flat focus, field curvature, astigmatism, spherical aberration, partial coherence, distortion and coma, depending upon the feature type orientation and/or size selected. In a case of astigmatism, different line orientations can be interlaced down the field and read by a dark field or interferometric microscope. Alternatively, different line orientations can be interlaced across the field and read by an interferometric microscope or atomic force microscope. In the case of distortion, the features can be read using a full field interferometer.

Accordingly, it should be appreciated that the present invention greatly advances the ability to characterize quickly and easily an optical system and in particular projection optics used in photolithography for the manufacture of semiconductor wafers. From a single exposure, data acquisition, or viewing step, valuable information can be obtained characterizing the optical system at a single point in time. This greatly increases throughput and yield in that imaging performance is maintained at a high level.

2. Holographic Test Reticles

As described herein, a test reticle with a plurality of periodic patterns and other structures is used to characterize an optical system (such as a lens) under test. For example, as shown in FIG. 1, the optical system 18 is imaged with the pattern on the test reticle 16, resulting in image data that is recorded on the substrate 22. The substrate 22 is examined to retrieve image data that is subsequently processed to determine parameters for the optical system including: focus, field curvature, astigmatism, coma, focal plane deviation, spherical aberration, and coherence variation.

Since the test reticle 16 is used to test the quality of the optical system 18, it is preferable that the patterns on test reticle 16 be as accurate as possible so that a true characterization can be made. More specifically, it is important that the lines and spaces of the gratings (e.g., see FIG. 4) on the test reticle have accurate dimensions and placement. If the grating are not accurate, then it is difficult to determine if aberrations recorded on the substrate 22 are caused by the optical system 18 or by the test reticle 16.

Conventional means for making reticles, including test reticles, include e-beam writing tools and laser writing tools. These conventional techniques typically write sub-fields of a larger pattern that are subsequently stitched together to create the larger composite field pattern. When the sub-fields are stitched together, reticle writing errors can occur. At sub-100 nm linewidths in very high numerical aperture (VHNA) lithographic tools, these writing errors have become a limiting factor in the ability to test optical imaging systems.

Hence, the following discussion describes a method and system for fabricating holographic test reticles in accordance with the present invention. Holographic reticles are generated by interfering two or more beams of optical radiation to generate an interference volume having a periodic interference pattern, such as the gratings and other test structures described above. The interference patterns are then recorded on a reticle blank using various recording techniques such as photo-resist, etc. The geometry of the interference patterns is tightly controlled by the properties of the interfering optical beams. More specifically, the geometry is controlled by the wavelength of light, the wavefront variation, and the geometry of the exposure configuration (i.e., the relative beam angle of the optical radiation before and after interference). All of these factors can be controlled much more precisely than serially written e-beam or laser writing techniques. Additionally, much larger reticle areas can be written in a single pass using this holographic technique. As such, writing errors that result from stitching together e-beam sub-fields are avoided entirely.

Figure 20:
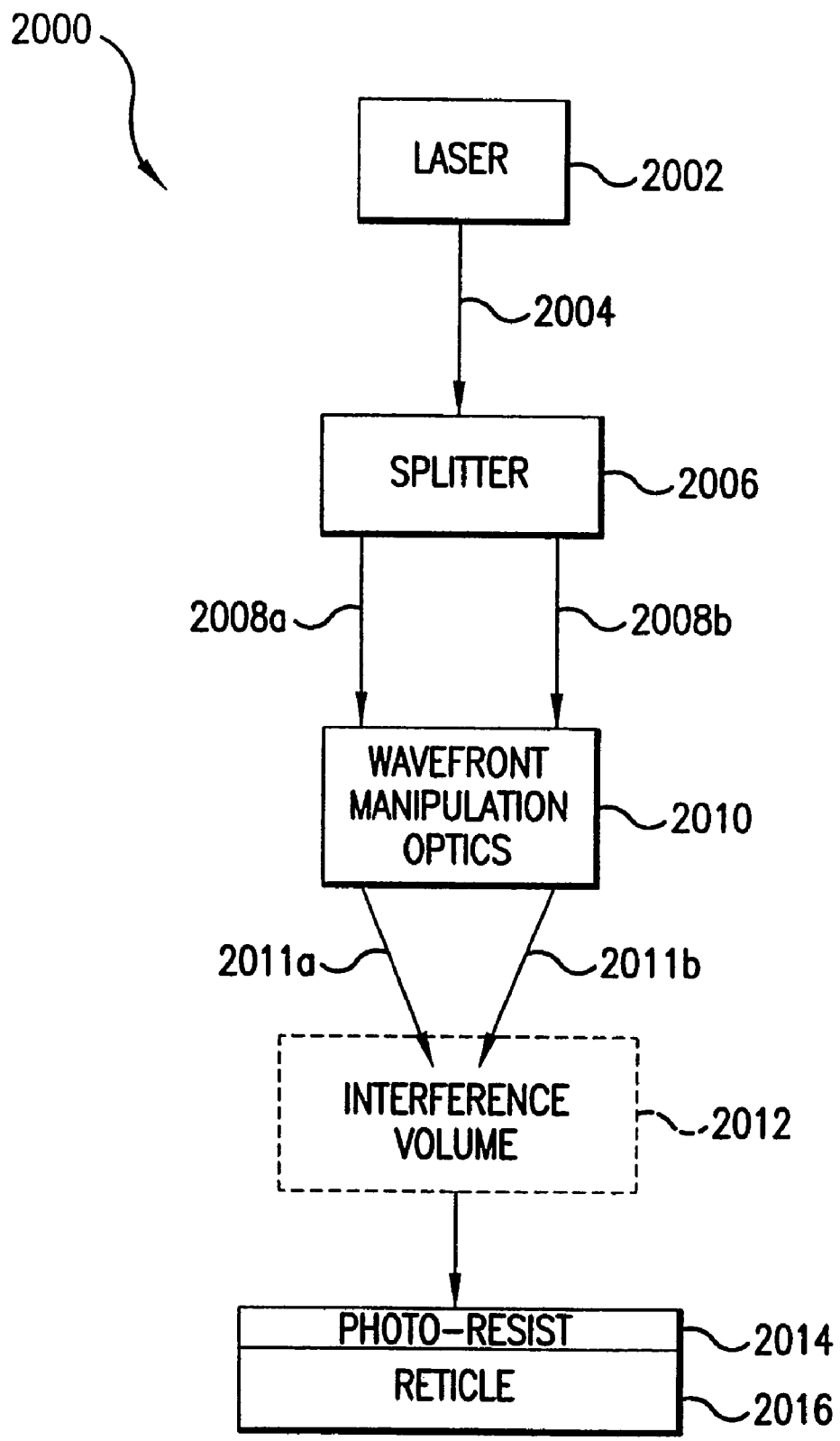
FIG. 20 illustrates a holographic reticle writing system according to an embodiment of the present invention.
Figure 21:
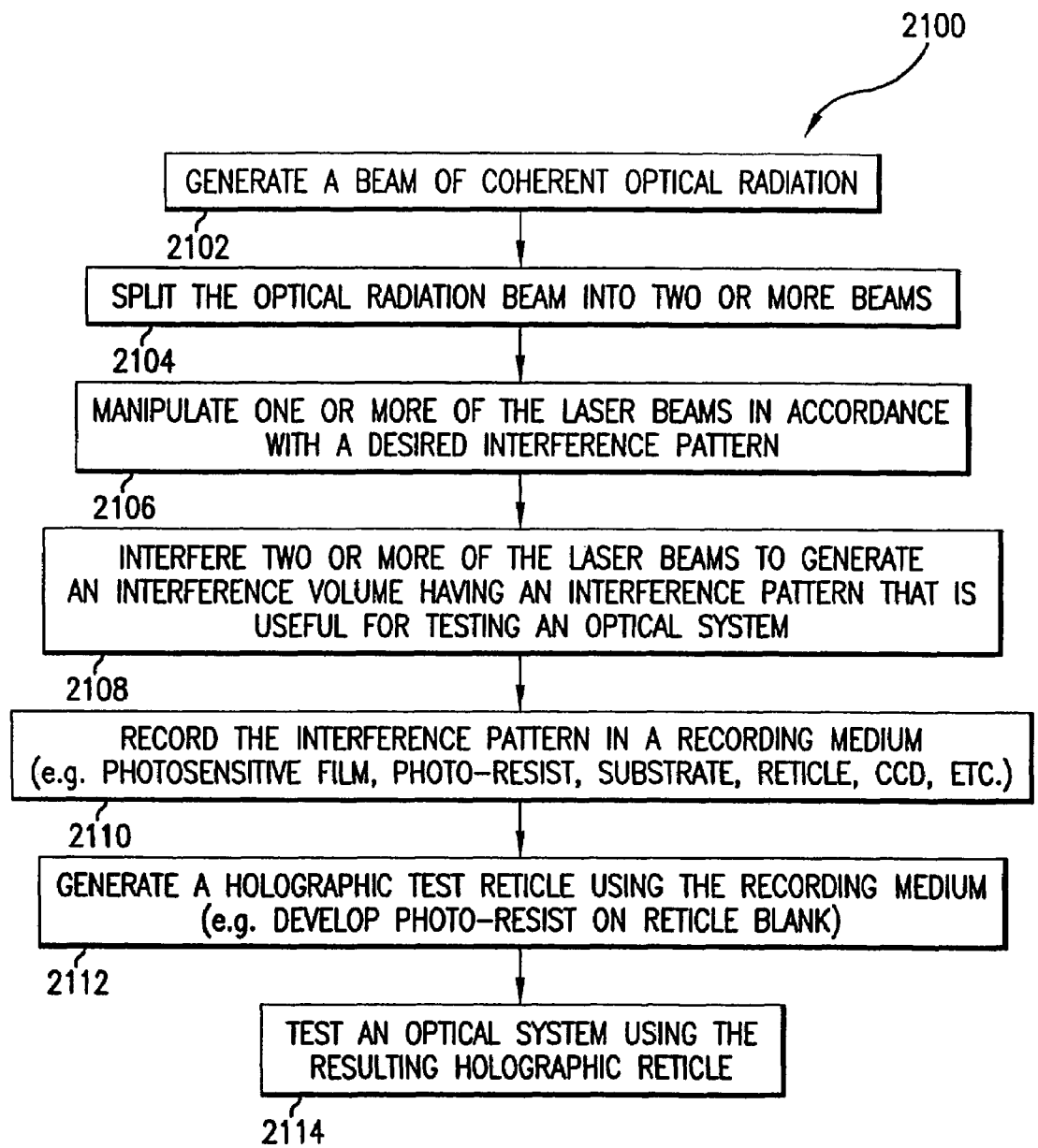
FIG. 21 illustrates a flowchart for writing a holographic reticle according to an embodiment of the present invention.

FIG. 20 illustrates a system 2000 for writing a holographic reticle, and includes: a laser 2002, a splitter 2006, wavefront manipulation optics 2010, an interference volume 2012, and a reticle blank 2016 having photo-resist 2014. The system 2000 is described with reference to a flowchart 2100 (FIG. 21), as follows.

In a step 2102, the laser 2002 generates coherent optical radiation 2004.

In a step 2104, the splitter 2006 splits the optical radiation 2004 into two or more beams 2008a,b. Two beams 2008a,b are shown for ease of illustration. However, multiple beams

2008 could be generated, where the number of beams is dependent on the type of interference pattern that is desired.

In a step 2106, the wavefront manipulation optics 2010 manipulate the wavefronts of one or more of the beams 2008, resulting in beams 2011$a,b$. Exemplary optics 2010 include various optical components that are generally used to alter the wavefronts of laser beams, and include but are not limited to: lens, expanders, collimators, spatial filters, mirrors, etc. As a specific example, spatial filtering of spherical waves that are produced by beams converging through a pinhole will generate tightly controlled wavefronts that are dictated by the wavelength, wavefront divergence angles, propagation distances, and beam intersection angles. Additionally, the optics 2010 are aligned so that the resulting beams 2010 will subsequently interfere and produce an interference volume.

The resulting beams 2011$a,b$ have wavefronts that generate a desired interference pattern during subsequent beam interference. The specific type of wavefront for each beam 2011 depends on the specific interference pattern that is desired. Exemplary wavefronts include but are not limited to: cylindrical wavefronts, planer wavefronts, spherical wavefronts, etc. Specific wavefront combinations and associated interference pattens are discussed further herein.

In a step 2108, the beams 2011$a,b$ interfere to produce an interference volume 2012 having an associated interference pattern. FIG. 20 illustrates two beam interference for ease of illustration. However, the scope of the invention includes multiple beam interference, where the number of beams depends on the type of interference pattern that is desired.

In a step 2110, photo-resist 2014 on the reticle 2016 records the interference pattern that is associated with the interference volume 2012. Other types of recording mediums could be used including but not limited to:

photographic film, holographic film, photo-refractive media, photopolymers, and other known means for recording an interference pattern that will be understood by those skilled in the relevant arts.

In a step 2112, the photo-resist 2014 is developed to generate a test reticle having the desired interference pattern.

In a step 2114, an optical system is tested using the holographic test reticle, such as the optical system 18 that was described in FIG. 1.

There are many advantages to writing test reticles holographically, some of which are discussed as follows. First, holographic patterning is more accurate than e-beam techniques because the resulting interference pattern is determined by the wavelength of light, the wavefront variation of the interfering beams, and the geometry of the exposure configuration. All of these factors can be controlled more accurately than in conventional e-beam and laser writing techniques, and thereby reducing reticle writing errors that are associated with conventional techniques.

Due to the increased accuracy, the periodic structures (e.g., grating) that are common to optical performance testing are easily produced using holographic techniques. For example, in linear gratings, the linewidth pitch uniformity can be precisely controlled, and therefore distortion is minimized. Additionally, in chirped gratings, variable pitch patterns can be produced with great accuracy. Therefore, an optical system can be tested over a precisely-controlled continuum of line-sizes, line orientations, and pattern pitches. Additionally, phase shifts in periodic structures can be precisely controlled. Phase shifted gratings are useful for the characterization of odd optical aberrations in optical systems, which produce feature shifts in the image plane.

Additionally, holographic patterning can print linewidths that are much smaller than the current reticle writing tools, including e-beam and laser writing tools. For example, e-beam techniques are currently limited to 100 nm and above, whereas holographic patterning can print linewidths that are sub-100 nm and as low as 50 nm.

2a. Specific Configurations and Interference Patterns

Specific embodiment for patterning holographic reticles and the resulting interference patterns are described as follows. These embodiments are meant for example purposes only and are not meant to be limiting. Other example embodiments will be understood by those skilled in the arts based on the discussion given herein. These other example embodiments are within the scope and spirit of the present invention.

Figure 22A:
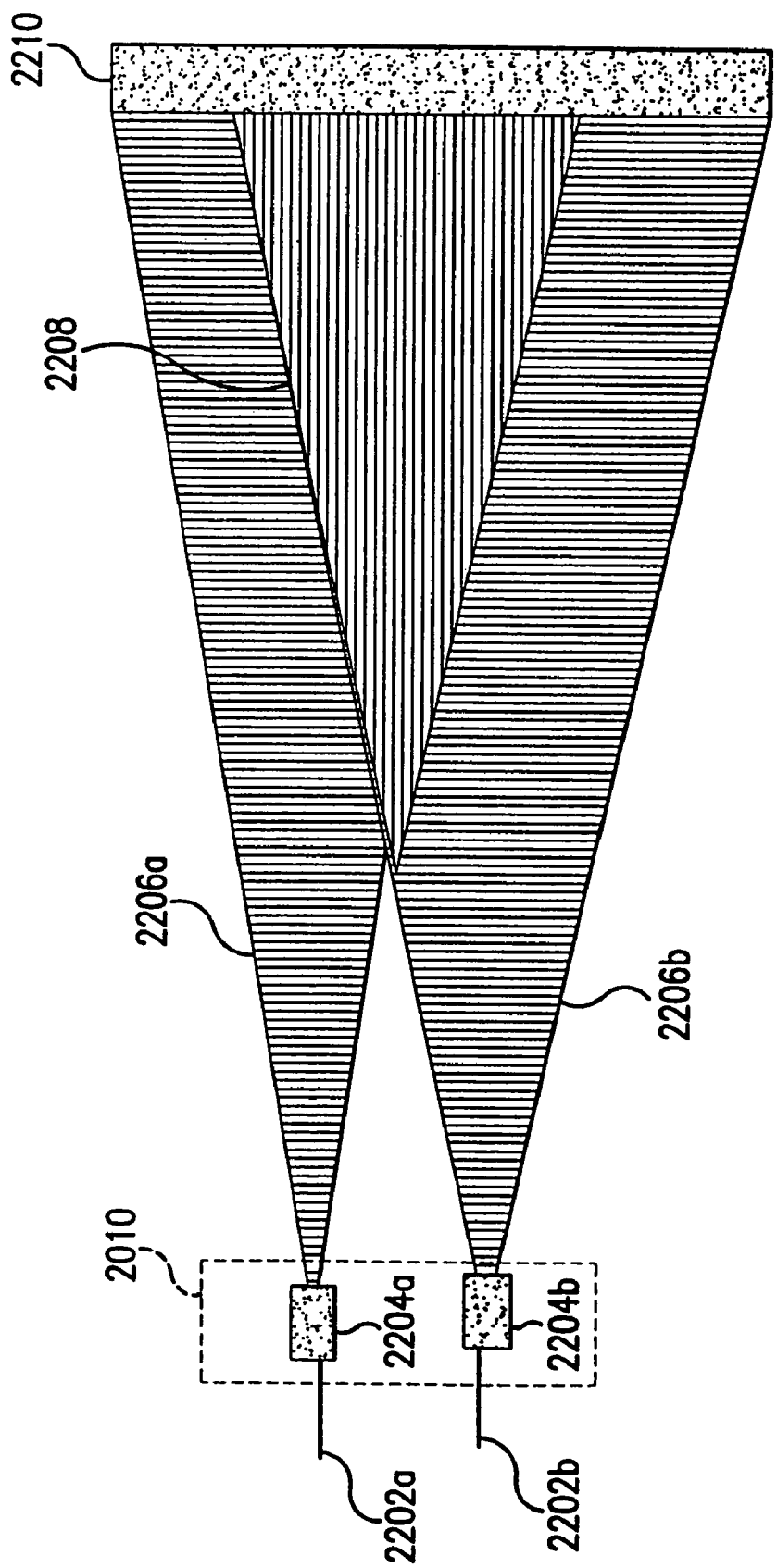
FIG. 22A illustrates spherical two beam interference produced by holographic patterning according to an embodiment of the present invention.

FIG. 22A illustrates an example of holographic reticle patterning (or writing) based on interference of two spherical beams. Referring to FIG. 22A, optical expanders 2204$a,b$ receive optical radiation beams 2202$a$ and 2202$b$. The expanders 2204$a,b$ manipulate the beams 2202$a,b$ to have expanding spherical wavefronts, represented as beams 2206$a$ and 2206$b$. The beams 2206$a$ and 2206$b$ interfere to produce an interference volume 2208 having a substantially linear grating pattern as shown. The linear grating pattern is recorded on a reticle blank 2210. The linewidth and spacing of the grating pattern (also called pitch uniformity) are tightly controlled by the wavelength of the beams, and the angle at which the beam interference occurs. When lasers are used as the optical source, the optical wavelength is extremely accurate and stable. Therefore, the pitch uniformity of the resulting grating is also very accurate and stable, and improved over that achieved with e-beam or laser writing techniques.

In FIG. 22A, spherical expanding beams are illustrated to create linear gratings for example purposes only, and are not meant to be limiting. Other embodiments will be understood by those skilled in the arts. For example, long path length quasi-plane wave beams can be used to improve the pitch uniformity. Alternatively, additional optics can be utilized to collimate the beams to produce plane waves. In other words, linear gratings can be produced by interfering collimated light.

Figure 22B:
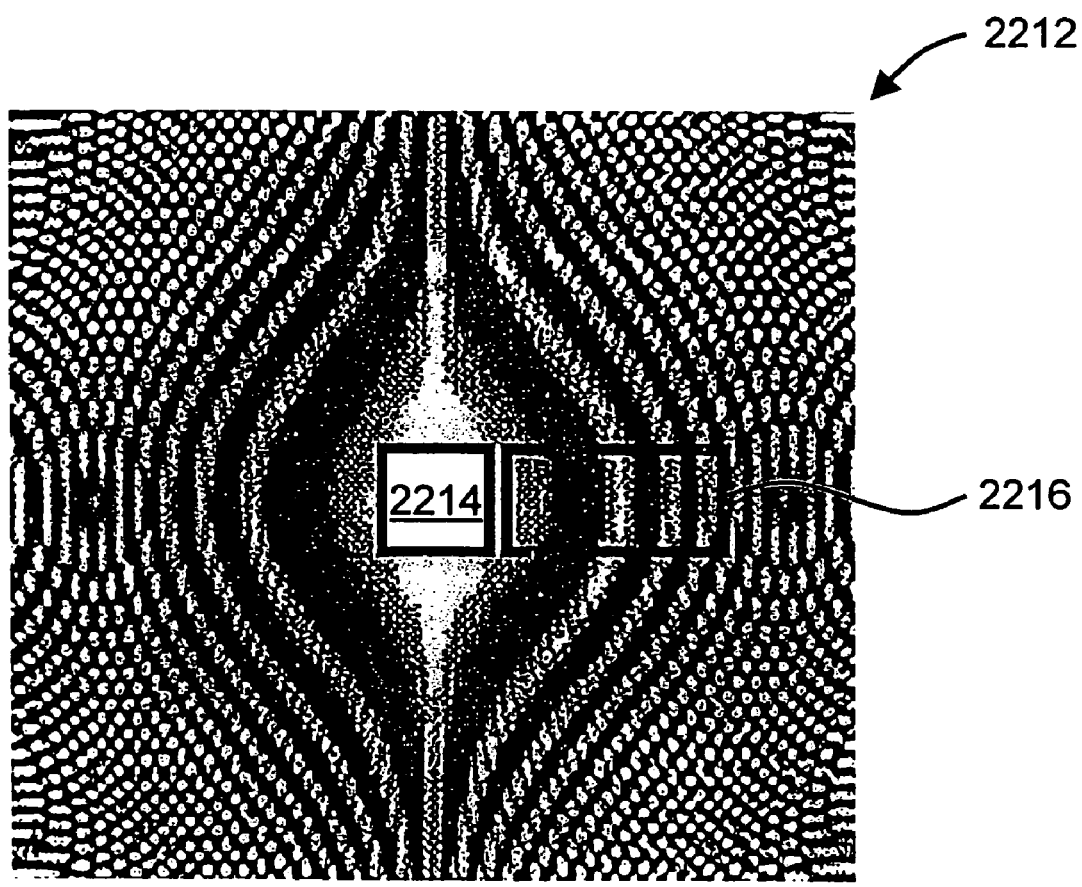
FIG. 22B illustrates the pitch uniformity for spherical two beam interference according to an embodiment of the present invention.

FIG. 22B illustrates a simulation associated with an interference pattern 2212 that is produced by spherical two beam interference. The simulation represents the change in pitch uniformity over the pattern 2212. The box 2214 in the center of the interference pattern 2212 highlights an area having constant pitch uniformity. In other words, the linewidths and spaces are substantially constant within the box 2214. In contrast, the box 2216 highlights an area of the pattern 2212 having a variable (but controlled) pitch uniformity. More specifically, the linewidths and spaces in the box 2216 are increasing, but at a known and controlled rate. This is known as a chirped grating. Similarly, other parts of the pattern 2212 have linewidths and spacing that are decreasing at a controlled rate.

FIGS. 23A-E illustrate holographic reticle patterning for generating an interference pattern having a chirped grating. As mentioned above, chirped gratings have a series of continuously variable lines and spaces, as further illustrated in FIGS. 23B-E. Chirped gratings are useful for determining image distortion of an optical systems over multiple linewidths and spacings, without requiring multiple exposures.

Figure 23A:
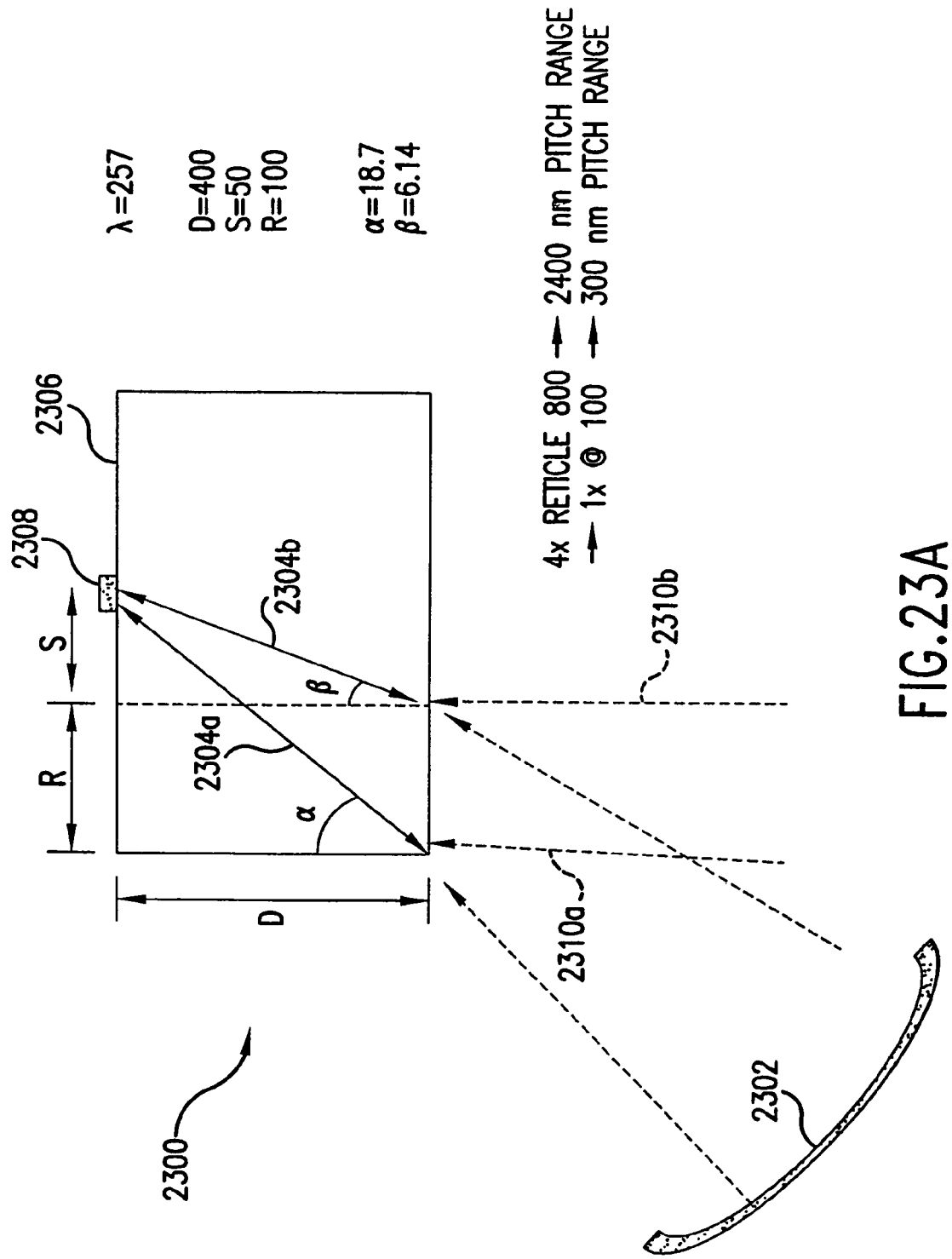
FIG. 23A illustrates a system for generating a chirped grating using holographic patterning according to an embodiment of the present invention.

Referring to FIG. 23A, holographic reticle configuration 2300 depicts an off-axis cylindrical and plane wave beam combination, which is useful for generating interference patterns that have a chirped grating. Radiation beams 2310$a,b$, having planer wavefronts, are projected onto the bottom of a reticle 2306, as shown. Additionally, a mirror 2302 projects radiation beams 2304$a,b$ onto the reticle 2306 at angles ÿ and ÿ, relative to the beams 2310$a,b$. The beams 2304$a,b$ preferably have a cylindrical wavefront, and meet at a point 2308. The beams 2310a,b and 2304a,b interfere to produce an interference volume having a chirped grating pattern, where the characteristics of the chirped grating are dictated by the geometry of the cylindrical divergence and the interfering beam wavelengths.

FIGS. 23B-E illustrate exemplary chirped gratings. More specifically, FIG. 23B illustrates a cylindrical zone plate grating 2312, where the linewidths and spacings are a maximum at the center of the grating, and decrease from the center of the grating to the edge of the grating. FIG. 23C illustrates a reverse cylindrical zone plate grating 2314, where the linewidths and spacings are a minimum at the center of the grating and increase to maximum at edges of the grating. FIG. 23D illustrates interlaced chirped grating 2316 composed of multiple chirped gratings 2318a-e. The interlaced grating 2316 is generated by taking multiple exposures of the component gratings 2318, and moving the reticle blank in the y-direction between exposures. The interlaced grating 2316 enables image distortion to be measured at multiple field points of the optical system under test, simultaneously. FIG. 23E illustrates a circular zone plate array.

As mentioned above, the characteristics of holographically generated chirped gratings (such as pitch variation) are dictated by the geometry and wavelength of the interfering beams. As a result, the holographically generated chirped gratings are continuous and smoothly varying across their extent. In contrast, discrete patterning methods typically vary the linewidth and pitch of a grating as a function of scanned, rastered, or pixelated patterning. These discrete serial methods suffer from temporal variations in patterning beam location, stage location, and stitching accuracies.

Figure 23F:
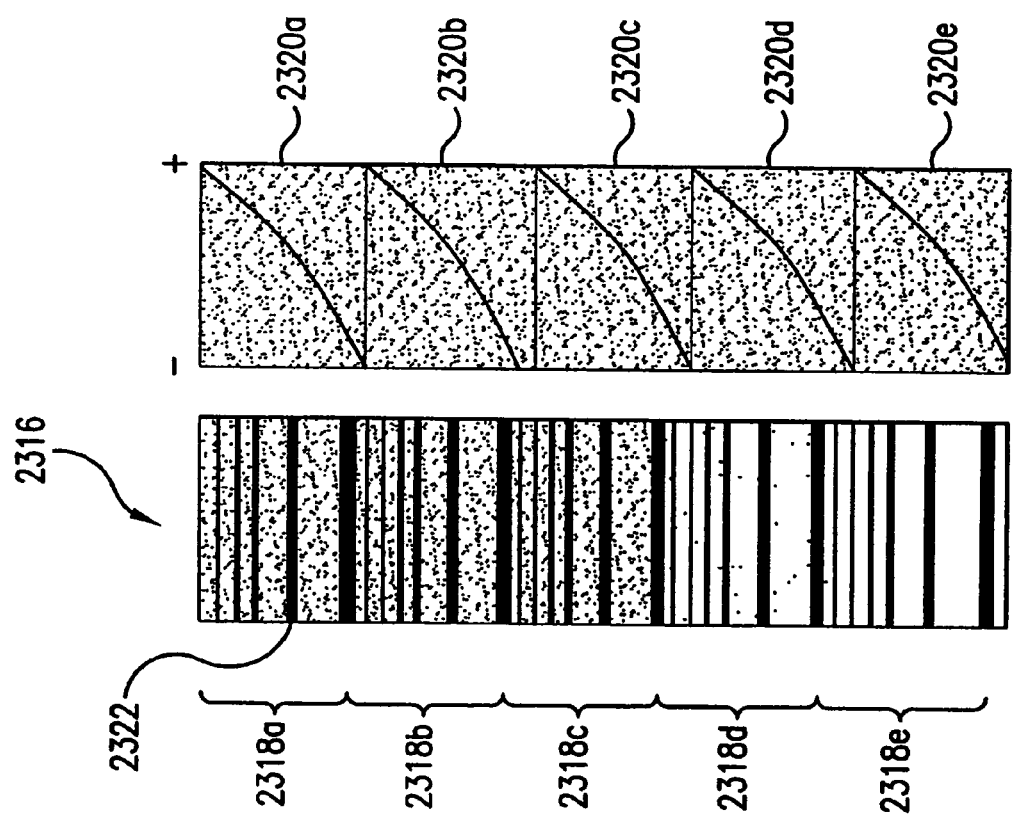
FIG. 23F illustrates focus determination of an optical system using an interlaced chirped grating according to an embodiment of the present invention.

FIG. 23F illustrates focus determination of an optical system using the interlaced chirped grating 2316. More specifically, focus curves 2320a-e are generated by imaging an optical system under test (such as optical system 18 in FIG. 1) using the interlaced chirped grating 2316. Each curve 2320 represents the depth of focus (in the z-direction of FIG. 1A) that corresponds to the linewidths in the adjacent grating 2318. One of the linewidths in the gratings 2318 is arbitrarily selected to provide a reference focus (such as linewidth 2322), and the depth of focus for the other linewidths are plotted relative to the reference focus, as shown.

Figure 24:
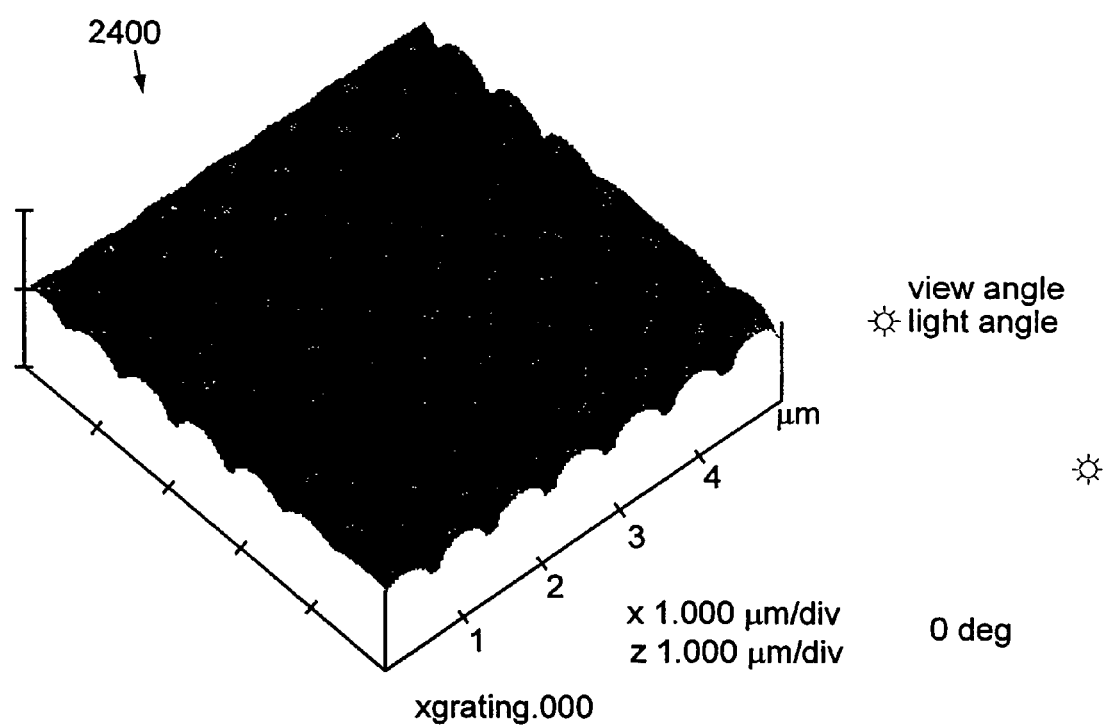
FIG. 24 illustrates an atomic force micrograph of a cross-grating that was holographically patterned on a test reticle according to an embodiment of the present invention.

FIG. 24 illustrates an atomic force micrograph of an actual cross-grating 2400 that was patterned on a holographic test reticle. The cross grating 2400 is viewed at an angle of 45 degrees, and has two sets of orthogonal lines (i.e., 2-fold geometry).

Figure 25:
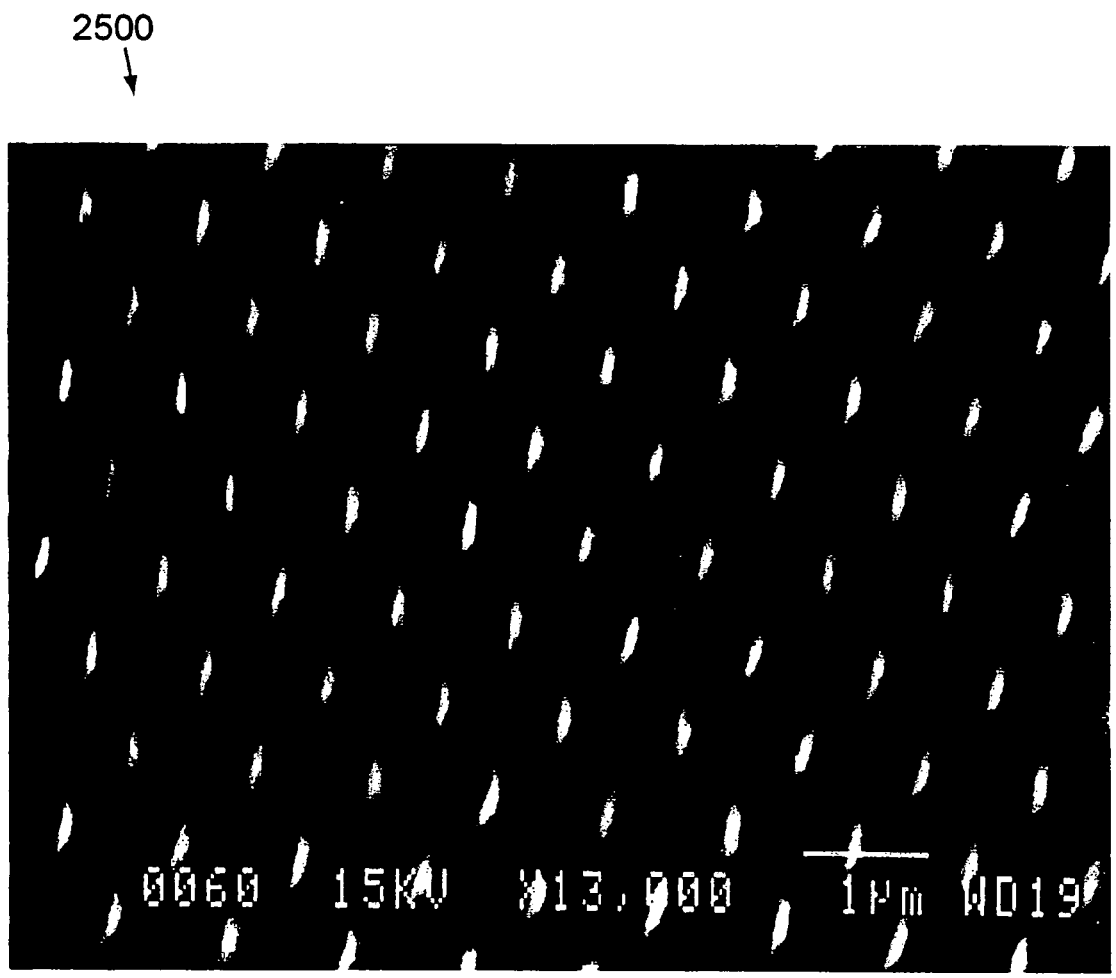
FIG. 25 illustrates a holographic hex pattern that was produced by holographic patterning according to an embodiment of the present invention.

FIG. 25 illustrates a holographic hex pattern 2500 having lines in three different orientations (i.e., 3-fold symmetry), and therefore allowing image distortion at these orientations to be measured simultaneously. This allows the image distortion of an optical system to be measured at these three orientations, simultaneously. The invention is not limited to 3-fold symmetry, as n-fold symmetry will be discussed below.

Figure 26:
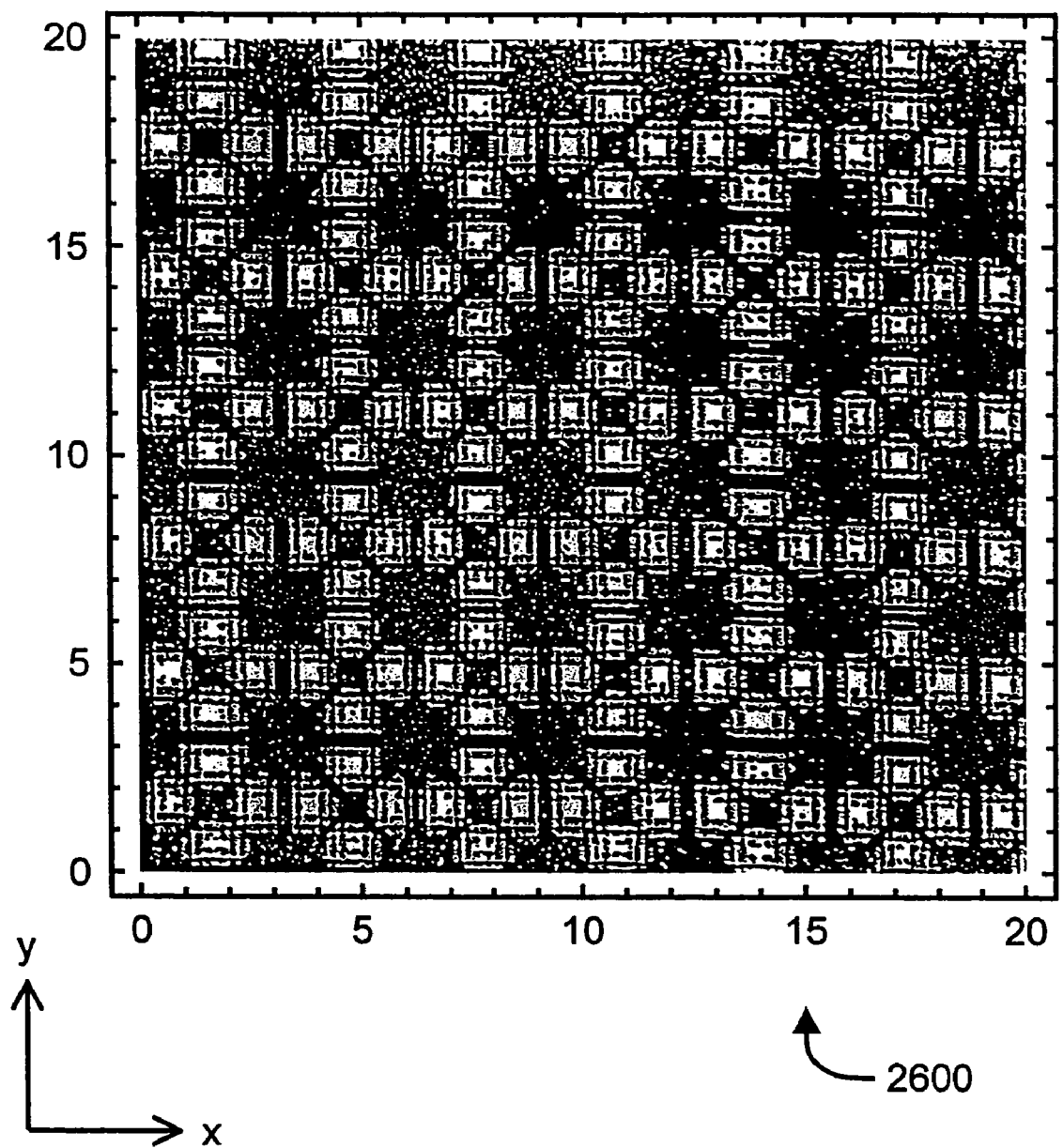
FIG. 26 illustrates a polygonal grating produced by holographic patterning according to an embodiment of the present invention.

FIG. 26 illustrates a polygonal grating 2600 that is the result interfering/combining multiple plane wave beams. The grating 2600 is composed of intersecting lines in the x-y plane that intersect at the relative angles of 0, 45, 90, and 135 degrees. The invention is not limited to this geometry. As will be shown below, multi-beam interference can be used to generate complex sub-micron geometries on a reticle that have 2-fold, 3-fold, 4-fold, and in general n-fold geometries. These n-fold patterns can be used to probe optical system parameters that are dependant on line orientation. The advantage of producing these patterns holographically is that the spatial relationships between the periodic structures are tightly constrained. Additionally, these n-fold patterns are valuable in decoupling the collection of distortion, coma, or other image shifting aberrations that are separable as azimuthally-dependent asymmetric aberrations in the pupil plane of the optical system.

In embodiments, the intersecting lines in the grating 2400 have a sinusoidal amplitude whose intensity varies according to the function: $[\sin(x+y)*\sin(x-y)*\sin(x)*\sin(y)]^2$. Other intensity distributions could be used, including binary on-off lines, as will be understood by those skilled in the arts. These other amplitude functions are within the scope and spirit of the present invention.

Figure 27:
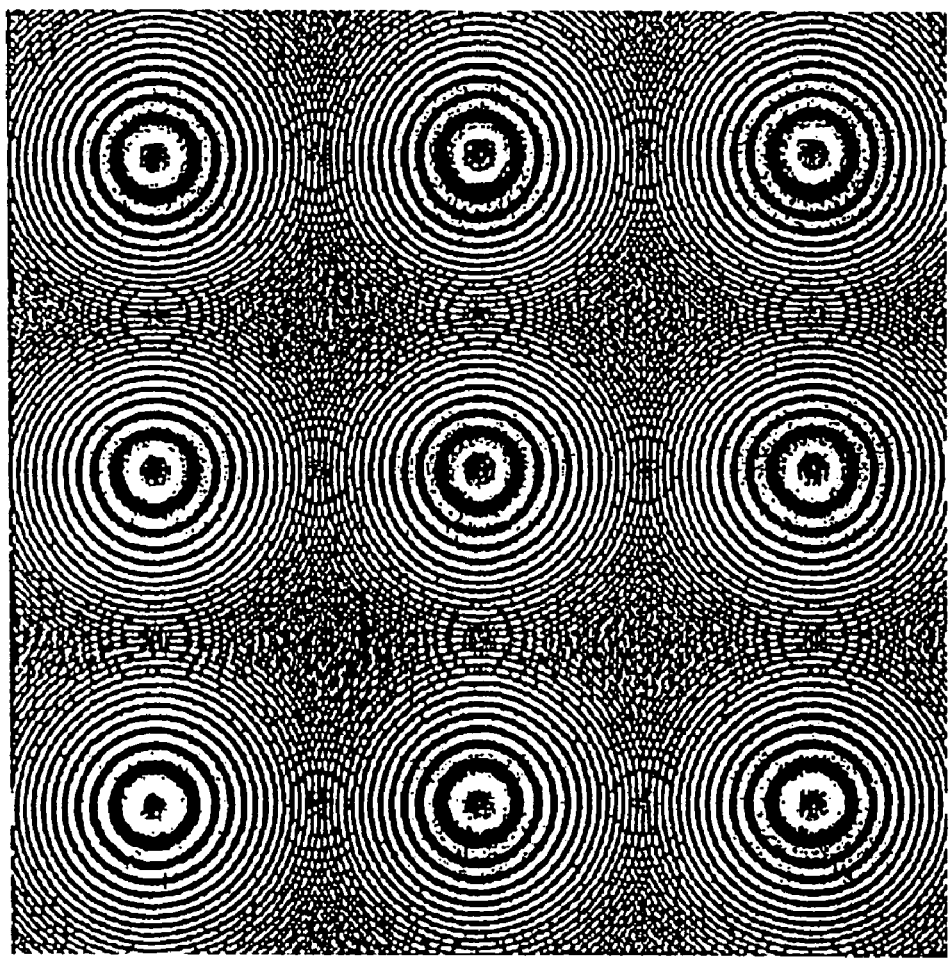
FIG. 27 illustrates a zone plate array that was produced by holographic patterning according to an embodiment of the present invention.

FIG. 27 illustrates a zone plate array 2700, which takes the n-fold geometry to the limit. Zone plate array 2700 includes circles having variable linewidths and spacings (i.e., chirped). Because of the circular orientation of array 2700, image distortion for all possible line orientations can be measured simultaneously, and with a single test reticle. In embodiments, the zone plate array 2700 is generated by combining/interfering two beams of optical radiation so as to create a spherical beam.

2b. Phase Shifting Interference Patterns

Figure 28:
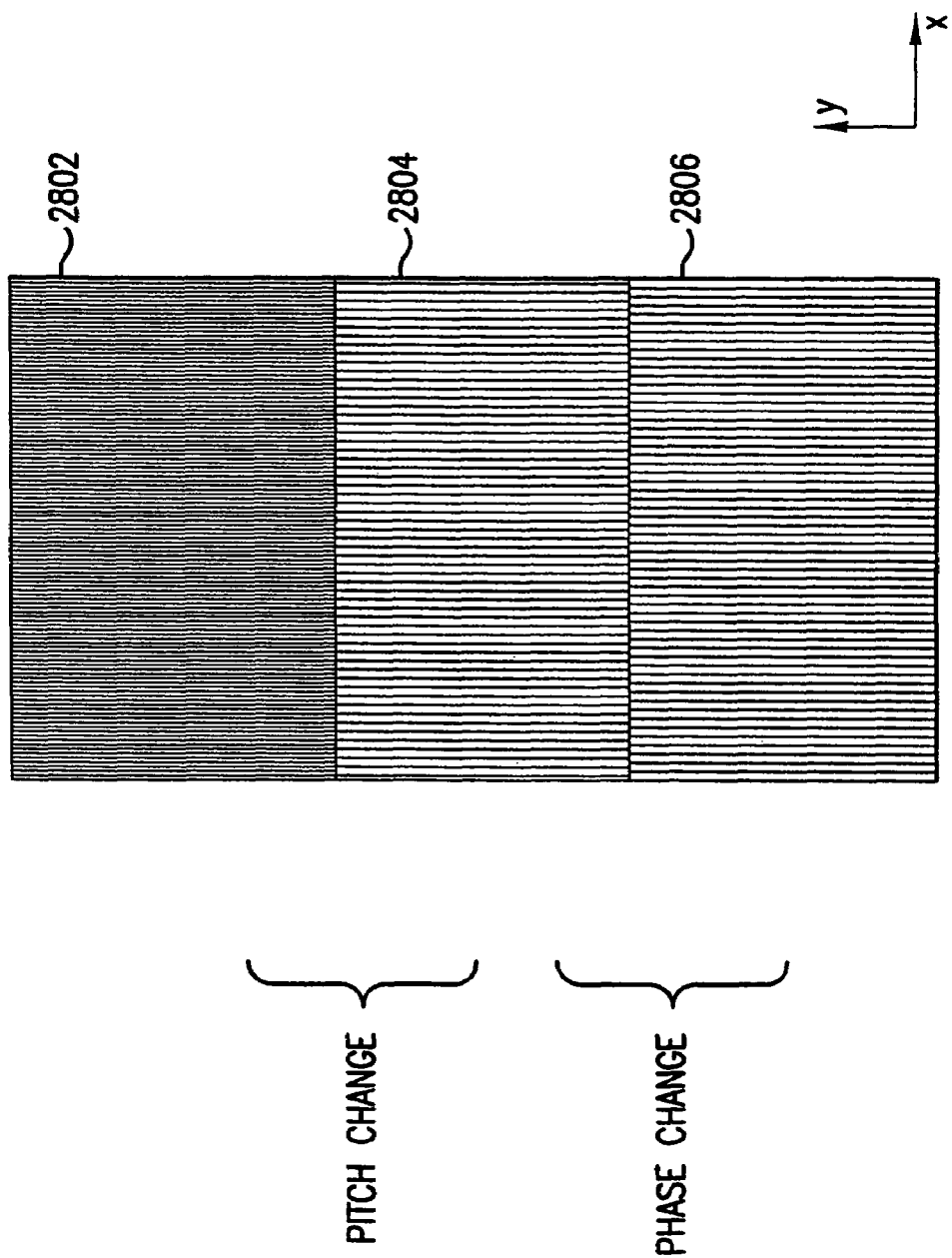
FIG. 28 illustrates holographically patterned gratings that collectively depict pitch change and phase change according to an embodiment of the present invention.

FIG. 28 illustrates holographic patterned gratings 2802-2806, which collectively depict examples of pitch change and phase change for periodic gratings. More specifically, gratings 2802 and 2804 depict pitch change because the linewidths and spacings (i.e., pitch) of the grating 2802 are much smaller than the pitch of the grating 2804. Gratings 2804 and 2806 depict phase change because the lines of the grating 2806 are shifted in the x-direction relative to the lines in the grating 2804.

Figure 29A:
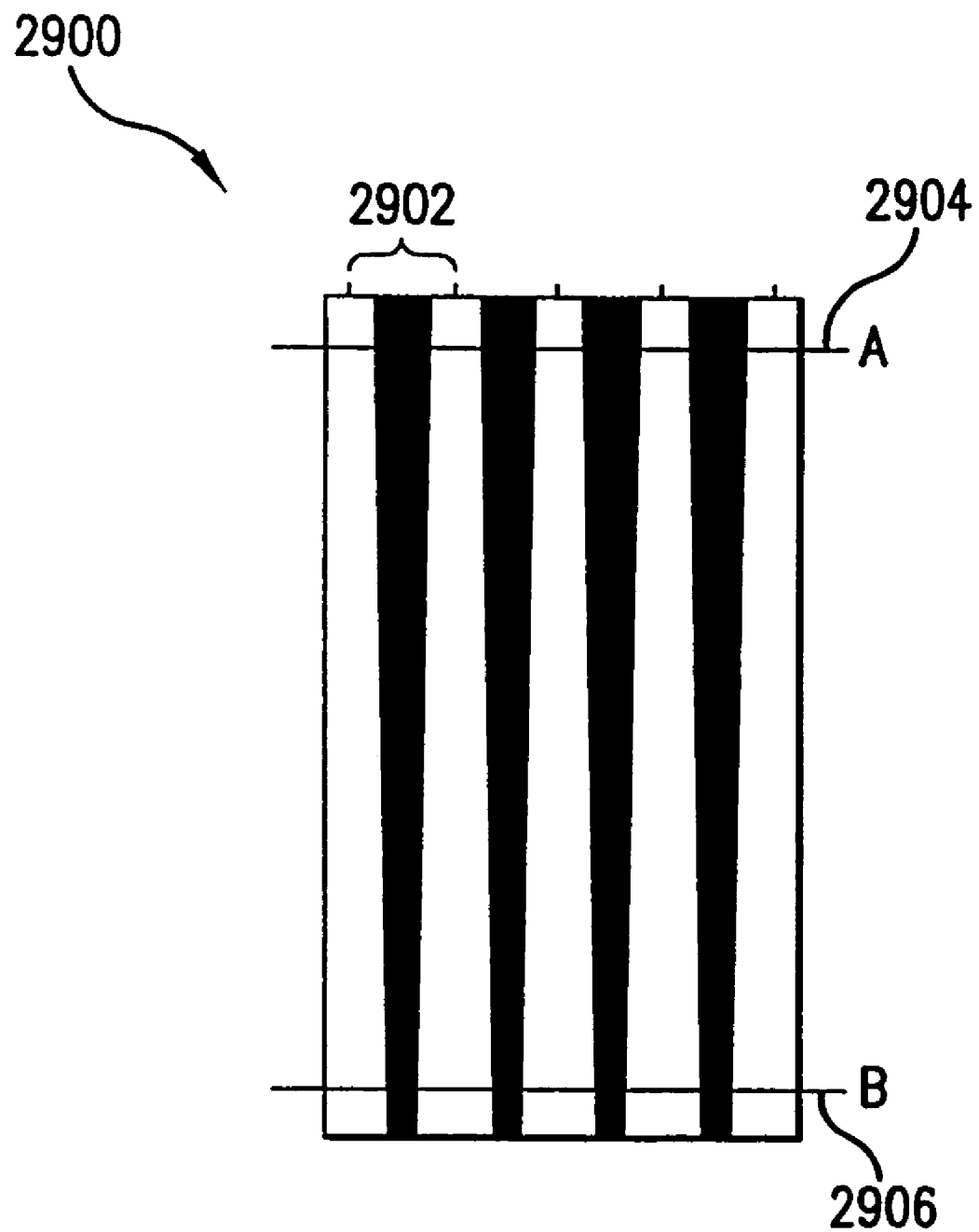
FIG. 29A illustrates a reticle with a holographic pattern having a constant pitch grating with a varying duty cycle.

Alternatively, the duty cycle (or line-to-space ratio) of the grating can be varied continuously or in steps while maintaining the same grating pitch. FIG. 29A illustrates a reticle with a holographic pattern having a constant pitch grating with a varying duty cycle. In FIG. 29A, a reticle 2900 has a constant pitch grating 2902. However, at a Profile A 2904, the duty cycle of grating 2902 is a 1:1 line-to-space ratio, while at a Profile B 2906, the duty cycle of grating 2902 is a 3:1 line-to-space ratio. Having such a holographic pattern with a constant pitch on one reticle 2900 allows the entire pattern to be interferometrically interrogated at a single diffraction angle. By testing a photolithographic system with a set of holographic patterns each with a constant pitch on one reticle, aberrations can be identified and decoupled based on the various induced image shifts and focus shifts produced as a function of the line-to-space duty cycle.

Figure 29B:
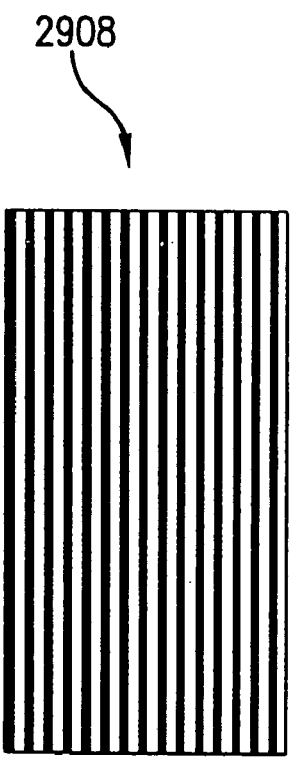
FIGS. 29B and 29C illustrate how the holographic pattern of reticle 2900 is formed.
Figure 29C:
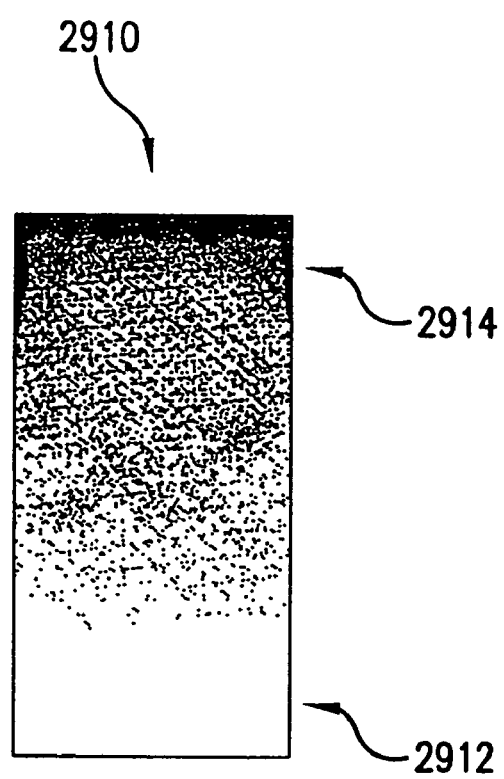

FIGS. 29B and 29C illustrate how the holographic pattern of reticle 2900 is formed. FIG. 29B illustrates a uniform grating pattern 2908. FIG. 29C illustrates a pattern with variation in exposure intensity 2910. In FIG. 29C, exposure intensity is greater at a bottom portion 2912 and lesser at a top portion 2914. Exposure intensity between bottom portion 2912 and top portion 2914 varies continuously in a gradual transition between the values of these two portions 2912, 2914. Holographic reticle pattern 2900 is formed by superimposing uniform grating pattern 2908 on the pattern with variation in exposure intensity 2910. One skilled in the art would recognize that any of a variety of duty cycle patterns could be produced by superimposing a pattern with a variation in exposure intensity on a uniform grating pattern. Particularly, the pattern with the variation in exposure intensity is not limited to one in which the exposure intensity transitions from a high value to a low value across the span of the pattern.

Figure 30:
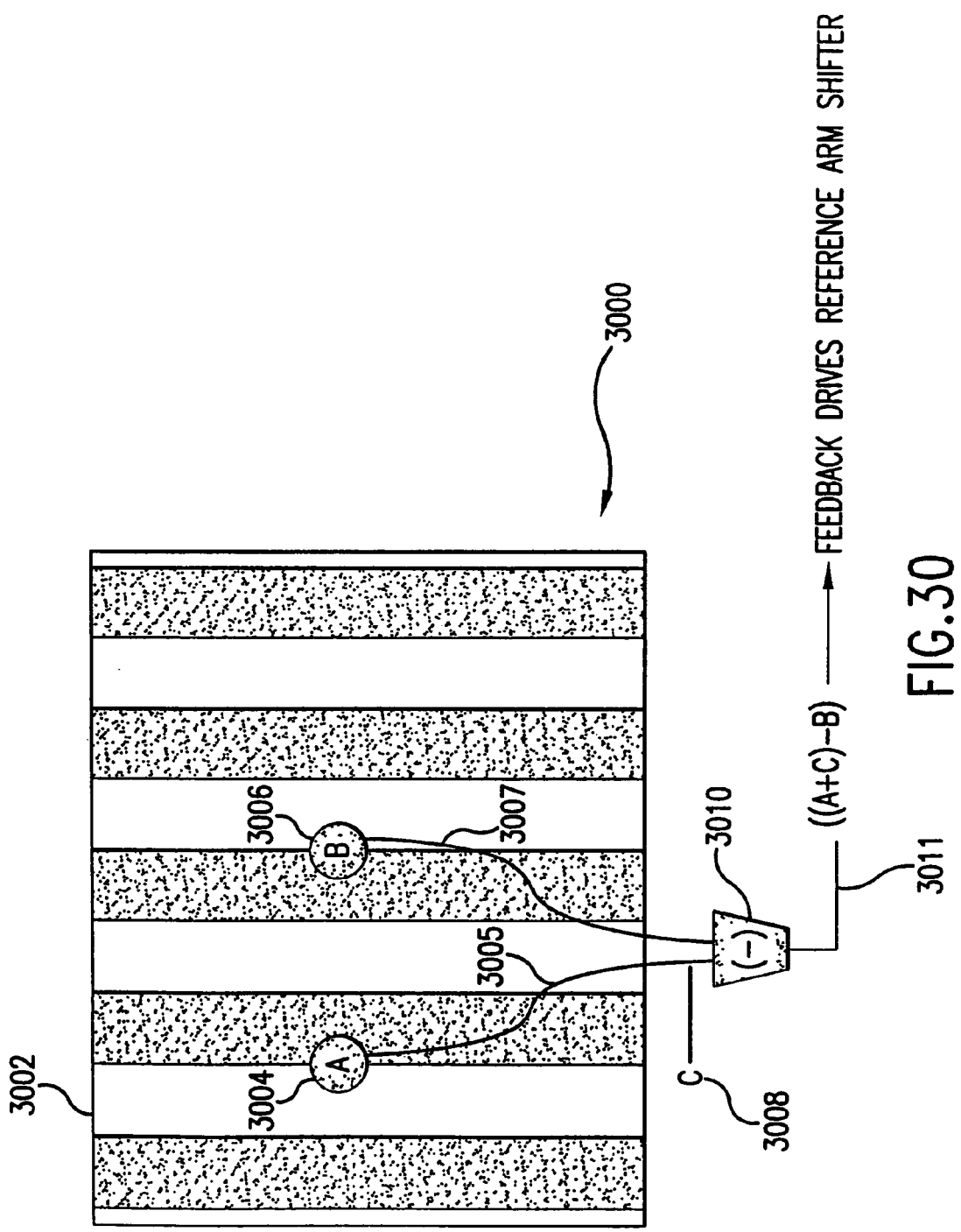
FIG. 30 illustrates a phase control system for accurately controlling phase shift of a holographically produced grating according to an embodiment of the present invention.

FIG. 30 illustrates a phase control system 3000 for creating a controlled phase shift, such as the phase shift between the grating 2804 and 2806 in FIG. 28. The control system 3000 includes optical detectors 3004 and 3006, a control input 3008, and a difference module 3010. The control system 3000 can be operated in a fringe locking capacity, and/or can be used to implement an intentional grating phase shift, based on the control signal 3008.

The optical detectors 3004 and 3006 are placed to measure light intensity at different points of a holographic interference pattern 3002, resulting in intensity signals 3005 and 3007. In embodiments of the invention, the detectors 3004 and 3006 are optical detector diodes or equivalent devices that generate an electrical signal that is proportional to the intensity of the detected light.

The difference module 3010 receives the intensity signals 3005 and 3007, and the control signal 3008. The difference module 3010 determines a difference signal 3011 by adding the control signal 3008 to the intensity signal 3005, and then subtracting the intensity signal 3007. During fringe locking, the control signal 3008 is substantially zero, and therefore the difference signal 3011 represents the difference between the light intensity that is measured by the detectors 3004 and 3006. If the difference signal 3011 is approximately zero, then the detectors 3004 and 3006 are receiving approximately the same light intensity, and therefore are monitoring the same corresponding location on each fringe. If the difference signal 3011 is not approximately zero, then the detectors 3004 and 3006 are not straddling an equivalent portion of a light fringe.

The difference signal 3011 is used to control a mirror, or a crystal, or another optic device (not shown) that phase shifts one of the interfering beams that was used to create the interference pattern 3002. If the difference signal 3011 is approximately zero, then no action is taken. If the difference signal 3011 is not zero, then an interfering beam is phase shifted in order to phase shift the interference (or fringe) pattern 3002. For fringe locking, the fringe pattern 3002 is phase shifted so that the detectors 3004 and 3006 will detect equivalent intensities of light, and therefore drive the difference signal 3011 to approximately zero. Fringe locking is useful for making small corrections due to vibrations, and other random disturbances, etc. In contrast to fringe locking, an intentional phase shift can be introduced in the fringe pattern 3002, even when signals 3005 and 3007 are equal, by introducing a non-zero control signal 3008, as discussed further below.

Figure 31:
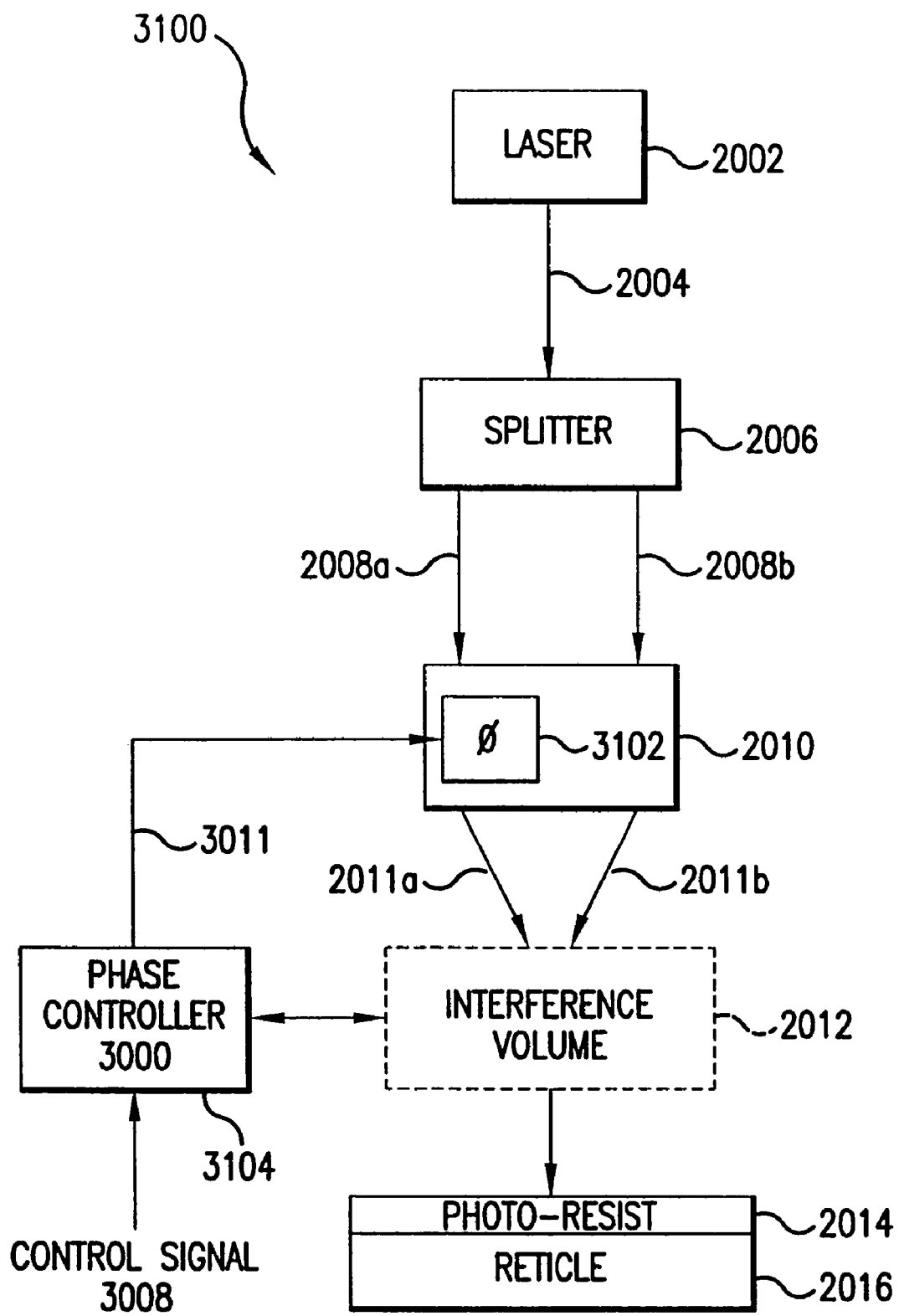
FIG. 31 illustrates a holographic reticle writing system with accurate phase shift control according to an embodiment of the present invention.

As illustrated in FIG. 31, the phase control system 3000 can be incorporated into a reticle writing system 3100 to write a holographic test reticle having gratings with a controlled relative phase shift. The reticle writing system 3100 is similar to the system 2000 (FIG. 20), with the addition of the phase controller 3000 and the phase shifting device 3102. The phase controller 3000 analyzes the interference volume 2012, and generates the difference signal 3011 based on the interference volume 2012 and the control signal input 3008, as discussed above. The difference signal 3011 controls the phase shifting device 3102 in the manipulation optics 2010, which phase shifts the beam 2011a and thereby produces a phase shift in the interference volume 2012 that is based on the control signal 3008. Therefore, the interference volume 2012 can be phase shifted by various amounts by changing the control signal 3008. The phase shifting device 3102 can be a mirror, a crystal, or another optic device that is useful for phase shifting an optical beam. Other specific embodiments for the device 3102 include the following: a reflective, refractive, or diffractive array; an electro-deformable device; an acousto-optic device; a nano-actuated optic device such as, but not limited to, a piezo-driven mirror or a bimorph-driven mirror; a nano-deformable mirror array that is reflective, diffractive, or refractive; a MEMS mirror array; an electro-deformable hologram; and an electronic fringe-locking system.

Additionally, multiple phase shifted gratings (as shown in FIG. 28) can be generated using the system 3100, by exposing the reticle blank multiple times using different voltages for the control signal 3008. Flowchart 3200 (FIG. 32) describes the generation of multiple phase shifted gratings in further detail.

Figure 32:
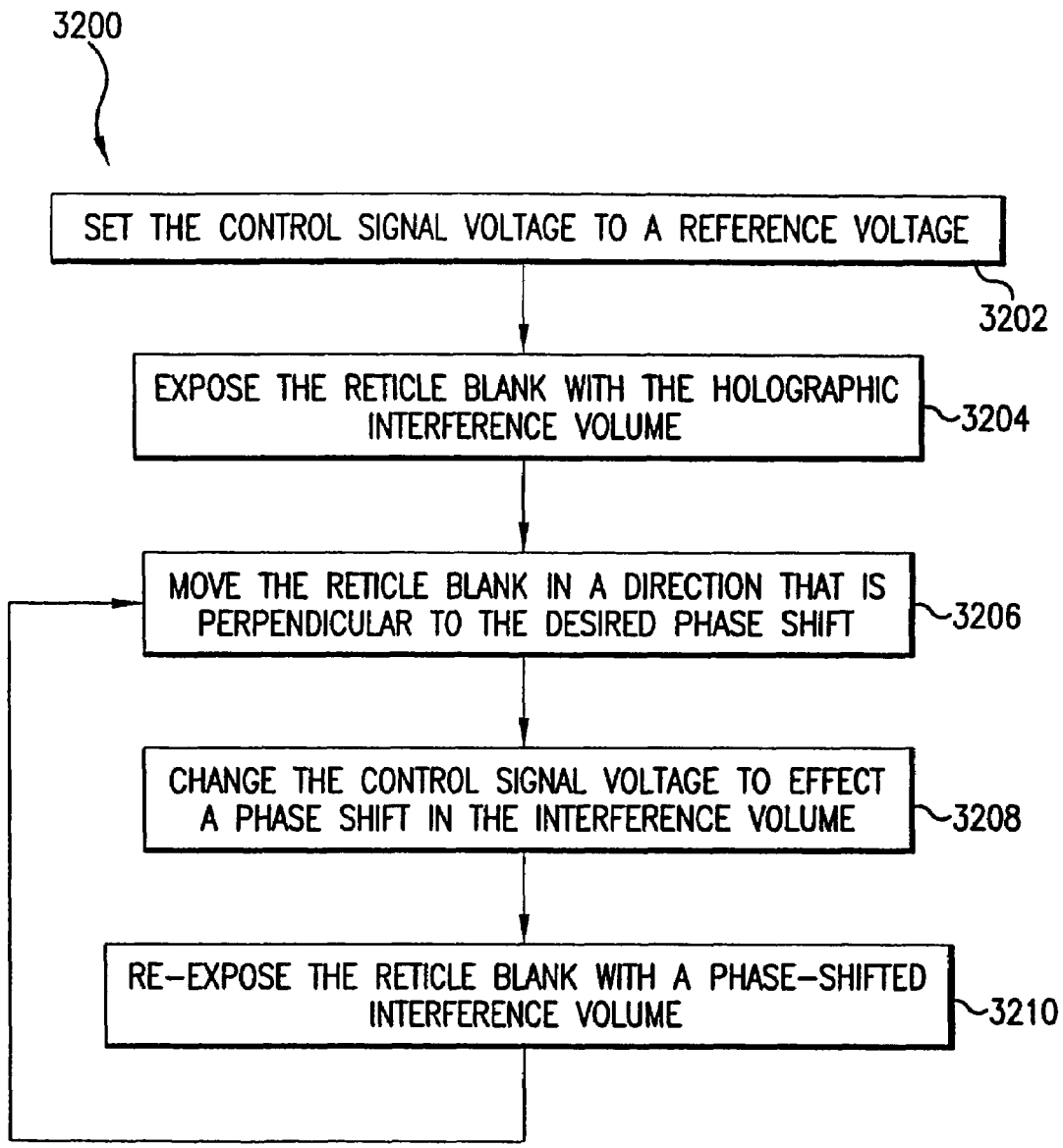
FIG. 32 illustrates a flowchart 3200 for varying the phase shift of a holographically generated grating according to an embodiment of the present invention.

Referring to FIG. 32, in step 3202, the voltage of the control signal 3008 is set to a reference voltage. In step 3204, a reticle blank is exposed with a holographic interference volume to record a reference grating that corresponds to the reference voltage. In step 3206, the reticle blank is moved in a direction that is perpendicular to the desired phase shift of the grating. For example, in FIG. 28, if grating 2804 was printed first, then the reticle would be moved in the y direction, to print the grating 2806. In step 3208, the voltage of the control signal 3008 is changed to effect a phase shift in the holographic interference volume. In step 3210, the reticle blank is re-exposed with the (phase shifted) holographic interference volume to record a grating that is phase shifted relative to the reference grating that was generated in step 3204. The steps 3206-3210 can be repeated multiple times to generate multiple gratings having a relative phase shift. Using this technique, extremely accurate phase shifts between gratings can be realized. In embodiments, a phase-shift of minute fractions of a linewidth can be achieved. For sub-micron linewidths, it is possible to achieve a controlled phase shift in the angstrom range.

2c. Reticle Reading Analysis

As discussed, the test reticles that are described herein are preferably utilized to test optical systems. For example, as shown in FIG. 1, the optical system 18 is imaged with a test reticle 16, where the test reticle 16 can be a holographically generated test reticle. The resulting image data is recorded on a photosensitive substrate 22, which can be subsequently analyzed to extract information that characterizes the optical system 18. Alternatively, the resulting image data can be presented for viewing in real time by using a demodulating device.

As illustrated in FIG. 7, the photosensitive substrate 22 is analyzed using interferometric techniques to determine properties of the optical system under test. The resulting interferogram represents changes in a phase front of light that is interferometrically diffracted off the exposed substrate 22.

Figure 33:
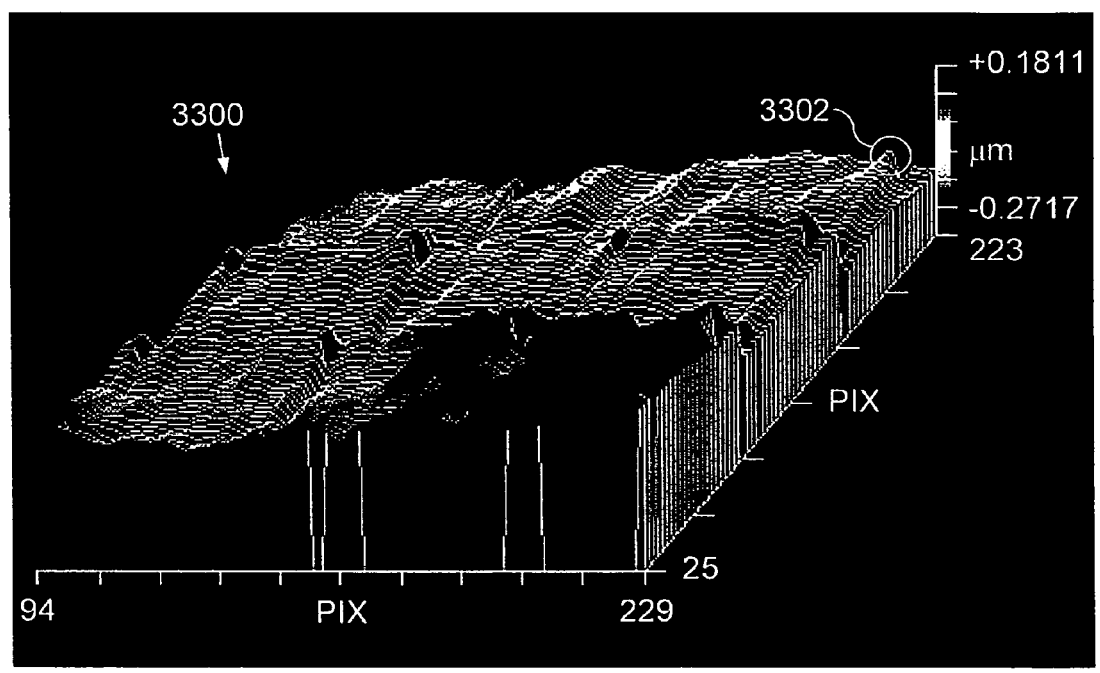
FIG. 33 illustrates an interferogram according to an embodiment of the present invention.

FIG. 33 illustrates an example interferogram 3300 that represents a phase front of the diffracted light for a 3×3 field array of an optical device under test. The interferogram 3300 is composed of nine blocks (corresponding to a 3×3 array) that are delineated by horns, such as exemplary horn 3302. Each block is characterized by a tilt and piston, which quantify the aberrations and distortion in the array field of the optical system under test. Non-uniform distortion parameters can be analyzed based on local pistons and tilts. More specifically, the tilt refers to the angle of the block and represents the magnification of the reflected light and the telecentricty of the optical system under test. The piston refers to the height of the block and represents translation differences of the reflected phase front and therefore phase shift caused by the optical system under test.

Figure 34:
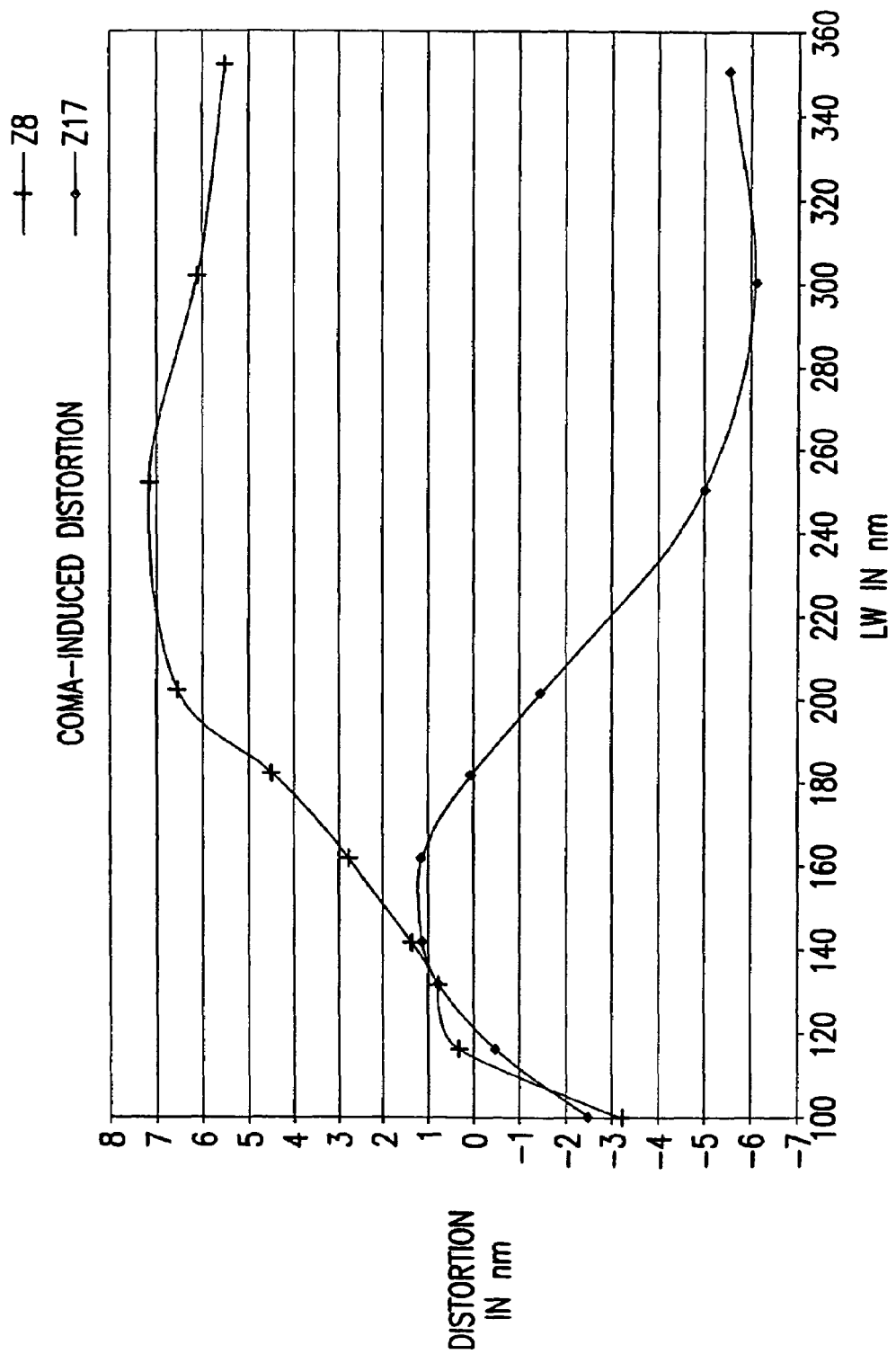
FIG. 34 illustrates a graph of distortion verses optical linewidth for an optical system under test according to an embodiment of the present invention.

Once characterized, the distortions and aberrations for an optical system can be plotted vs. optical linewidth. For example, graph 3400 (FIG. 34) illustrates coma induced distortion vs. optical linewidth. Other optical system characteristics can be quantified and plotted vs. optical linewidth. These include, but are not limited to: Zernike aberrations, focus, field curvature, astigmatism, coma, distortion, telecentricity, focal plane deviation, spherical aberrations, and coherence variation. Thus, non-uniform distortion parameters can be detected as a function of variation in linewidth. One skilled in the art will recognize that a non-linear phase front can be realized on a single holographic reticle by using a chirped grating structure.

Figure 35A:
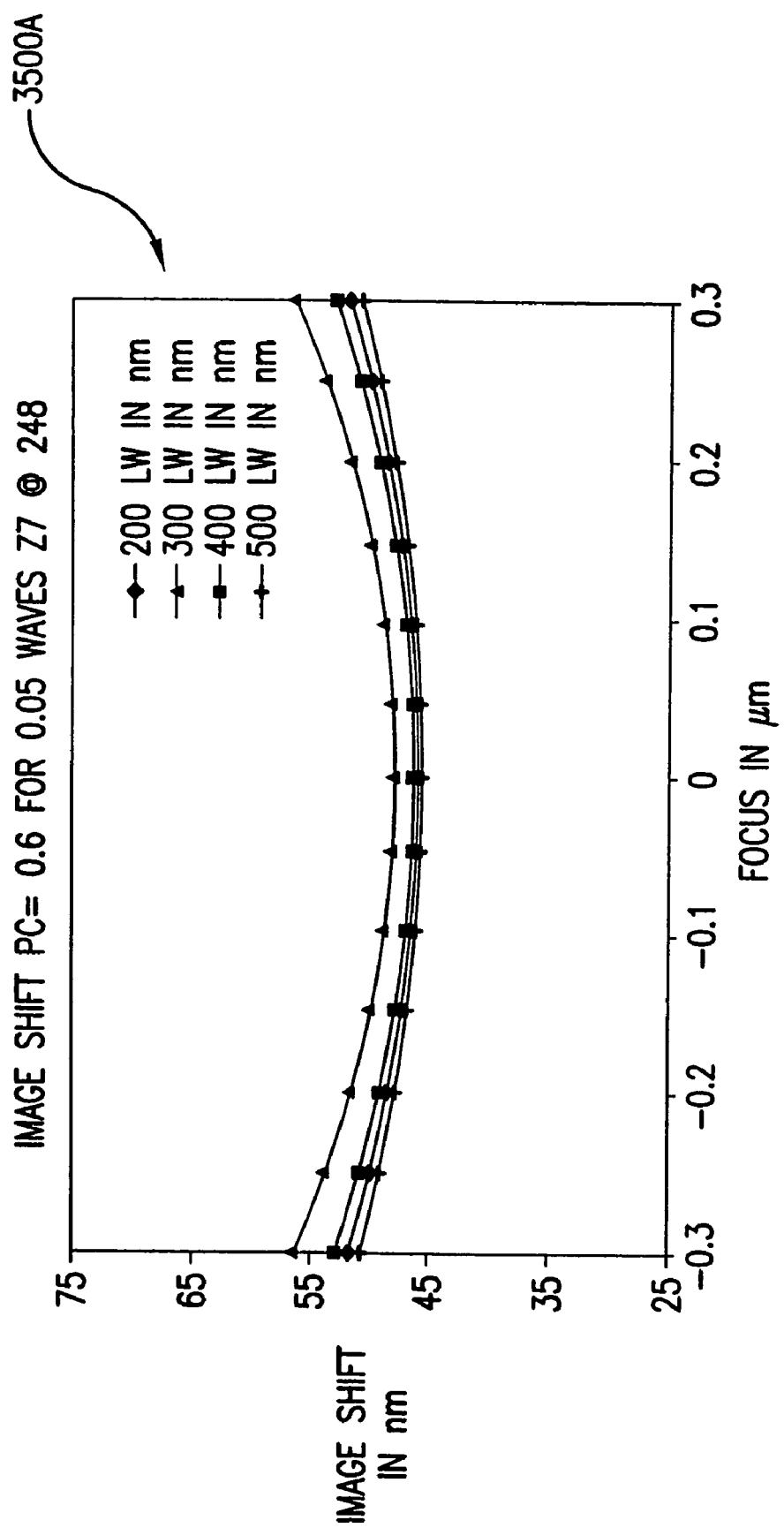
FIGS. 35A and 35B illustrate how partial coherence affects the image offsets.
Figure 35B:
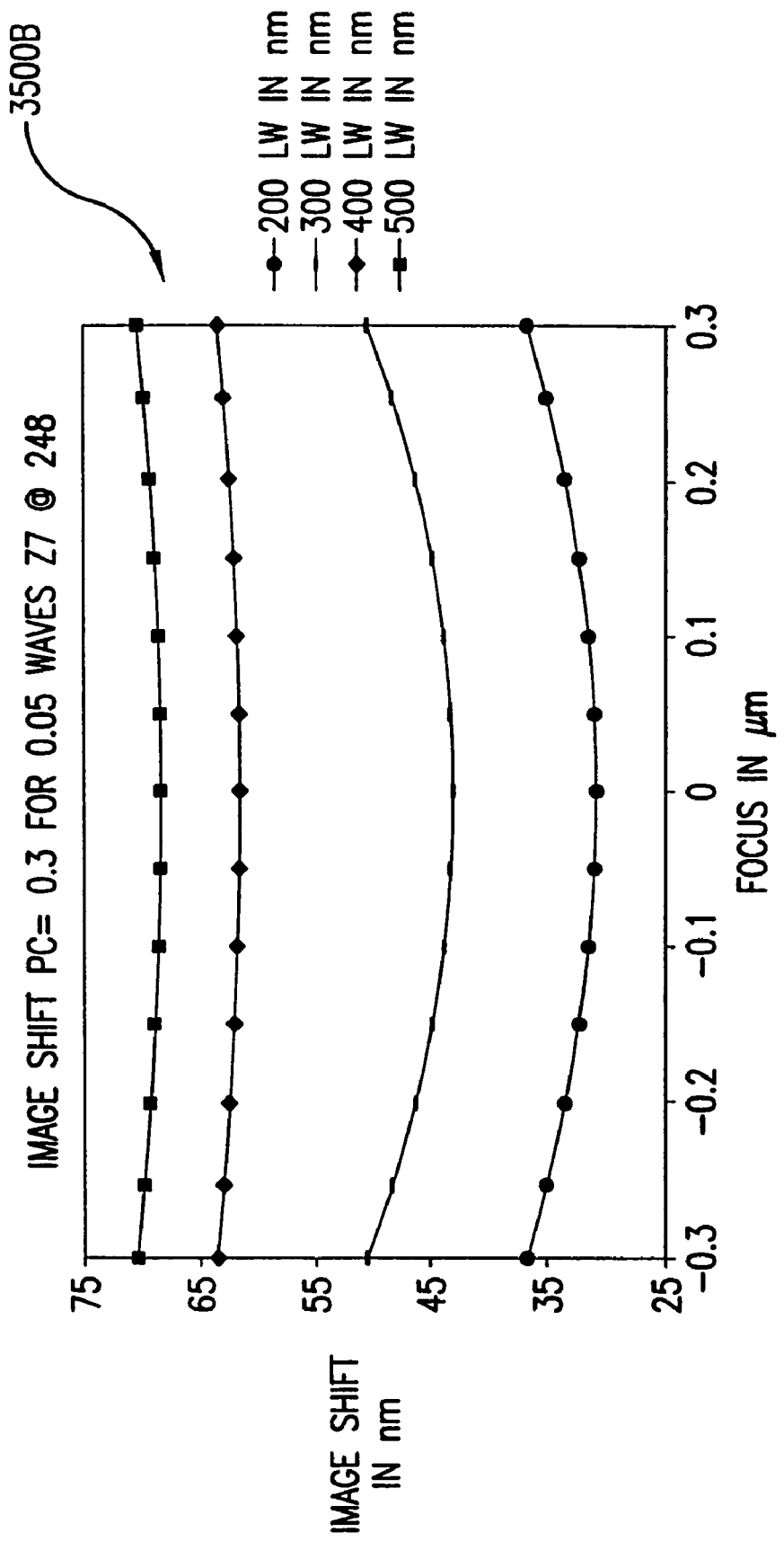

Graph 3400 shows as an example of how image shifts can occur as a function of linewidth and aberration type. Graph 3400 and similar graphs prepared for other optical system characteristics are prepared from data obtained at the best focus position of the photolithographic system. However, the magnitude of the image offsets are greatly influenced by the partial coherence (PC) of the optical illumination used to image the lithographic features. FIGS. 35A and 35B illustrate how partial coherence affects the image offsets. Graph 3500A (FIG. 35A) illustrates image shift as a function of focus for a variety of linewidths where the partial coherence of the optical illumination is 0.6. Graph 3500B (FIG. 35B) illustrates image shift as a function of focus for a variety of linewidths where the partial coherence of the optical illumination is 0.3. One skilled in the art would recognize that comparing the relative shift differences due to the different partial coherence conditions is another method of deconvolving higher order aberrations from lower order ones.

The measurement of the relative image shifts as a function of linewidth can be simplified by using a reticle with various linewidths such that each linewidth is an integral multiple of a fundamental linewidth size. Table 3600 (FIG. 36) illustrates this pattern. Table 3600 illustrates the relationship between linewidth and order of diffraction for different diffraction angles. The diffraction angles are represented as letters. For example, consider a reticle that has linewidths with dimensions of 100 nm, 200 nm, 300 nm, 400 nm, and 600 mm. In this case, the second order diffraction of the 200 nm linewidth would be at the same angle as the first order diffraction of the 100 nm linewidth. Likewise, the third order diffraction of the 600 nm linewidth would be at the same angle as the first order diffraction of the 200 nm linewidth. Thus, a reticle with a set of linewidths can be measured for relative image shifts at the same interferometric angle. Under test conditions, this allows for all data to be collected at a single sample angle. This improves the speed at which tests can be conducted. It also improves the robustness and sensitivity of the data collected.

3. Conclusion

Example embodiments of the methods and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A method for characterizing an optical system using a holographic reticle, the method comprising:
   receiving two beams of coherent optical radiation;
   adjusting a first beam to have a cylindrical wavefront;
   adjusting a second beam to have a planewave wavefront;
   interfering said two beams, resulting in an interference volume of optical radiation having an interference pattern;
   recording said interference pattern in a recording medium to create said holographic reticle;
   configuring said optical system such that a first plane that includes said holographic reticle is positioned obliquely to a second plane where an image is recorded;
   placing said holographic reticle in a path of an optical beam within said optical system; and
   recording the image produced by the path of the optical beam passing through said holographic reticle;
   wherein the image is configured to characterize said optical system for at least one of field curvature, astigmatism, coma, distortion, telecentricity, spherical aberrations, and variation of coherence.

2. The method of claim 1, said receiving step further comprising:
   receiving a single beam of coherent optical radiation; and
   splitting said single beam into said two or more beams of optical radiation.

3. The method of claim 1, wherein said recording step further comprises generating a grating on said holographic reticle.

4. The method of claim 1, wherein said recording step comprises generating a grating on said holographic reticle that includes linewidths and spacings that are based on properties of said interfering beams.

5. The method of claim 1, further comprising:
   adjusting a wavefront of one or more of said beams prior to said interfering step, in accordance with a desired interference pattern.

6. The method of claim 5, wherein said adjusting step comprises spatially filtering said one or more beams.

7. The method of claim 1, wherein said interfering step comprises interfering said first beam and said second beam, thereby producing an interference pattern that generates a chirped grating with a controlled pitch variation on said holographic reticle.

8. The method of claim 1, wherein said recording step comprises generating a test reticle having said interference pattern.

9. The method of claim 1, wherein a geometry of the interference pattern is based on relative beam angles of the first and second beams of radiation before and after the interfering step, wavelengths and wavefront variations of the first and second beams.

10. A method for characterizing an optical system using a holographic reticle, the method comprising:
    receiving two beams of coherent optical radiation;
    adjusting a first beam to have a spherical wavefront;
    adjusting a second beam to have a planewave wavefront;
    interfering said two beams, resulting in an interference volume of optical radiation having an interference pattern;
    recording said interference pattern in a recording medium to create said holographic reticle;
    configuring said optical system such that a first plane that includes said holographic reticle is positioned obliquely to a second plane where an image is recorded;
    placing said holographic reticle in a path of an optical beam within said optical system; and
    recording the image produced by the path of the optical beam passing through said holographic reticle;
    wherein the image is configured to characterize said optical system for at least one of field curvature, astigmatism, coma, distortion, telecentricity, spherical aberrations, and variation of coherence.

11. The method of claim 10, wherein said interfering step comprises interfering said first beam and said second beam, resulting in a zone plate array interference pattern.

12. A method for characterizing an optical system using a holographic reticle, the method comprising:
receiving two beams of coherent optical radiation;
interfering said two beams, resulting in an interference volume of optical radiation having an interference pattern;
exposing photo-resist that is deposited on a reticle with said interference pattern;
developing said photo-resist so that said reticle reflects said interference pattern thereby forming said holographic reticle;
configuring said optical system such that a first plane that includes said holographic reticle is positioned obliquely to a second plane where an image is recorded;
placing said holographic reticle in a path of an optical beam within said optical system; and
recording the image produced by the path of the optical beam passing through said holographic reticle;
wherein the image is configured to characterize said optical system for at least one of field curvature, astigmatism, coma, distortion, telecentricity, spherical aberrations, and variation of coherence.

13. A method for making a holographic reticle that characterizes an optical system, the method comprising:
receiving two beams of coherent optical radiation;
interfering said two beams, resulting in an interference volume of optical radiation having an interference pattern;
generating a grating;
generating precision phase shifts between adjacent grating patches to monitor image shifting aberrations; and
recording said interference pattern in a recording medium to create said holographic reticle;
wherein said holographic reticle is adapted to yield information on optical parameters of the optical system and thereby characterize the optical system.

14. The method in claim 13, wherein said generating precision phase shifts step comprises phase shifting a holographic reference beam relative to an object beam.

15. The method of claim 14, further comprising using an electro-deformable device to perform said phase shifting.

16. The method of claim 14, further comprising using an acoustic-optic device to perform said phase shifting.

17. The method of claim 14, further comprising using a nano-actuated optic device to perform said phase shifting.

18. The method of claim 17, wherein said nano-actuated optic device is one of a piezo-driven mirror and a bimorph-driven mirror.

19. The method of claim 14, further comprising using one of a reflective array, a refractive array, a diffractive array, a nano-deformable reflective array, a nano deformable refractive array, and a nano deformable diffractive array to perform said phase shifting.

20. The method of claim 14, further comprising using one of a MEMS minor array and an electro-deformable hologram to perform said phase shifting.

21. The method of claim 14, further comprising using an electronic fringe-locking system to perform said phase shifting.

22. The method of claim 13, wherein the optical parameters include at least one of focus, field of curvature, astigmatism, coma, focal plane deviation, spherical aberration and coherence variation.

23. A method for characterizing an optical system using a holographic reticle, the method comprising the steps of:
receiving two beams of coherent optical radiation;
expanding two of said beams, resulting in two diverging spherical wavefronts;
interfering said two beams, resulting in an interference volume of optical radiation having an interference pattern;
recording said interference pattern in a recording medium to create said holographic reticle;
configuring said optical system such that a first plane that includes said holographic reticle is positioned obliquely to a second plane where an image is recorded;
placing said holographic reticle in a path of an optical beam within said optical system; and
recording the image produced by the path of the optical beam passing through said holographic reticle;
wherein the image is configured to characterize said optical system for at least one of field curvature, astigmatism, coma, distortion, telecentricity, spherical aberrations, and variation of coherence.

24. The method of claim 23, wherein said recording step comprises generating a linear grating on said holographic reticle having a substantially constant pitch.

25. The method of claim 23, wherein said recording step comprises generating a linear grating on said holographic reticle having a substantially constant pitch and a duty cycle that varies.

26. The method of claim 23, wherein said recording step further comprises generating a linear grating on said holographic reticle.

27. The method of claim 23, wherein said adjusting step comprises spatially filtering said one or more beams.

28. A method for characterizing an optical system using a holographic reticle, the method comprising:
receiving two beams of coherent optical radiation;
adjusting a first beam and a second beam to create plane wave beams;
interfering said two beams, resulting in an interference volume of optical radiation having an interference pattern;
recording said interference pattern in a recording medium to create said holographic reticle;
configuring said optical system such that a first plane that includes said holographic reticle is positioned obliquely to a second plane where an image is recorded;
placing said holographic reticle in a path of an optical beam within said optical system; and
recording the image produced by the path of the optical beam passing through said holographic reticle;
wherein the image is configured to characterize said optical system for at least one of field curvature, astigmatism, coma, distortion, telecentricity, spherical aberrations, and variation of coherence.

29. The method of claim 1, wherein said recording step comprises generating a polygonal grating on said holographic reticle.

* * * * *

UNITED STATES PATENT AND TRADEMARK OFFICE
CERTIFICATE OF CORRECTION

PATENT NO. : 7,804,601 B2  Page 1 of 1
APPLICATION NO. : 10/972170
DATED : September 28, 2010
INVENTOR(S) : Matthew E. Hansen It is certified that error appears in the above-identified patent and that said Letters Patent is hereby corrected as shown below:

In claim 29, col. 26, line 59, please delete "1" and replace with "39"

Signed and Sealed this

Seventh Day of December, 2010

David J. Kappos
*Director of the United States Patent and Trademark Office*